(12) United States Patent
Kakinoya et al.

(10) Patent No.: US 8,283,105 B2
(45) Date of Patent: *Oct. 9, 2012

(54) POSITIVE RESIST COMPOSITION AND METHOD OF FORMING RESIST PATTERN

(75) Inventors: Yasuhiko Kakinoya, Kawasaki (JP); Naoto Motoike, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 92 days.

This patent is subject to a terminal disclaimer.

(21) Appl. No.: 12/717,870

(22) Filed: Mar. 4, 2010

(65) Prior Publication Data

US 2010/0233624 A1    Sep. 16, 2010

(30) Foreign Application Priority Data

Mar. 11, 2009 (JP) .................................. 2009-058738

(51) Int. Cl.
G03F 7/004 (2006.01)
G03F 7/028 (2006.01)
G03F 7/039 (2006.01)
G03F 7/26 (2006.01)

(52) U.S. Cl. ............... 430/270.1; 430/326; 430/910; 430/921

(58) Field of Classification Search ............... 430/270.1, 430/326, 908, 910, 921
See application file for complete search history.

(56) References Cited

U.S. PATENT DOCUMENTS

| | | | |
|---|---|---|---|
| 4,458,001 A | 7/1984 | Taylor | |
| 5,945,517 A | 8/1999 | Nitta et al. | |
| 6,153,733 A | 11/2000 | Yukawa et al. | |
| 6,388,101 B1 | 5/2002 | Hada et al. | |
| 6,753,125 B2 | 6/2004 | Choi et al. | |
| 7,074,543 B2 | 7/2006 | Iwai et al. | |
| 7,078,562 B2 | 7/2006 | Furukawa et al. | |
| 7,186,495 B2 | 3/2007 | Maeda et al. | |
| 7,459,261 B2 | 12/2008 | Hatakeyama et al. | |
| 7,482,108 B2 | 1/2009 | Matsumaru et al. | |
| 7,682,772 B2 | 3/2010 | Seshimo et al. | |
| 7,767,379 B2 | 8/2010 | Dazai et al. | |
| 8,124,313 B2 | 2/2012 | Seshimo et al. | |
| 2002/0012874 A1* | 1/2002 | Namba .................... | 430/270.1 |
| 2003/0031950 A1 | 2/2003 | Uenishi et al. | |
| 2003/0203309 A1 | 10/2003 | Nishimura et al. | |
| 2007/0149702 A1 | 6/2007 | Ando et al. | |
| 2007/0231708 A1 | 10/2007 | Matsumaru et al. | |
| 2008/0096128 A1 | 4/2008 | Takeda et al. | |
| 2008/0199806 A1 | 8/2008 | Hatakeyama et al. | |
| 2008/0311507 A1 | 12/2008 | Isono et al. | |
| 2009/0068590 A1 | 3/2009 | Dazai et al. | |
| 2009/0130597 A1 | 5/2009 | Seshimo et al. | |
| 2009/0226842 A1* | 9/2009 | Shimizu et al. ............ | 430/281.1 |
| 2009/0317745 A1 | 12/2009 | Mimura et al. | |
| 2010/0062364 A1 | 3/2010 | Dazai et al. | |
| 2010/0062369 A1* | 3/2010 | Dazai et al. ................ | 430/285.1 |
| 2010/0086873 A1* | 4/2010 | Seshimo et al. ........... | 430/281.1 |
| 2010/0136478 A1 | 6/2010 | Kawaue et al. | |
| 2010/0136480 A1 | 6/2010 | Motoike et al. | |
| 2010/0178609 A1 | 7/2010 | Dazai et al. | |
| 2010/0183981 A1 | 7/2010 | Matsumiya et al. | |
| 2010/0196820 A1 | 8/2010 | Kawaue et al. | |
| 2010/0196821 A1 | 8/2010 | Dazai et al. | |
| 2010/0209848 A1 | 8/2010 | Dazai et al. | |
| 2010/0233623 A1 | 9/2010 | Kurosawa et al. | |
| 2010/0233625 A1* | 9/2010 | Hirano et al. ............... | 430/285.1 |
| 2010/0233626 A1 | 9/2010 | Shimizu et al. | |
| 2010/0323296 A1 | 12/2010 | Ichikawa et al. | |
| 2011/0009661 A1 | 1/2011 | Tanaka et al. | |
| 2011/0117497 A1 | 5/2011 | Sato et al. | |
| 2011/0236824 A1* | 9/2011 | Hirano et al. ............... | 430/270.1 |

FOREIGN PATENT DOCUMENTS

| | | |
|---|---|---|
| JP | H09-208554 | 8/1997 |
| JP | H10-207069 | 8/1998 |
| JP | H10-221852 | 8/1998 |
| JP | H11-035551 | 2/1999 |
| JP | H11-035552 | 2/1999 |
| JP | H11-035573 | 2/1999 |
| JP | H11-322707 | 11/1999 |
| JP | 2000-26446 | 1/2000 |
| JP | 2002-88124 | 3/2002 |
| JP | 2002-107933 | 4/2002 |
| JP | 2003-241385 | 8/2003 |
| JP | A-2003-337419 | 11/2003 |
| JP | 2005-037888 | 2/2005 |
| JP | 2005-336452 | 12/2005 |
| JP | A-2006-016379 | 1/2006 |
| JP | 2006-045311 | 2/2006 |
| JP | 2006-215526 | 8/2006 |
| JP | 2006-259582 | 9/2006 |
| JP | 2006-276458 | 10/2006 |
| JP | A-2007-031355 | 2/2007 |
| JP | 2007-146142 | 6/2007 |
| JP | 2009-091350 | 4/2009 |
| JP | 2009-091351 | 4/2009 |
| JP | A-2010-026478 | 2/2010 |
| KR | 10-2002-0077275 A | 10/2002 |
| KR | 10-2007-0069068 A | 7/2007 |
| WO | WO 2004/074242 | 9/2004 |
| WO | WO 2009/104753 A1 | 8/2009 |
| WO | WO 2010/001913 A1 | 1/2010 |

OTHER PUBLICATIONS

Office Action in U.S. Appl. No. 12/461,687 mailed Sep. 12, 2011.

(Continued)

Primary Examiner — Anca Eoff
(74) Attorney, Agent, or Firm — Knobbe Martens Olson & Bear LLP

(57) ABSTRACT

A positive resist composition including a base component (A) which exhibits increased solubility in an alkali developing solution under action of acid and an acid-generator component (B) which generates acid upon exposure, the component (A) including a polymeric compound (A1) having an acid dissociable, dissolution inhibiting group in the structure thereof and including a structural unit (a0) having an $-SO_2-$ containing cyclic group on the terminal of the side chain, and the component (B) including an acid generator (B1) containing a compound represented by general formula (b1-1) ($R^0$ represents a hydrocarbon group of 1 to 12 carbon atoms which may have a substituent, provided that the carbon atom adjacent to the sulfur atom within the $-SO_3^-$ group has no fluorine atom bonded thereto, and $Z^+$ represents an organic cation).

$$R^0-SO_3^-Z^+ \qquad (b1\text{-}1)$$

8 Claims, No Drawings

OTHER PUBLICATIONS

Office Action in U.S. Appl. No. 12/461,688 mailed Sep. 12, 2011.
Office Action in U.S. Appl. No. 12/573,686 mailed Oct. 12, 2011.
Office Action issued in U.S. Appl. No. 12/721,291 on Jan. 6, 2012.
Office Action issued in U.S. Appl. No. 12/685,579 on Jan. 19, 2012.
Notice of Allowance issued on U.S. Appl. No. 12/461,687 on Jan. 25, 2012.
Notice of Allowance issued in U.S. Appl. No. 12/461,688 on Jan. 25, 2012.
Office Action issued in U.S. Appl. No. 12/694,037 on Feb. 3, 2012.
Gil et al., "First Microprocessors with Immersion Lithography," Optical Microlithography XVIII, Proceedings of SPIE, vol. 5754, pp. 119-128 (2005).
Kodama et al., "Synthesis of Novel Fluoropolymer for 157nm Photoresists by Cyclo-polymerization," Advances in Resist Technology and Processing XIX, Proceedings of SPIE, vol. 4690, pp. 76-83 (2002).
Irie et al, "Surface Property Control for 193nm Immersion Resist," Journal of Photopolymer Science and Technology, vol. 19, No. 4, pp. 565-568 (2006).
Office Action issued in U.S. Appl. No. 12/717,785 on Mar. 15, 2012.
Office Action issued in U.S. Appl. No. 12/721,240 on Mar. 15, 2012.
Notice of Allowance issued in U.S. Appl. No. 12/573,686 on Mar. 20, 2012.
Ebihara et al.; "Beyond $k_1$=0.25 Lithography: 70nm L/S Patterning Using KrF Scanners," Proceedings of SPIE (U.S.), vol. 5256, $23^{rd}$ Annual BACUS Symposium on Photomask Technology, pp. 985-994 (2003).
Yan Borodovsky; "Marching to the Beat of Moore's Law," Proceedings of SPIE (U.S.), vol. 6153, pp. 615301-1 to 615301-19 (2006).
Office Action dated Aug. 3, 2012 for U.S. Appl. No. 12/979,067.

* cited by examiner

POSITIVE RESIST COMPOSITION AND METHOD OF FORMING RESIST PATTERN

TECHNICAL FIELD

The present invention relates to a positive resist composition and a method of forming a resist pattern using the positive resist composition.

Priority is claimed on Japanese Patent Application No. 2009-058738, filed Mar. 11, 2009, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter than these excimer lasers, such as $F_2$ excimer lasers, electron beam, extreme ultraviolet radiation (EUV), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in an alkali developing solution under the action of acid and an acid generator that generates acid upon exposure.

For example, a chemically amplified positive resist contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid generator, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm (for example, see Patent Document 1).

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

On the other hand, as acid generators usable in a chemically amplified resist composition, various types have been proposed including, for example, onium salt acid generators such as iodonium salts and sulfonium salts; oxime sulfonate acid generators; diazomethane acid generators; nitrobenzylsulfonate acid generators; iminosulfonate acid generators; and disulfone acid generators.

Currently, as acid generators, onium salt acid generators having an onium ion such as triphenylsulfonium as the cation moiety are used. As the anion moiety for onium salt acid generators, an alkylsulfonate ion or a fluorinated alkylsulfonate ion in which part or all of the hydrogen atoms within the aforementioned alkylsulfonate ion has been substituted with fluorine atoms is typically used (for example, see Patent Document 2).

DOCUMENTS OF RELATED ART

[Patent Document]

[Patent Document 1] Japanese Unexamined Patent Application, First Publication No. 2003-241385

[Patent Document 2] Japanese Unexamined Patent Application, First Publication No. 2005-37888

SUMMARY OF THE INVENTION

In recent years, as requirements for high resolution increase with progress in the miniaturization of resist patterns, formation of resist patterns having excellent shape has been demanded.

The present invention takes the above circumstances into consideration, with an object of providing a positive resist composition which enables formation of a resist pattern having an excellent shape, and a method of forming a resist pattern.

For solving the above-mentioned problems, the present invention employs the following aspects.

Specifically, a first aspect of the present invention is a positive resist composition including a base component (A) which exhibits increased solubility in an alkali developing solution under action of acid and an acid-generator component (B) which generates acid upon exposure, the base component (A) including a polymeric compound (A1) having an acid dissociable, dissolution inhibiting group in the structure thereof and including a structural unit (a0) represented by general formula (a0-1) shown below, and the acid-generator component (B) including an acid generator (B1) containing a compound represented by general formula (b1-1) shown below.

[Chemical Formula 1.]

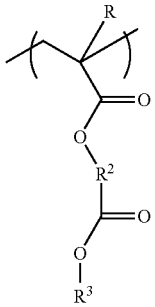

(a0-1)

In formula (a0-1), R represents a hydrogen atom, an alkyl group of 1 to 5 carbon atoms or a halogenated alkyl group of 1 to 5 carbon atoms; $R^2$ represents a divalent linking group; and $R^3$ represents a cyclic group containing an $—SO_2—$ group within the ring skeleton thereof.

[Chemical Formula 2.]

 (b1-1)

In formula (b1-1), $R^0$ represents a hydrocarbon group of 1 to 12 carbon atoms which may have a substituent, with the provision that the carbon atom adjacent to the sulfur atom within the $—SO_3^-$ group has no fluorine atom bonded thereto; and $Z^+$ represents an organic cation.

A second aspect of the present invention is a method of forming a resist pattern, including applying a positive resist composition according to the first aspect to a substrate to form a resist film, subjecting the resist film to exposure, and subjecting the resist film to alkali developing to form a resist pattern.

In the present description and claims, an "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "lower alkyl group" is an alkyl group of 1 to 5 carbon atoms.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

According to the present invention, there are provided a positive resist composition which enable formation of a resist pattern having an excellent shape, and a method of forming a resist pattern using the same.

DETAILED DESCRIPTION OF THE INVENTION

<<Positive Resist Composition>>

The positive resist composition according to the first aspect of the present invention includes a base component (A) which exhibits increased solubility in an alkali developing solution under action of acid (hereafter, referred to as "component (A)") and an acid-generator component (B) which generates acid upon exposure (hereafter, referred to as "component (B)").

In the positive resist composition, when radial rays are irradiated (when exposure is conducted), acid is generated from the component (B), and the solubility of the component (A) in an alkali developing solution is increased by the action of the generated acid. Therefore, in the formation of a resist pattern, by conducting selective exposure of a resist film formed by using the positive resist composition of the present invention, the solubility of the exposed portions in an alkali developing solution is increased, whereas the solubility of the unexposed portions in an alkali developing solution is unchanged, and hence, a resist pattern can be formed by alkali developing.

It is preferable that the positive resist composition of the present invention further includes a nitrogen-containing organic compound (D) (hereafter referred to as the component (D)).

<Component (A)>

In the present invention, the term "base component" refers to an organic compound capable of forming a film.

As the base component, an organic compound having a molecular weight of 500 or more can be preferably used. When the organic compound has a molecular weight of 500 or more, the film-forming ability is improved, and a resist pattern of nano level can be easily formed.

The "organic compound having a molecular weight of 500 or more" which can be used as a base component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 2,000 or more is used. Hereafter, a polymer having a molecular weight of 2,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

In the present invention, the component (A) includes a polymeric compound (A1) (hereafter, referred to as "component (A1)") having an acid dissociable, dissolution inhibiting group in the structure thereof and including a structural unit (a0) represented by general formula (a0-1).

[Component (A1)]

The component (A1) is a polymeric compound having an acid dissociable, dissolution inhibiting group in the structure thereof and including a structural unit (a0).

The component (A1) preferably includes a structural unit (a1) derived from an acrylate ester containing an acid dissociable, dissolution inhibiting group, excluding the structural unit (a0).

It is preferable that the component (A1) further include a structural unit (a2) derived from an acrylate ester containing a lactone-containing cyclic group.

It is preferable that the component (A1) further include a structural unit (a3) derived from an acrylate ester containing a polar group-containing aliphatic hydrocarbon group.

(Structural Unit (a0))

In general formula (a0-1), R represents a hydrogen atom, an alkyl group of 1 to 5 carbon atoms or a halogenated alkyl group of 1 to 5 carbon atoms.

As the alkyl group for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group for R is a group in which part or all of the hydrogen atoms of the aforementioned alkyl group has been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (a0-1), $R^2$ represents a divalent linking group.

Preferable examples of $R^2$ include a divalent hydrocarbon group which may have a substituent, and a divalent linking group containing a hetero atom.

Divalent Hydrocarbon Group which May have a Substituent

With respect to $R^2$, the hydrocarbon group "has a substituent" means that part or all of the hydrogen atoms within the hydrocarbon group has been substituted with a group or an atom other than a hydrogen atom.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—($CH_2$)$_2$—], a trimethylene group [—($CH_2$)$_3$—], a tetramethylene group [—($CH_2$)$_4$—] and a pentamethylene group [—($CH_2$)$_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2CH(CH_3)CH_2$—; and alkyltetramethylene groups such as —CH($CH_3$)$CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent.

Examples of the substituent include an alkyl group of 1 to 5 carbon atoms, a fluorine atom, a fluorinated alkyl group of 1 to 5 carbon atoms, and an oxygen atom (=O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Divalent Linking Group Containing a Hetero Atom

With respect to the "divalent linking group containing a hetero atom" for $R^2$, a hetero atom refers to an atom other than carbon and hydrogen, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate bond (—O—C(=O)—O—), —NH—, —$NR^{04}$— ($R^{04}$ represents a substituent such as an alkyl group or an acyl group), —NH—C(=O)—, =N—, —S—, —S(=O)$_2$—, and —S(=O)$_2$—O—. Further, a combination of any one of these "divalent linking groups containing a hetero atom" with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

In the —NR$^{04}$— group, R$^{04}$ represents a substituent such as an alkyl group or an acyl group. The substituent (an alkyl group, an acyl group or the like) preferably has 1 to 10 carbon atoms, more preferably 1 to 8, and most preferably 1 to 5.

R$^2$ may or may not have an acid dissociable portion in the structure thereof.

An "acid dissociable portion" refers to a portion within the R$^2$ group which is dissociated from the group by action of acid generated upon exposure. When the R$^2$ group has an acid dissociable portion, it preferably has an acid dissociable portion having a tertiary carbon atom.

In the present invention, as the divalent linking group for R$^2$, an alkylene group, a divalent aliphatic cyclic group or a divalent linking group containing a hetero atom is preferable. Among these, an alkylene group is particularly desirable.

When R$^2$ represents an alkylene group, it preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When R$^2$ represents a divalent aliphatic cyclic group, as the aliphatic cyclic group, the same aliphatic cyclic groups as those described above for the "aliphatic hydrocarbon group containing a ring in the structure thereof" can be used.

As the aliphatic cyclic group, a group in which two hydrogen atoms have been removed from cyclopentane, cyclohexane, norbornane, isobornane, adamantane, tricyclodecane or tetracyclododecane is particularly desirable.

When R$^2$ represents a divalent linking group containing a hetero atom, preferable examples of the divalent linking group containing a hetero atom include —O—, —C(=O)—O—, —C(=O)—, —O—C(=O)—O—, —C(=O)—NH—, —NR$^{04}$— (R$^{04}$ represents a substituent such as an alkyl group or an acyl group), —S—, —S(=O)$_2$—, —S(=O)$_2$—O—, a group represented by the formula -A-O—B—, and a group represented by the formula -[A-C(=O)—O]$_q$—B—. Herein, each of A and B independently represents a divalent hydrocarbon group which may have a substituent, and q represents an integer of 0 to 3.

In the group represented by the formula -A-O—B— or -[A-C(=O)—O]$_q$—B—, each of A and B independently represents a divalent hydrocarbon group which may have a substituent.

Examples of divalent hydrocarbon groups for A and B which may have a substituent include the same groups as those described above for the "divalent hydrocarbon group which may have a substituent" usable as R$^2$.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(=O)—O]$_q$—B—, q represents an integer of 0 to 3, preferably an integer of 0 to 2, more preferably 0 or 1, and most preferably 1.

In general formula (a0-1), R$^3$ represents a cyclic group containing —SO$_2$— within the ring skeleton thereof. More specifically, R$^3$ is a cyclic group in which the sulfur atom (S) within the —SO$_2$— group forms part of the ring skeleton thereof.

The cyclic group for R$^3$ refers to a cyclic group including a ring that contains —SO$_2$— within the ring skeleton thereof, and this ring is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The cyclic group for R$^3$ may be either a monocyclic group or a polycyclic group.

As R$^3$, a cyclic group containing —O—SO$_2$— within the ring skeleton thereof, i.e., a sultone ring in which —O—S— within the —O—SO$_2$— group forms part of the ring skeleton thereof is particularly desirable.

The cyclic group for R$^3$ preferably has 3 to 30 carbon atoms, more preferably 4 to 20, still more preferably 4 to 15, and most preferably 4 to 12.

Herein, the number of carbon atoms refers to the number of carbon atoms constituting the ring skeleton, excluding the number of carbon atoms within a substituent.

The cyclic group for R$^3$ may be either an aliphatic cyclic group or an aromatic cyclic group, and is preferably an aliphatic cyclic group.

Examples of aliphatic cyclic groups for R$^3$ include the aforementioned cyclic aliphatic hydrocarbon groups in which part of the carbon atoms constituting the ring skeleton thereof has been substituted with —SO$_2$— or —O—SO$_2$—.

More specifically, examples of monocyclic groups include a monocycloalkane in which one hydrogen atom have been removed therefrom and a —CH$_2$— group constituting the ring skeleton thereof has been substituted with —SO$_2$—; and a monocycloalkane in which one hydrogen atom have been removed therefrom and a —CH$_2$—CH$_2$— group constituting the ring skeleton thereof has been substituted with —O—SO$_2$—. Examples of polycyclic groups include a polycycloalkane (a bicycloalkane, a tricycloalkane, a tetracycloalkane or the like) in which one hydrogen atom have been removed therefrom and a —CH$_2$— group constituting the ring skeleton thereof has been substituted with —SO$_2$—; and a polycycloalkane in which one hydrogen atom have been removed therefrom and a —CH$_2$—CH$_2$— group constituting the ring skeleton thereof has been substituted with —O—SO$_2$—.

The cyclic group for R$^3$ may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group. R" represents a hydrogen atom or an alkyl group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of $R^3$ include groups represented by general formulas (3-1) to (3-4) shown below.

[Chemical Formula 3.]

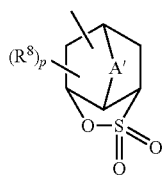

(3-1)

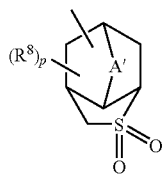

(3-2)

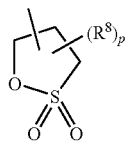

(3-3)

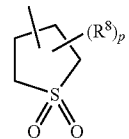

(3-4)

In the formulas, A' represents an oxygen atom, a sulfur atom, or an alkylene group of 1 to 5 carbon atoms which may contain an oxygen atom or a sulfur atom; p represents an integer of 0 to 2; and $R^8$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed within the alkyl group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

p represents an integer of 0 to 2, and is most preferably 0.

When p is 2, the plurality of $R^8$ may be the same or different from each other.

As the alkyl group, alkoxy group, halogenated alkyl group, halogenated alkyl group, hydroxyl group, —COOR", —OC(=O)R", hydroxyalkyl group and cyano group for $R^8$, the same alkyl groups, alkoxy groups, halogenated alkyl groups, halogenated alkyl groups, hydroxyl groups, —COOR", —OC(=O)R", hydroxyalkyl groups and cyano groups as those described above as the substituent which the cyclic group for $R^3$ may have can be used.

Specific examples of the cyclic groups represented by general formulas (3-1) to (3-4) are shown below. In the formulas shown below, "Ac" represents an acetyl group.

[Chemical Formula 4.]

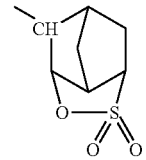

(3-1-1)

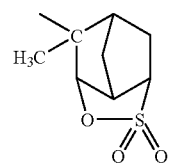

(3-1-2)

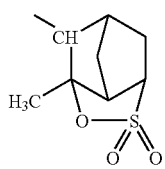 (3-1-3)
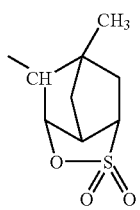 (3-1-4)
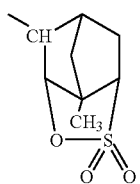 (3-1-5)
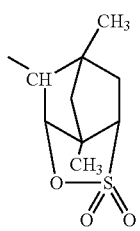 (3-1-6)
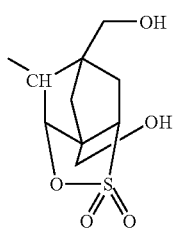 (3-1-7)
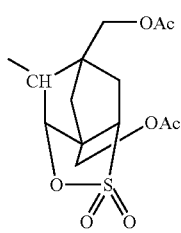 (3-1-8)
[Chemical Formula 5.]
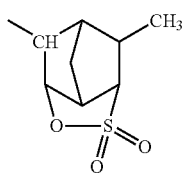 (3-1-9)
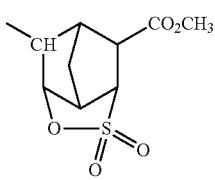 (3-1-10)
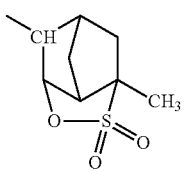 (3-1-11)
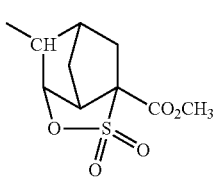 (3-1-12)
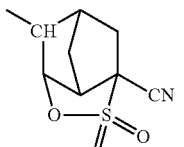 (3-1-13)
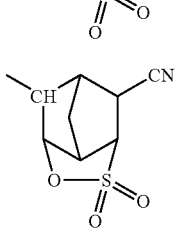 (3-1-14)
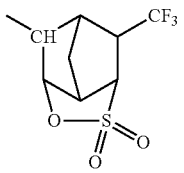 (3-1-15)
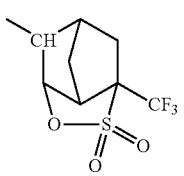 (3-1-16)
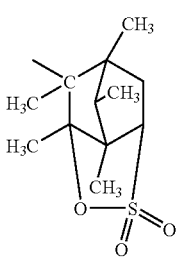 (3-1-17)

[Chemical Formula 6.]
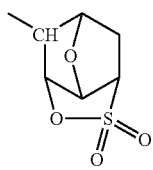 (3-1-18)
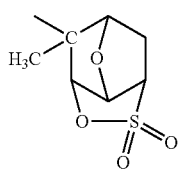 (3-1-19)
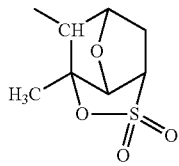 (3-1-20)
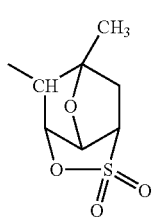 (3-1-21)
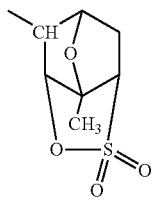 (3-1-22)
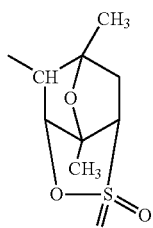 (3-1-23)
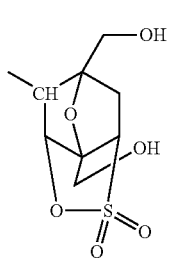 (3-1-24)
-continued
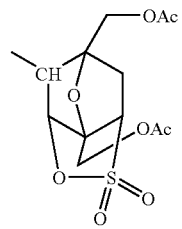 (3-1-25)
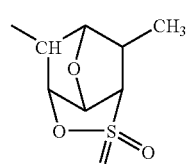 (3-1-26)
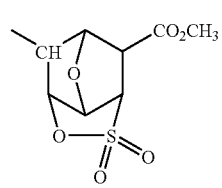 (3-1-27)
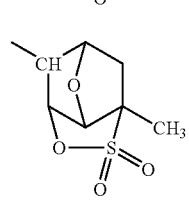 (3-1-28)
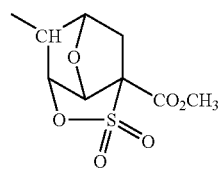 (3-1-29)
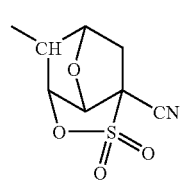 (3-1-30)
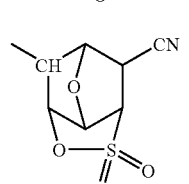 (3-1-31)
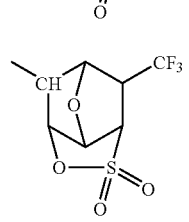 (3-1-32)

(3-1-33)

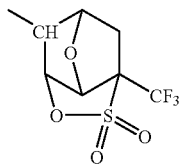

[Chemical Formula 7.]

(3-2-1)

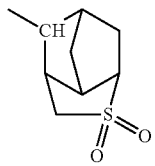

(3-2-2)

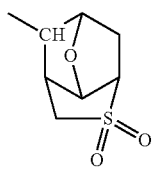

(3-3-1)

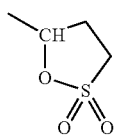

(3-4-1)

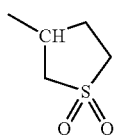

Among the examples shown above, as $R^3$, a cyclic group represented by general formula (3-1), (3-3) or (3-4) above is preferable, and a cyclic group represented by general formula (3-1) above is particularly desirable.

More specifically, as $R^3$, it is preferable to use at least one cyclic group selected from the group consisting of cyclic groups represented by chemical formulas (3-1-1), (3-1-18), (3-3-1) and (3-4-1) above, and a cyclic group represented by chemical formula (3-1-1) above is particularly desirable.

In the present invention, as the structural unit (a0), a structural unit represented by general formula (a0-1-11) shown below is particularly desirable.

[Chemical Formula 8.]

(a0-1-11)

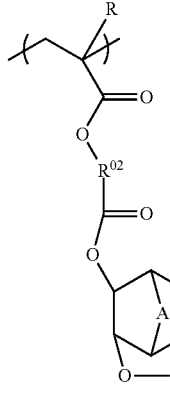

In the formula, R is the same as defined above; $R^{02}$ represents a linear or branched alkylene group or -A-C(=O)—O—B— (wherein A and B are the same as defined above); and A' is the same as defined above.

The linear or branched alkylene group for $R^{02}$ preferably has 1 to 10 carbon atoms, more preferably 1 to 8, still more preferably 1 to 5, still more preferably 1 to 3, and most preferably 1 or 2.

In the -A-C(=O)—O—B— group, each of A and B preferably represents a linear or branched alkylene group, more preferably an alkylene group of 1 to 5 carbon atoms, and most preferably a methylene group or an ethylene group. Specific examples thereof include —(CH$_2$)$_2$—C(=O)—O—(CH$_2$)$_2$—, and —(CH$_2$)$_2$—O—C(=O)—(CH$_2$)$_2$—.

A' is preferably a methylene group, an oxygen atom (—O—) or a sulfur atom (—S—).

As the structural unit (a0), one type of structural unit may be used alone, or two or more types of structural units may be used in combination.

In terms of achieving an excellent shape for a resist pattern formed using a positive resist composition containing the component (A1) and excellent lithography properties such as exposure margin (EL margin), line width roughness (LWR) and the like, the amount of the structural unit (a0) within the component (A1), based on the combined total of all structural units constituting the component (A1) is preferably 1 to 60 mol %, more preferably 5 to 55 mol %, still more preferably 10 to 50 mol %, and most preferably 15 to 45 mol %.

The component (A1) has an acid dissociable, dissolution inhibiting group within the structure thereof.

The acid dissociable, dissolution inhibiting group is a group having an alkali dissolution-inhibiting effect that renders the entire component (A1) insoluble in an alkali developing solution prior to dissociation, and is dissociated from the component (A1) by the action of acid generated from the component (B) upon exposure. Therefore, when the acid dissociable, dissolution inhibiting group is dissociated from the component (A1), the solubility of the entire component (A1) in an alkali developing solution is increased.

The acid dissociable, dissolution inhibiting group can be incorporated into the component (A1) by using a structural unit (a0) that contains a portion or group equivalent to an acid dissociable, dissolution inhibiting group within the structure thereof, or by using a structural unit other than the structural unit (a0) that contains an acid dissociable, dissolution inhibiting group.

The structural units represented by formulas (3-1-2), (3-1-17) and (3-1-19) described above for the structural unit (a0) contain a cyclic group that functions as an acid dissociable, dissolution inhibiting group. Furthermore, in a structural unit (a0) in which $R^2$ has an acid dissociable portion within the structure thereof, the portion from the acid dissociable portion to the terminal functions as an acid dissociable, dissolution inhibiting group.

When such a structural unit containing an acid dissociable, dissolution inhibiting group-equivalent group/portion within the structure thereof is used as the structural unit (a0), the component (A1) may consist of the structural unit (a0), or may further contain an optional structural unit (e.g., structural unit (a1), (a2), (a3) or (a4) described later).

On the other hand, when a structural unit containing no acid dissociable, dissolution inhibiting group-equivalent group/portion within the structure thereof is used as the structural unit (a0), it is necessary that the component (A1) contain a structural unit having an acid dissociable, dissolution inhibiting group (e.g., structural unit (a1) described later) in addition to the structural unit (a0).

In the present invention, as a structural unit having an acid dissociable, dissolution inhibiting group, it is preferable to contain a structural unit (a1) derived from an acrylate ester containing an acid dissociable, dissolution inhibiting group, exclusive of the structural unit (a0).

(Structural Unit (a1))

The structural unit (a1) is a structural unit derived from an acrylate ester containing an acid dissociable, dissolution inhibiting group and does not fall under the category of the aforementioned structural unit (a0).

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid generally causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

As an example of the aliphatic branched, acid dissociable, dissolution inhibiting group, for example, a group represented by the formula —$C(R^{71})(R^{72})(R^{73})$ can be given (in the formula, each of $R^{71}$ to $R^{73}$ independently represents a linear alkyl group of 1 to 5 carbon atoms). The group represented by the formula —$C(R^{71})(R^{72})(R^{73})$ preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group.

Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Further, these groups in which one or more hydrogen atoms have been removed from a monocycloalkane and groups in which one or more hydrogen atoms have been removed from a polycycloalkane may have part of the carbon atoms constituting the ring replaced with an ethereal oxygen atom (—O—).

Examples of aliphatic cyclic group-containing acid dissociable, dissolution inhibiting groups include (i) a group which has a tertiary carbon atom on the ring structure of a monovalent aliphatic cyclic group; and (ii) a group which has a branched alkylene group containing a tertiary carbon atom, and a monovalent aliphatic cyclic group to which the tertiary carbon atom is bonded.

Specific examples of (i) a group which has a tertiary carbon atom on the ring structure of a monovalent aliphatic cyclic group include groups represented by general formulas (1-1) to (1-9) shown below.

Specific examples of (ii) a group which has a branched alkylene group containing a tertiary carbon atom, and a monovalent aliphatic cyclic group to which the tertiary carbon atom is bonded include groups represented by general formulas (2-1) to (2-6) shown below.

[Chemical Formula 9.]

(1-1) 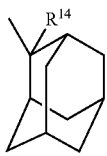

(1-2) 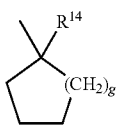

(1-3) 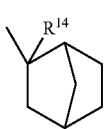

(1-4) 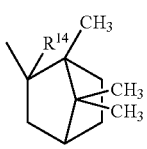

(1-5) 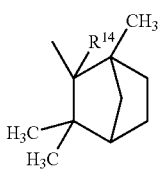

(1-6) 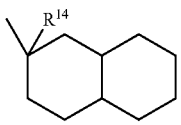

(1-7) 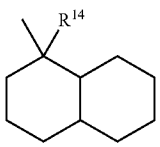

(1-8) 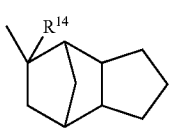

(1-9) 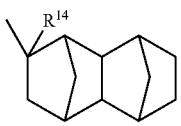

In the formulas above, $R^{14}$ represents an alkyl group; and g represents an integer of 0 to 8.

[Chemical Formula 10.]

(2-1) 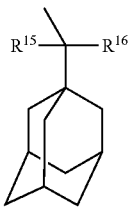

(2-2) 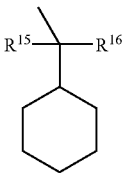

(2-3) 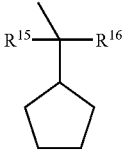

(2-4) 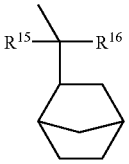

(2-5) 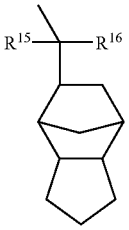

(2-6) 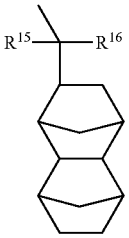

In the formulas above, each of $R^{15}$ and $R^{16}$ independently represents an alkyl group.

As the alkyl group for $R^{14}$, a linear or branched alkyl group is preferable.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

As the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 11.]

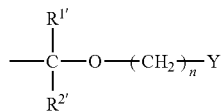

(p1)

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1) above, n is preferably an integer of 0 to 2, more preferably 0 or 1, and most preferably 0.

As the alkyl group of 1 to 5 carbon atoms for $R^{1'}$ and $R^{2'}$, the same alkyl groups of 1 to 5 carbon atoms as those described above for R can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 12.]

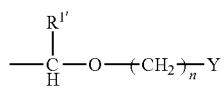

(p1-1)

In the formula, $R^{1'}$, n and Y are the same as defined above.

As the alkyl group of 1 to 5 carbon atoms for Y, the same alkyl groups of 1 to 5 carbon atoms as those for R above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 13.]

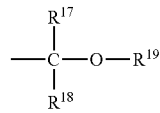

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the $R^{17}$ group is bonded to the $R^{19}$ group to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and an ethyl group is particularly desirable.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Specific examples of acetal-type acid dissociable, dissolution inhibiting groups include groups represented by formulas (p3-1) to (p3-12) shown below.

[Chemical Formula 14.]

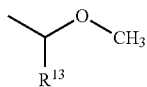
(p3-1)

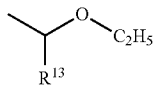
(p3-2)

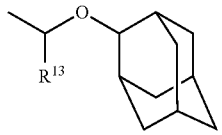
(p3-3)

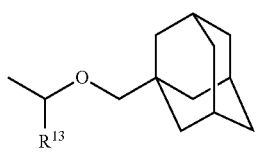
(p3-4)

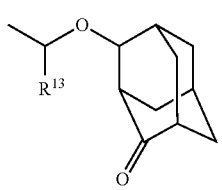
(p3-5)

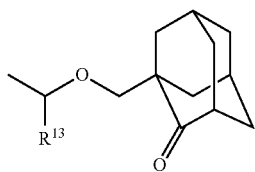
(p3-6)

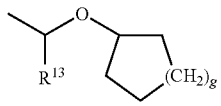
(p3-7)

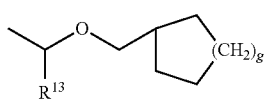
(p3-8)

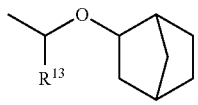
(p3-9)

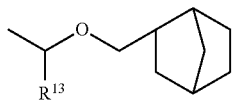
(p3-10)

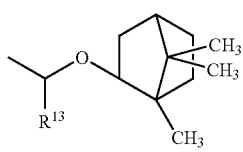
(p3-11)

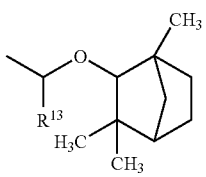
(p3-12)

In the formulas above, $R^{13}$ represents a hydrogen atom or a methyl group; and g is the same as defined above.

Specific examples of the structural unit (a1) include a structural unit represented by general formula (a1-0-1) shown below and a structural unit represented by general formula (a1-0-2) shown below.

[Chemical Formula 15.]

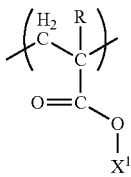
(a1-0-1)

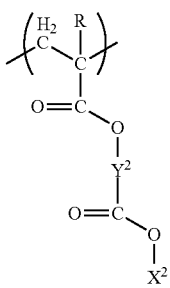
(a1-0-2)

In the formulas, R represents a hydrogen atom, an alkyl group of 1 to 5 carbon atoms or a halogenated alkyl group of 1 to 5 carbon atoms; $X^1$ represents an acid dissociable, dissolution inhibiting group; $Y^2$ represents a divalent linking group; and $X^2$ represents an acid dissociable, dissolution inhibiting group.

In general formula (a1-0-1), R is the same as defined for R in general formula (a0-1).

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above.

$X^2$ is the same as defined for $X^1$ in general formula (a1-0-1).

As examples of the divalent linking group for $Y^2$, the same groups as those described above for $R^2$ in formula (a0-1) can be given.

As $Y^2$, the aforementioned alkylene group, a divalent aliphatic cyclic group or a divalent linking group containing a hetero atom described in the explanation of $R^2$ is preferable. Among these, a divalent linking group containing a hetero atom is preferable, and a linear group containing an oxygen atom as a heteroatom, e.g., a group containing an ester bond is particularly desirable.

More specifically, a group represented by the aforementioned formula -A-O—B— or -A-C(=O)—O—B— is preferable, and a group represented by the formula —(CH$_2$)$_x$—C(=O)—O—(CH$_2$)$_y$— is particularly desirable.

x represents an integer of 1 to 5, preferably 1 or 2, and most preferably 1.

y represents an integer of 1 to 5, preferably 1 or 2, and most preferably 1.

Specific examples of the structural unit (a1) include structural units represented by general formulas (a1-1) to (a1-4) shown below.

[Chemical Formula 16.]

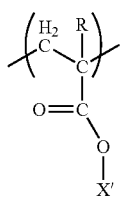
(a1-1)

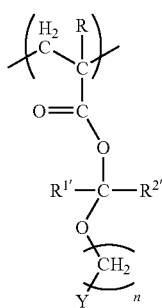
(a1-2)

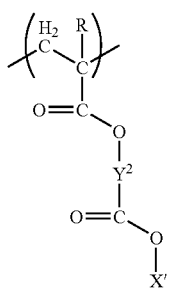
(a1-3)

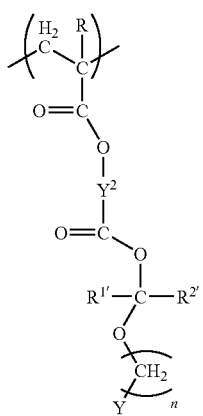
(a1-4)

In the formulas, X' represents a tertiary alkyl ester-type acid dissociable, dissolution inhibiting group; Y represents an alkyl group of 1 to 5 carbon atoms or an aliphatic cyclic group; n represents an integer of 0 to 3; Y$^2$ represents a divalent linking group; R is the same as defined above; and each of R$^{1'}$ and R$^{2'}$ independently represents a hydrogen atom or an alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for X$^1$.

As R$^{1'}$, R$^{2'}$, n and Y are respectively the same as defined for R$^{1'}$, R$^{2'}$, n and Y in general formula (p1) described above in connection with the "acetal-type acid dissociable, dissolution inhibiting group".

As examples of Y$^2$, the same groups as those described above for Y$^2$ in general formula (a1-0-2) can be given.

Specific examples of structural units represented by general formula (a1-1) to (a1-4) are shown below.

In the formulas shown below, R$^\alpha$ represents a hydrogen atom, a methyl group or a trifluoromethyl group.

[Chemical Formula 17.]

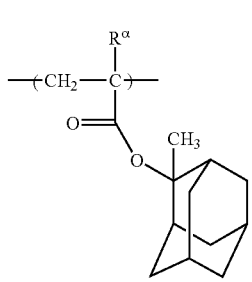
(a1-1-1)

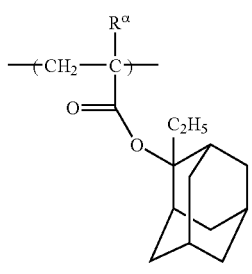
(a1-1-2)

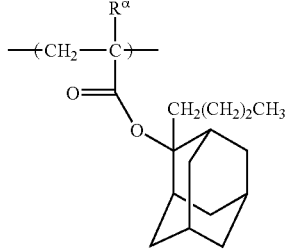
(a1-1-3)

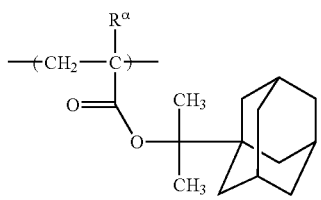
(a1-1-4)

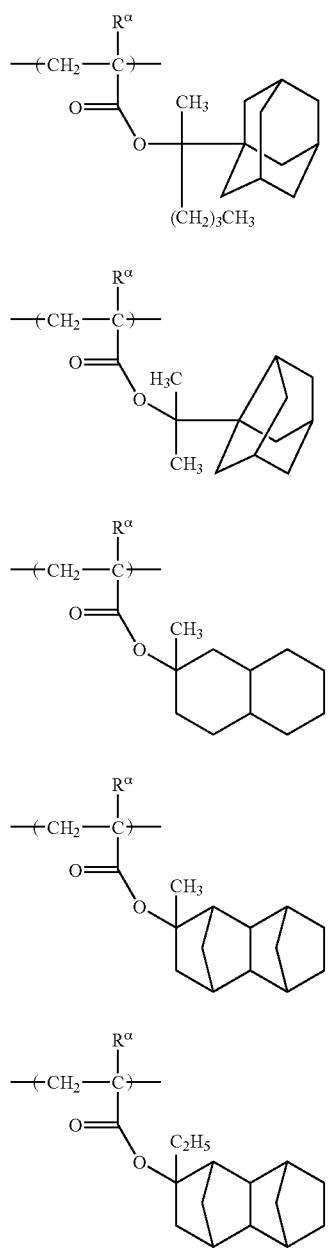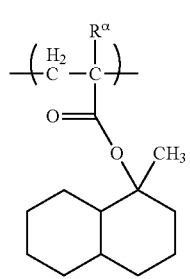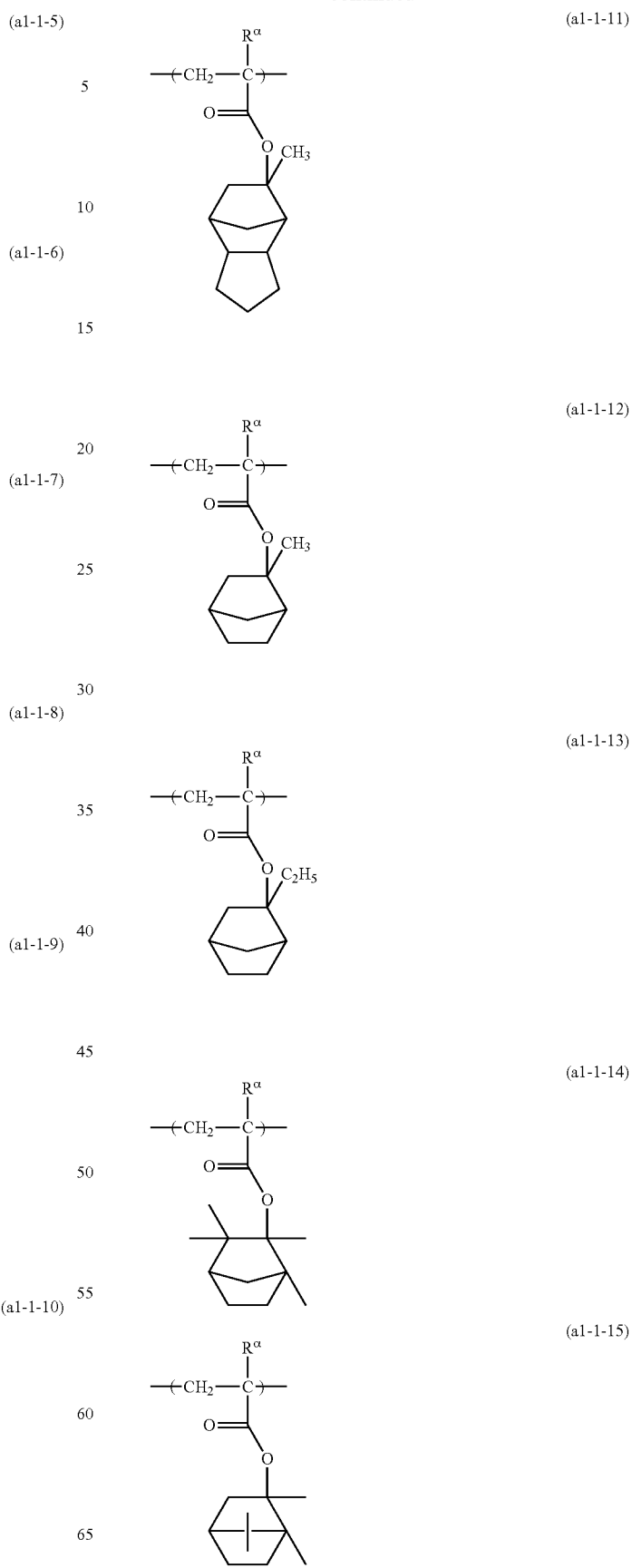

(a1-1-16) 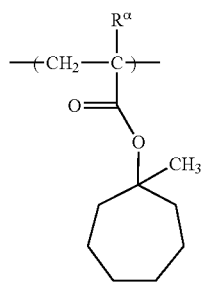
(a1-1-17) 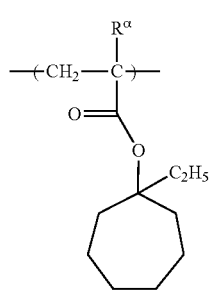
(a1-1-18) 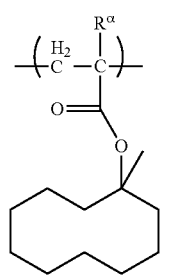
(a1-1-19) 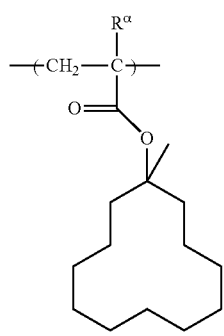
(a1-1-20) 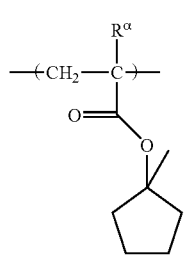
(a1-1-21) 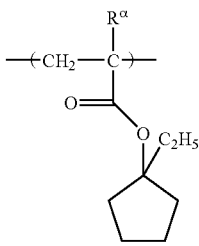
[Chemical Formula 19.]
(a1-1-22) 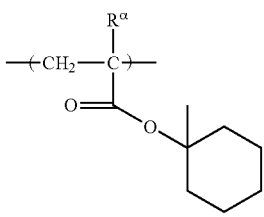
(a1-1-23) 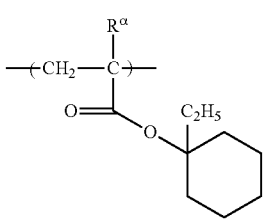
(a1-1-24) 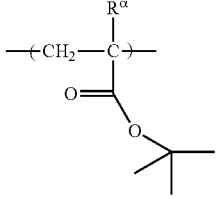
(a1-1-25) 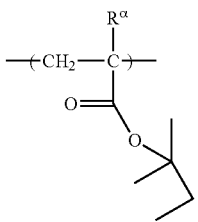
(a1-1-26) 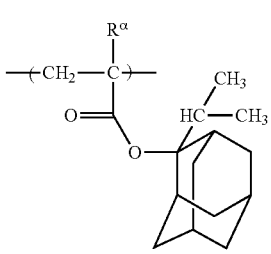

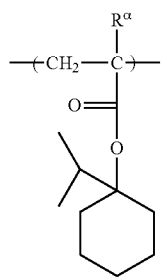
(a1-1-27)
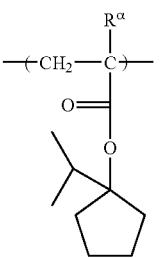
(a1-1-31)
[Chemical Formula 20.]
(a1-1-28)
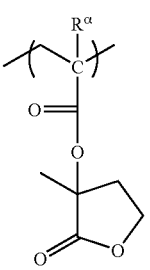
(a1-1-32)
(a1-1-29)
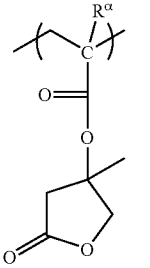
(a1-1-33)
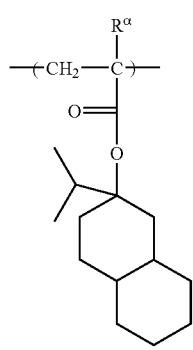
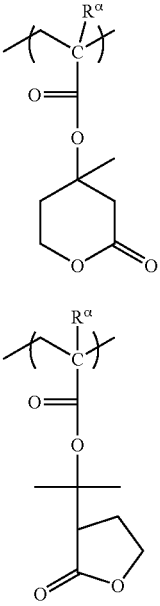
(a1-1-34)
(a1-1-30)
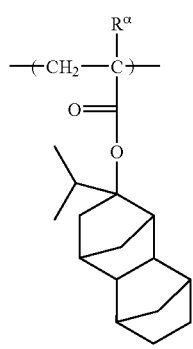
(a1-1-35)

(a1-1-36)
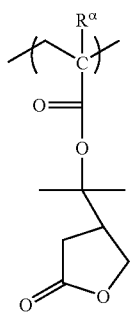
(a1-1-37)
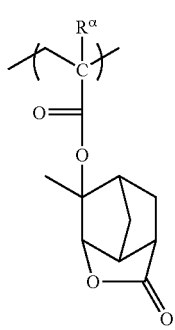
(a1-1-38)
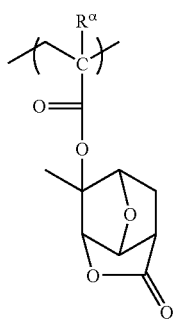
[Chemical Formula 21.]
(a1-2-1)
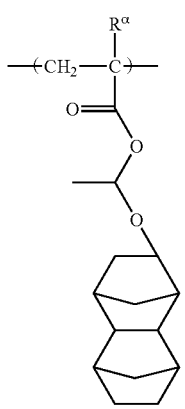
(a1-2-2)
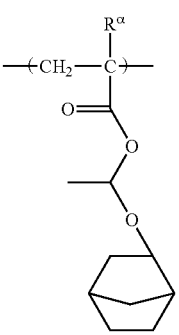
(a1-2-3)
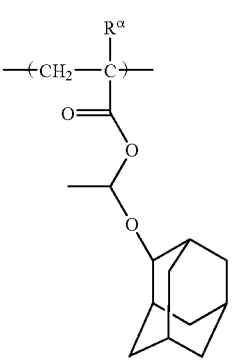
(a1-2-4)
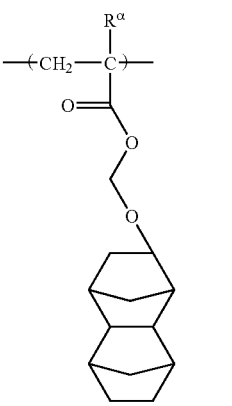
(a1-2-5)
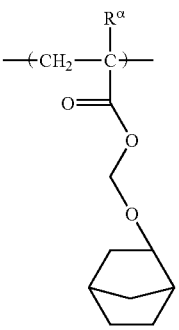

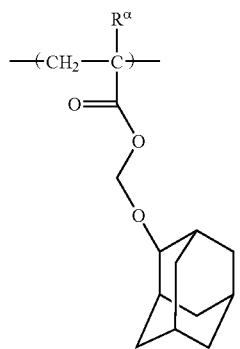
(a1-2-6)
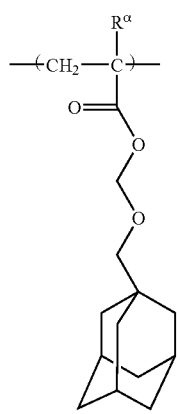
(a1-2-7)
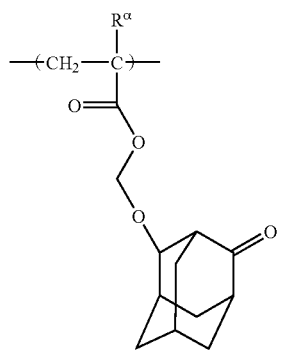
(a1-2-8)
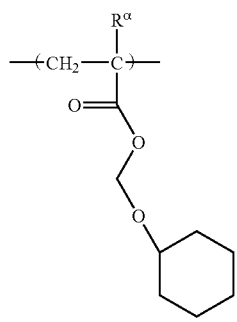
(a1-2-9)
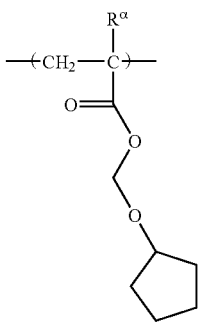
(a1-2-10)
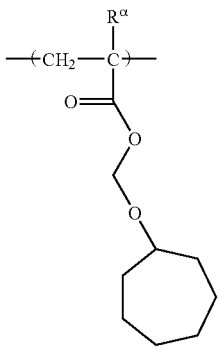
(a1-2-11)
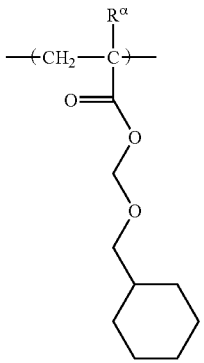
(a1-2-12)
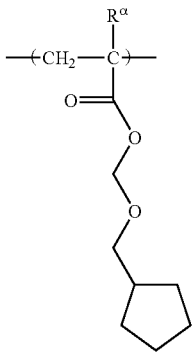
(a1-2-13)

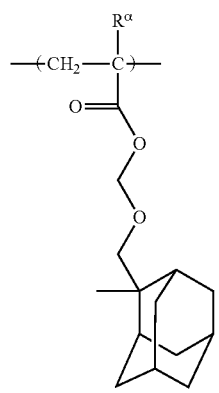 (a1-2-14)
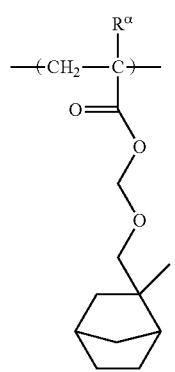 (a1-2-15)
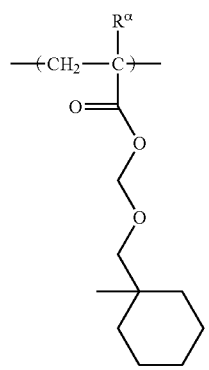 (a1-2-16)
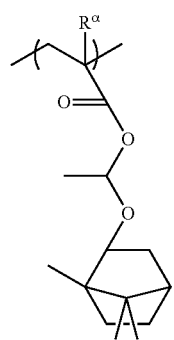 (a1-2-17)
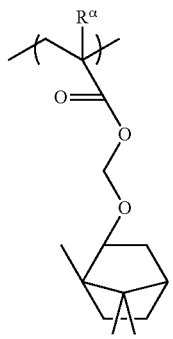 (a1-2-18)
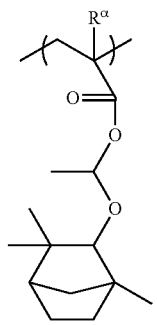 (a1-2-19)
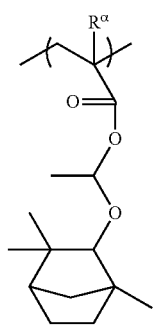 (a1-2-20)
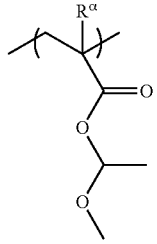 (a1-2-21)
(a1-2-22)

-continued
(a1-2-23)
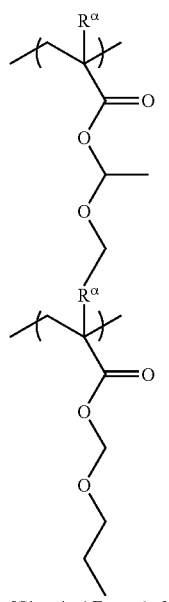
[Chemical Formula 22.]
(a1-3-1)
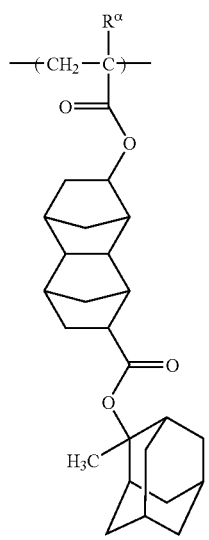
(a1-3-2)
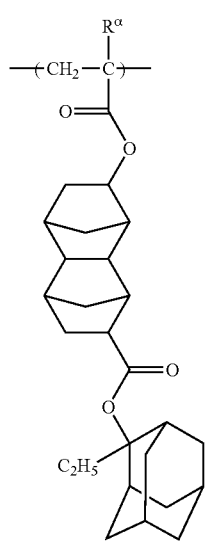
-continued
(a1-3-3)
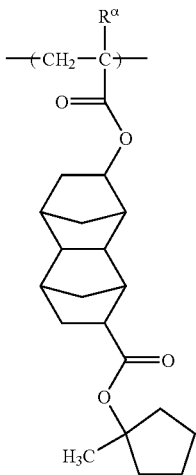
(a1-3-4)
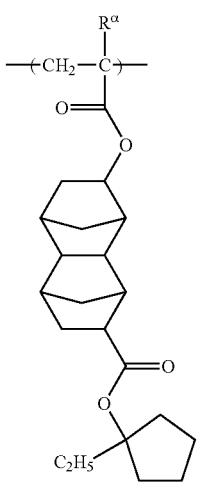
(a1-3-5)
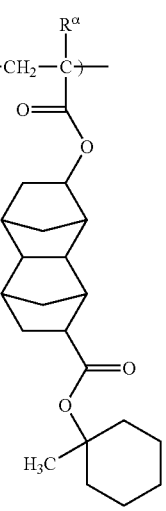

(a1-3-6) 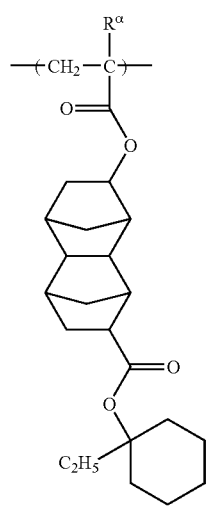
(a1-3-7) 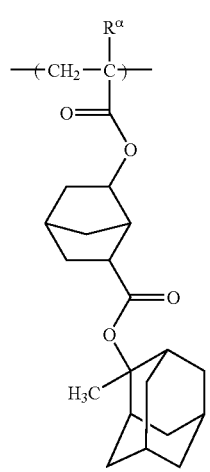
(a1-3-8) 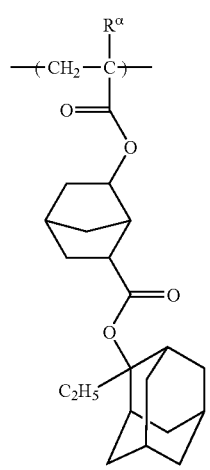
(a1-3-9) 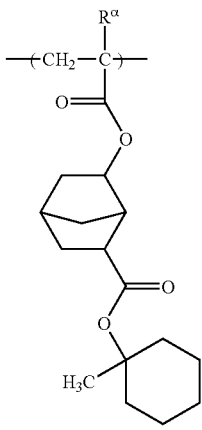
(a1-3-10) 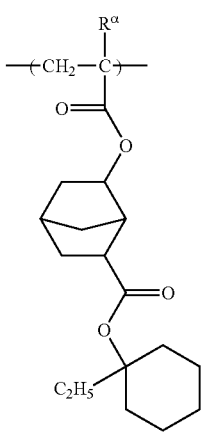
(a1-3-11) 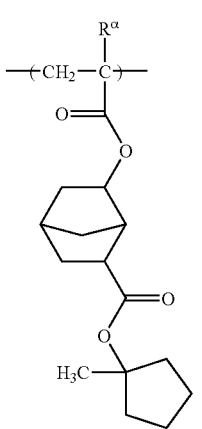

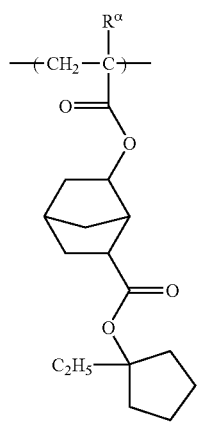 (a1-3-12)
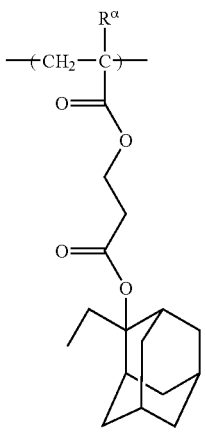 (a1-3-16)
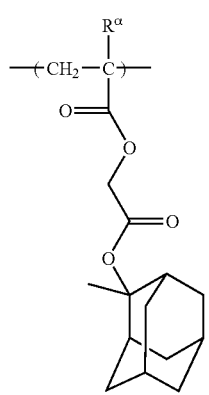 (a1-3-13)
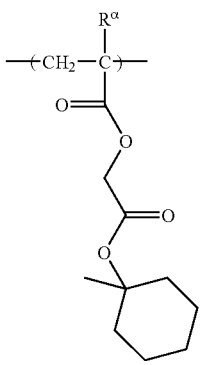 (a1-3-17)
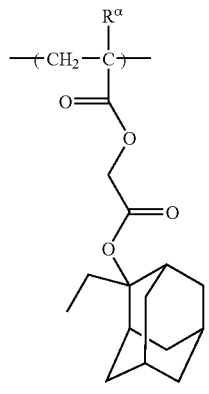 (a1-3-14)
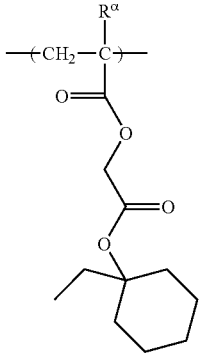 (a1-3-18)
[Chemical Formula 23.]
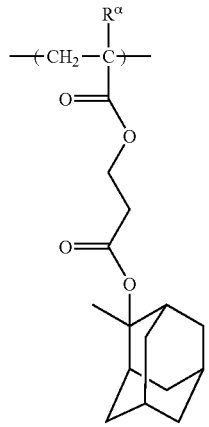 (a1-3-15)
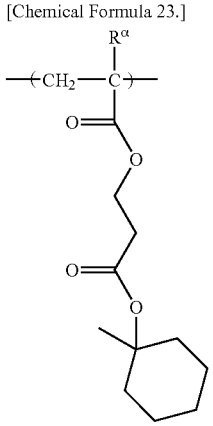 (a1-3-19)

(a1-3-20)
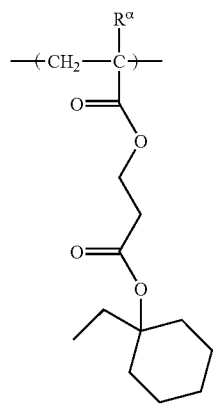
(a1-3-21)
(a1-3-22)
(a1-3-23)
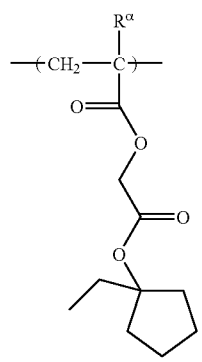
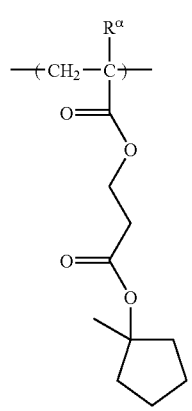
(a1-3-24)
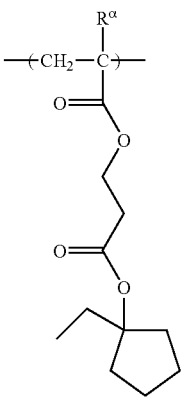
[Chemical Formula 24.]
(a1-3-25)
(a1-3-26)
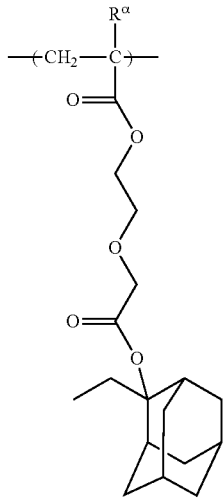

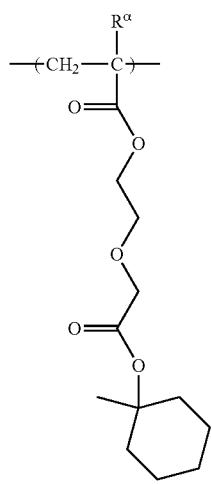 (a1-3-27)
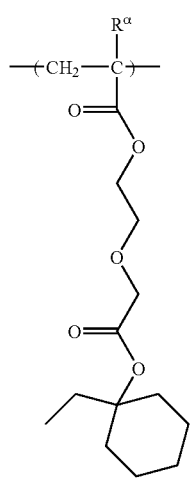 (a1-3-28)
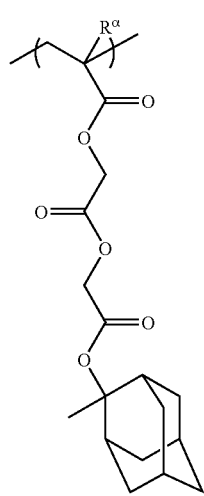 (a1-3-29)
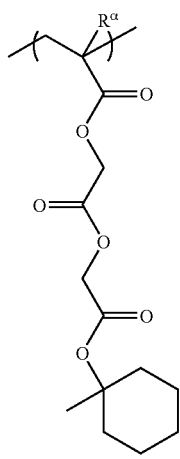 (a1-3-30)
[Chemical Formula 25.]
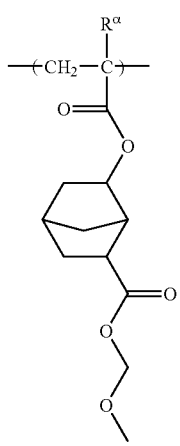 (a1-4-1)
(a1-4-2)

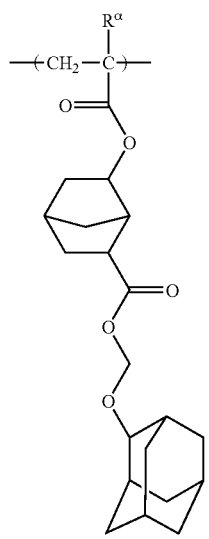
(a1-4-3)
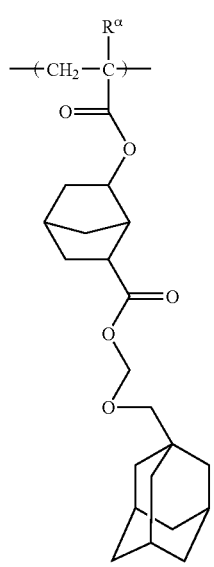
(a1-4-4)
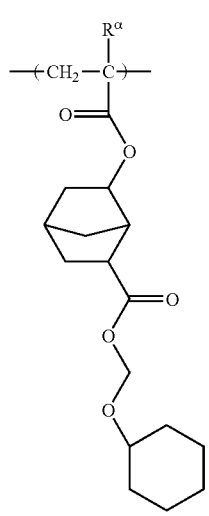
(a1-4-5)
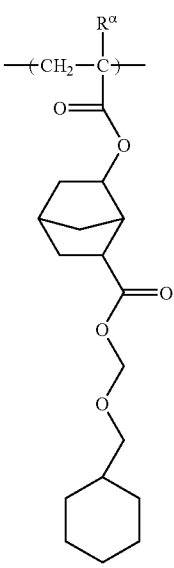
(a1-4-6)
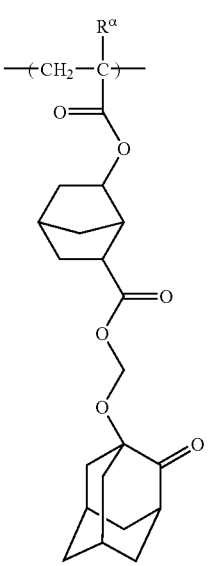
(a1-4-7)
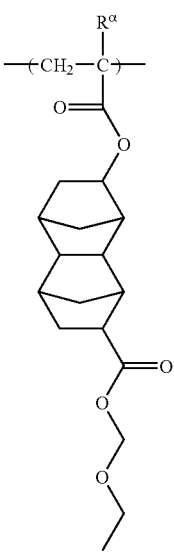
(a1-4-8)

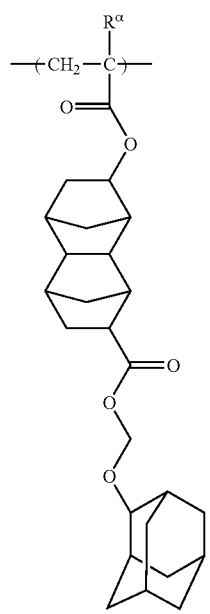
(a1-4-9)
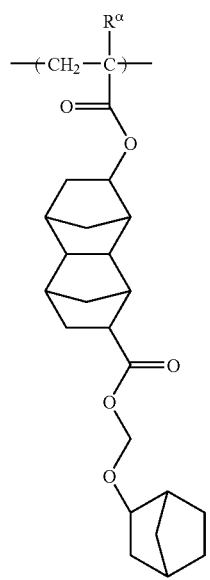
(a1-4-10)
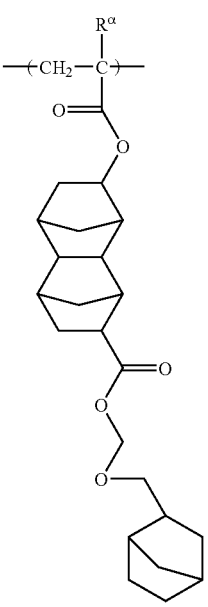
(a1-4-11)
(a1-4-12)

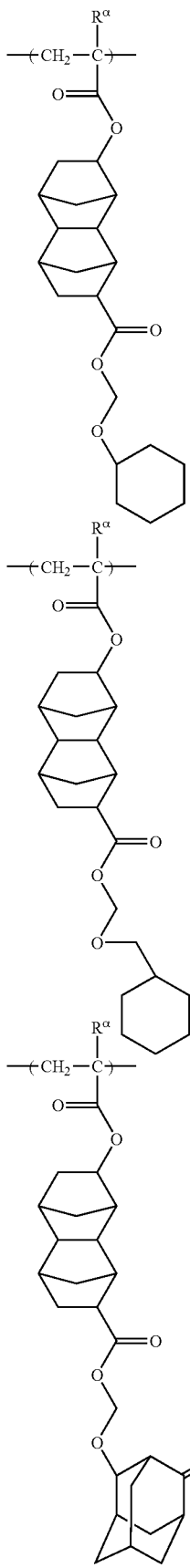

As the structural unit (a1), one type of structural unit may be used alone, or two or more types of structural units may be used in combination.

In the present invention, as the structural unit (a1), a structural unit represented by general formula (a1-1-01) shown below which includes the aforementioned formulas (a1-1-1), (a1-1-2) and (a1-1-7) to (a1-1-15) is particularly desirable in terms of achieving excellent lithography properties (e.g. EL margin, LWR, resolution and the like) and an excellent resist pattern shape.

As a structural unit represented by general formula (a1-1-01) shown below, a structural unit represented by general formula (a1-1-101) shown below which includes the aforementioned formulas (a1-1-1) and (a1-1-2) is particularly desirable.

[Chemical Formula 26.]

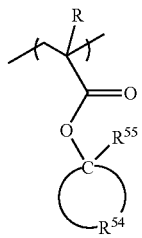

(a1-1-01)

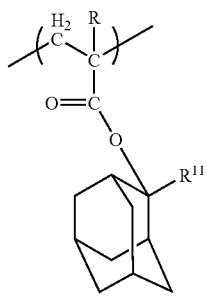

(a1-1-101)

In the formulas, R is the same as defined above; each of $R^{55}$ and $R^{11}$ independently represents a linear alkyl group of 1 to 5 carbon atoms; and $R^{54}$ represents a group which forms an aliphatic polycyclic group together with the carbon atom bonded to the $R^{54}$ group.

In general formula (a1-1-01), as the aliphatic polycyclic group formed by $R^{54}$ and the carbon atom to which $R^{54}$ is bonded, the same aliphatic cyclic groups as those described above for the aforementioned tertiary alkyl ester-type acid dissociable, dissolution inhibiting group and which are polycyclic can be used.

Further, it is preferable that the component (A1) include, as the structural unit (a1), at least one member selected from the group consisting of a structural unit represented by general formula (a1-0-11) shown below, a structural unit represented by general formula (a1-0-12) shown below, and a structural unit represented by general formula (a1-0-2) shown below.

[Chemical Formula 27.]

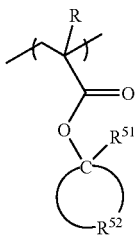

(a1-0-11)

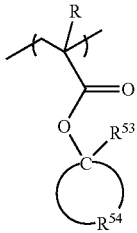

(a1-0-12)

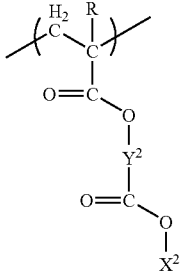

(a1-0-2)

In the formulas, R represents a hydrogen atom, a lower alkyl group or a halogenated lower alkyl group; $R^{51}$ represents an alkyl group; $R^{52}$ represents a group which forms an aliphatic monocyclic group with the carbon atom to which $R^{52}$ is bonded; $R^{53}$ represents a branched alkyl group; $R^{54}$ is the same as defined for $R^{54}$ in general formula (a1-1-01); $Y^2$ represents a divalent linking group; and $X^2$ represents an acid dissociable, dissolution inhibiting group.

In the formulas, R, $Y^2$ and $X^2$ are the same as defined above.

In general formula (a1-0-11), as the alkyl group for $R^{51}$, the same alkyl groups as those described above for $R^{14}$ in formulas (1-1) to (1-9) can be used, preferably a methyl group or an ethyl group, and most preferably an ethyl group.

As the aliphatic monocyclic group formed by $R^{52}$ and the carbon atoms to which $R^{52}$ is bonded, the same aliphatic cyclic groups as those described above for the aforementioned tertiary alkyl ester-type acid dissociable, dissolution inhibiting group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ethereal oxygen atom (—O—).

Further, the monocycloalkane may have a substituent such as a lower alkyl group, a fluorine atom or a fluorinated alkyl group.

As an examples of $R^{52}$ constituting such an aliphatic cyclic group, an alkylene group which may have an ethereal oxygen atom (—O—) interposed between the carbon atoms can be given.

Specific examples of structural units represented by general formula (a1-0-11) include structural units represented by the aforementioned formulas (a1-1-16) to (a1-1-23). Among these, a structural unit represented by general formula (a1-1-02) shown below which includes the structural units represented by the aforementioned formulas (a1-1-16), (a1-1-17) and (a1-1-20) to (a1-1-23) is preferable. Further, a structural unit represented by general formula (a1-1-02') shown below is also preferable.

In the formulas shown below, h is preferably 1 or 2, and most preferably 2.

[Chemical Formula 28.]

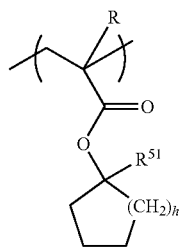

(a1-1-02)

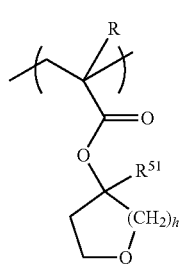

(a1-1-02')

In the formulas, R and $R^{51}$ are the same as defined above; and h represents an integer of 1 to 3.

In general formula (a1-0-12), as the branched alkyl group for $R^{53}$, the same alkyl groups as those described above for $R^{14}$ which are branched can be used, and an isopropyl group is particularly desirable.

$R^{54}$ is the same as defined for $R^{54}$ in formula (a1-1-01).

Specific examples of structural units represented by general formula (a1-0-12) include structural units represented by the aforementioned formulas (a1-1-26) to (a1-1-31).

Examples of structural units represented by general formula (a1-0-2) include structural units represented by the aforementioned formulas (a1-3) and (a1-4), and a structural unit represented by formula (a1-3) is preferable.

As a structural unit represented by general formula (a1-0-2), those in which $Y^2$ is a group represented by the aforementioned formula -A-O—B— or -A-C(=O)—O—B— is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 29.]

(a1-3-01)

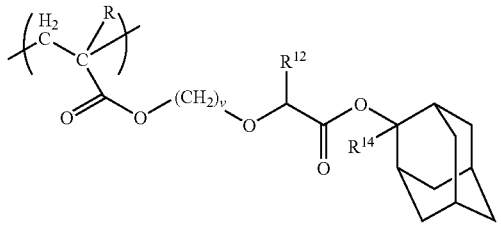

In the formula, R and $R^{14}$ are the same as defined above; $R^{12}$ represents a hydrogen atom or a methyl group; and v represents an integer of 1 to 10.

[Chemical Formula 30.]

(a1-3-02)

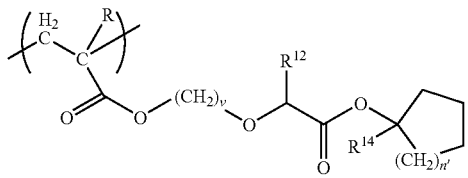

In the formula, R and $R^{14}$ are the same as defined above; $R^{12}$ represents a hydrogen atom or a methyl group; v represents an integer of 1 to 10; and n' represents an integer of 0 to 3.

[Chemical Formula 31.]

(a1-3-03)

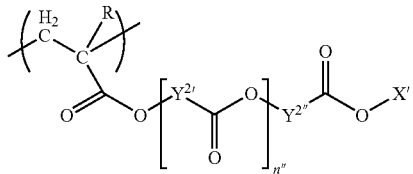

In the formula, R is as defined above; each of $Y^{2\prime}$ and $Y^{2\prime\prime}$ independently represents a divalent linking group; X' represents an acid dissociable, dissolution inhibiting group; and n" represents an integer of 1 to 3.

In general formulas (a1-3-01) and (a1-3-02), $R^{12}$ is preferably a hydrogen atom.

v is preferably an integer of 1 to 8, more preferably 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2\prime}$ and $Y^{2\prime\prime}$, the same groups as those described above for $Y^2$ in general formula (a1-3) can be used.

As $Y^{2\prime}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2\prime\prime}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable, dissolution inhibiting group for X', the same groups as those described above can be used. X' is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

n" is an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable. Among these, a structural unit represented by general formula (a1-3-03-1) is preferable, and a structural unit represented by the aforementioned formula (a1-3-29) or (a1-3-30) is particularly desirable.

[Chemical Formula 32.]

(a1-3-03-1)

(a1-3-03-2)

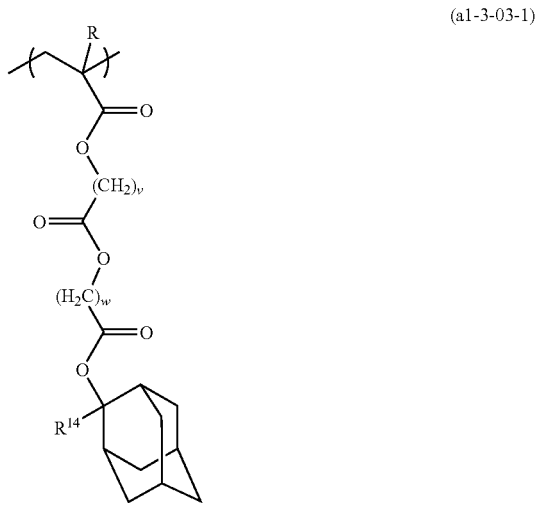

In the formulas, R and $R^{14}$ are the same as defined above; v represents an integer of 1 to 10; w represents an integer of 1 to 10; and t represents an integer of 0 to 3.

v is preferably an integer of 1 to 5, and most preferably 1 or 2.

w is preferably an integer of 1 to 5, and most preferably 1 or 2.

t is preferably an integer of 1 to 3, and most preferably 1 or 2.

In the component (A1), the amount of the structural unit (a1) based on the combined total of all structural units constituting the component (A1) is preferably 10 to 80 mol %, more preferably 20 to 70 mol %, and still more preferably 25 to 65 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a2))

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

In the present invention, a structural unit derived from an acrylate ester containing a lactone-containing cyclic group which falls under the category of the aforementioned structural unit (a1) is classified as a structural unit (a1). When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propiolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 33.]

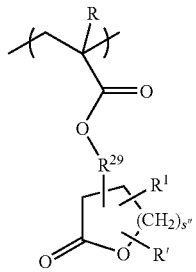
(a2-1)

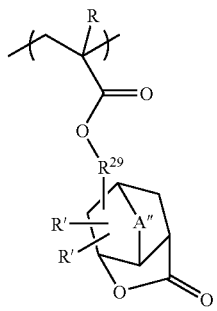
(a2-2)

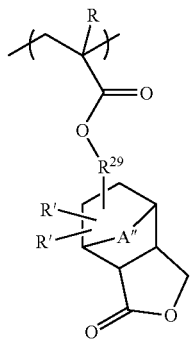
(a2-3)

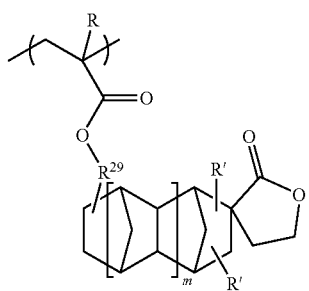
(a2-4)

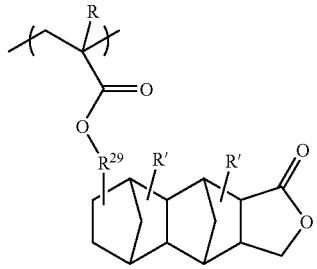
(a2-5)

In the formulas, R represents a hydrogen atom, a lower alkyl group or a halogenated lower alkyl group; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

As examples of R', the same groups as those described above for $R^8$ in general formula (3-1) can be given. In terms of industrial availability, R' is preferably a hydrogen atom.

As examples of A", the same groups as those described above for A' in general formula (3-1) can be given.

$R^{29}$ represents a single bond or a divalent linking group. Examples of divalent linking groups include the same divalent linking groups as those described above for $R^2$ in general formula (a0-1). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for $R^2$.

s" is preferably 1 or 2.

Specific examples of structural units represented by general formulas (a2-1) to (a2-5) are shown below. In the formulas shown below, $R^\alpha$ represents a hydrogen atom, a methyl group or a trifluoromethyl group.

[Chemical Formula 34.]

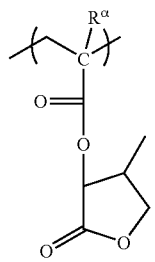
(a2-1-1)

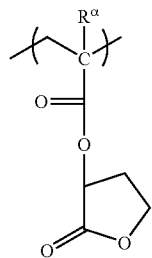
(a2-1-2)

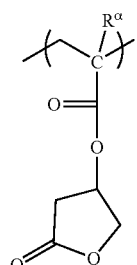
(a2-1-3)

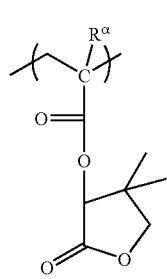
(a2-1-4)

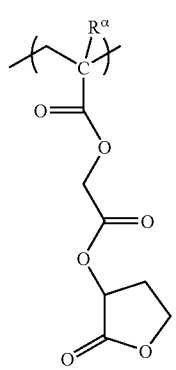
(a2-1-5)

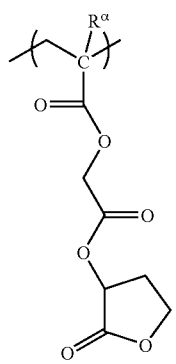
(a2-1-6)

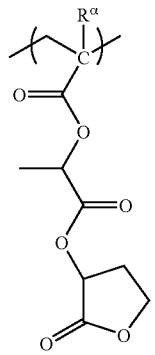
(a2-1-7)

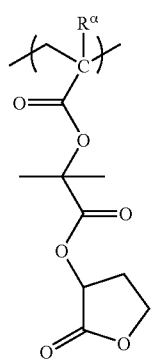

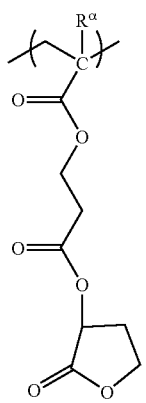
(a2-1-8)
[Chemical Formula 35.]
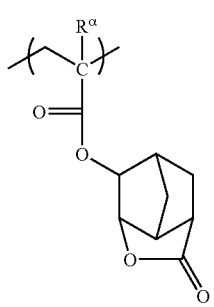
(a2-2-1)
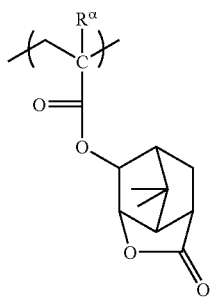
(a2-2-2)
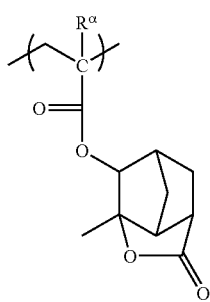
(a2-2-3)
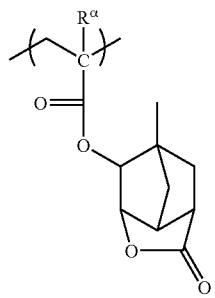
(a2-2-4)
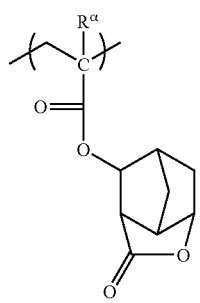
(a2-2-5)
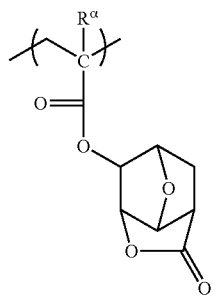
(a2-2-6)
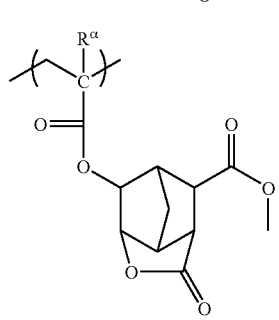
(a2-2-7)
(a2-2-8)

(a2-2-9)
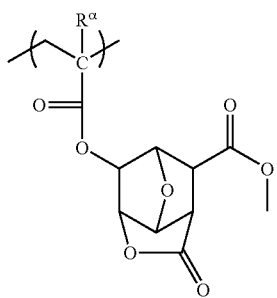
(a2-2-10)
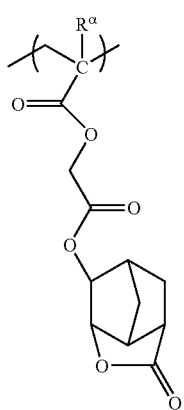
(a2-2-11)
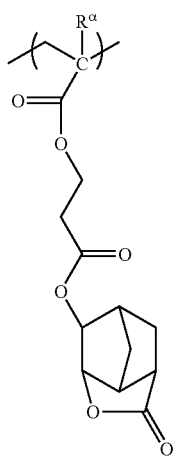
(a2-2-12)
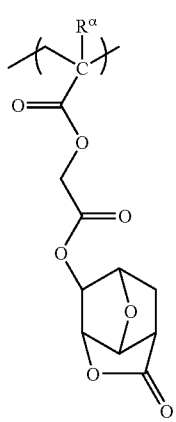
(a2-2-13)
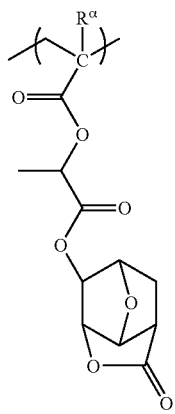
(a2-2-14)
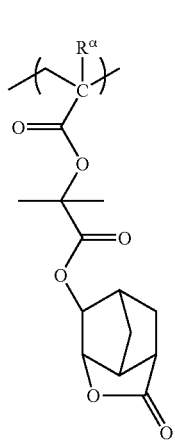
(a2-2-15)
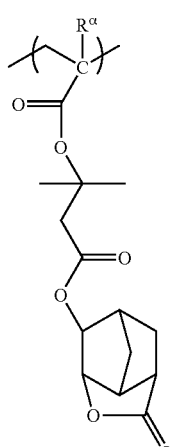

[Chemical Formula 36.]
(a2-3-1) 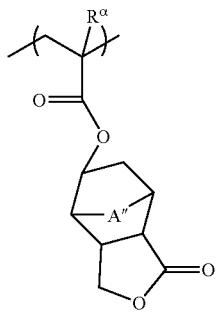
(a2-3-2) 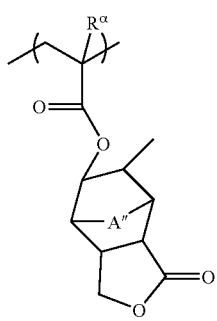
(a2-3-3) 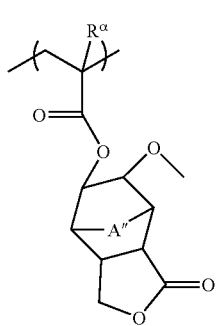
(a2-3-4) 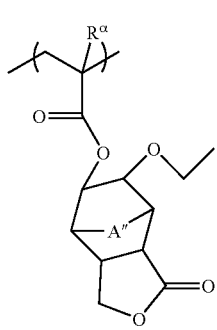
(a2-3-5) 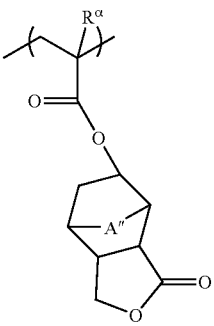
[Chemical Formula 37.]
(a2-4-1) 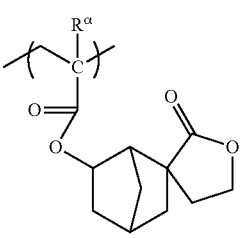
(a2-4-2) 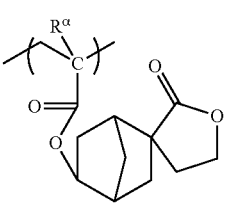
(a2-4-3) 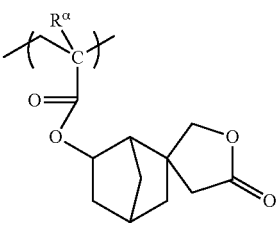
(a2-4-4) 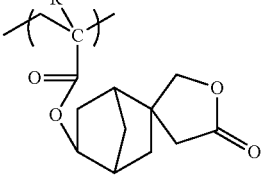
(a2-4-5) 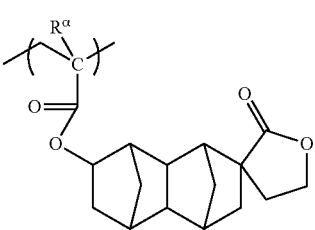

(a2-4-6)
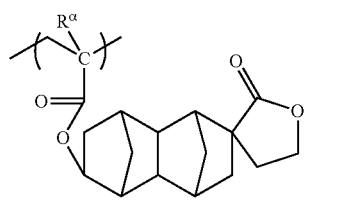
(a2-4-7)
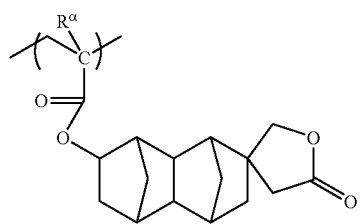
(a2-4-8)
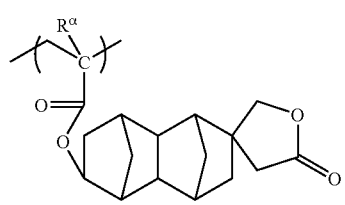
(a2-4-9)
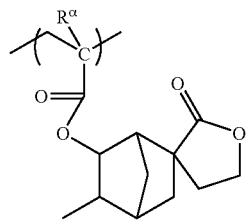
(a2-4-10)
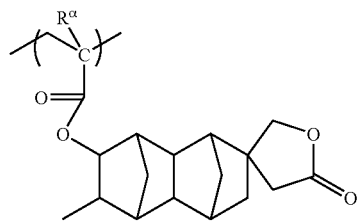
(a2-4-11)
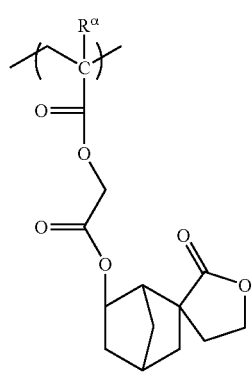
(a2-4-12)
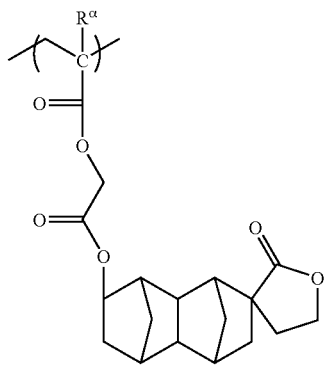
[Chemical Formula 38.]
(a2-5-1)
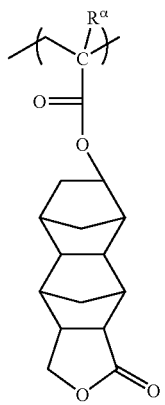
(a2-5-2)
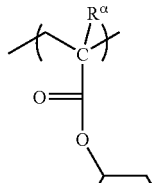
(a2-5-3)
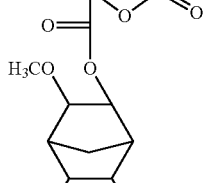

(a2-5-4)

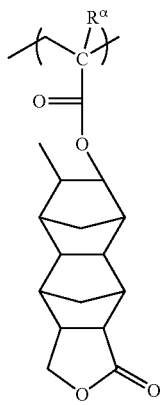

(a2-5-5)

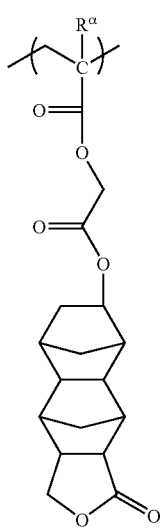

(a2-5-6)

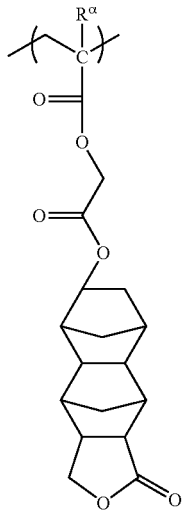

Specific examples of structural units represented by general formulas (a2-1) to (a2-5) in which s' is 1 include groups in which the oxygen atom (—O—) within the carbonyloxy group bonded to the carbon atom on the α position and the lactone-containing cyclic group bonded to the oxygen atom has —CH$_2$—C(=O)—O— or —C(CH$_3$)$_2$—C(=O)—O— interposed therebetween.

In the component (A1), as the structural unit (a2), one type of structural unit may be used, or two or more types may be used in combination.

In the present invention, it is particularly desirable that the component (A1) contain, as a structural unit (a2), at least one structural unit selected from the group consisting of a structural unit represented by general formula (a2-1) and a structural unit represented by general formula (a2-2).

In terms of improving the adhesion between a substrate and a resist film formed using a positive resist composition containing the component (A1) and increasing the compatibility with a developing solution, the amount of the structural unit (a2) within the component (A1), based on the combined total of all structural units constituting the component (A1) is preferably 5 to 70 mol %, more preferably 10 to 65 mol %, still more preferably 20 to 65 mol %, and most preferably 20 to 45 mol %. By ensuring the above-mentioned range, CDU and the pattern shape can be further improved.

Further, in terms of achieving excellent lithography properties, the amount of the structural unit (a0) and the structural unit (a2) within the component (A1), based on the combined total of all structural units constituting the component (A1) is preferably 1 to 70 mol %, more preferably 5 to 70 mol %, still more preferably 10 to 65 mol %, and most preferably 20 to 65 mol %. By ensuring the above-mentioned range, CDU and the pattern shape can be further improved.

(Structural Unit (a3))

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 39.]

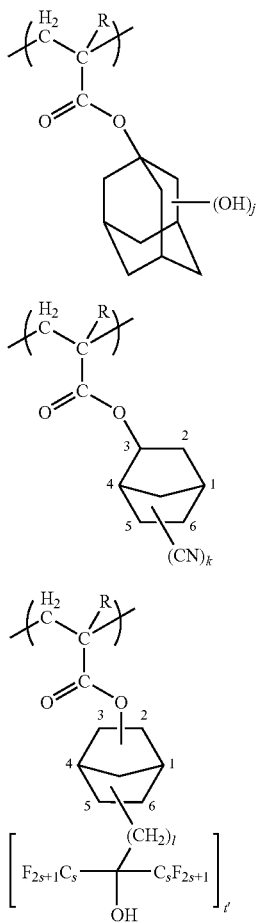

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group. j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. 1 is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3), one type of structural unit may be used, or two or more types may be used in combination.

The amount of the structural unit (a3) within the component (A1) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Other Structural Units)

The component (A1) may also have a structural unit other than the above-mentioned structural units (a0), (a1), (a2) and (a3), as long as the effects of the present invention are not impaired.

As such a structural unit, any other structural unit which cannot be classified as one of the above structural units (a0), (a1), (a2) and (a3) can be used without any particular limitations, and any of the multitude of conventional structural units used within resist resins for ArF excimer lasers or KrF excimer lasers (and particularly for ArF excimer lasers) can be used.

As such a structural unit, a structural unit derived from an acrylate ester containing a non-acid-dissociable aliphatic polycyclic group is preferable.

Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 40.]

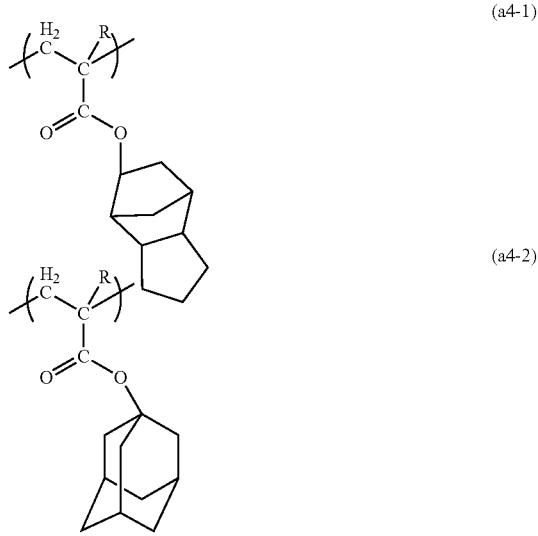

-continued (a4-3)
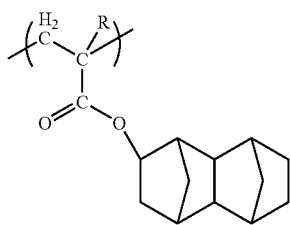

(a4-4)
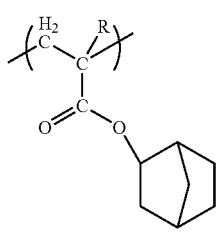

(a4-5)
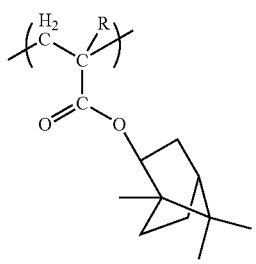

In the formulas, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A1) is a polymeric compound having an acid dissociable, dissolution inhibiting group in the structure thereof and including a structural unit (a0).

As the component (A1), for example, a copolymer including the structural unit (a0) and the structural unit (a1) is preferable. Examples of such a copolymer include a copolymer consisting of the structural units (a0) and (a1), a copolymer consisting of the structural units (a0), (a1) and (a3), a copolymer consisting of the structural units (a0), (a1) and (a2), and a copolymer consisting of the structural units (a0), (a1), (a2) and (a3).

In the present invention, as the component (A1), a copolymer that includes a combination of structural units such as that shown below (polymeric compounds (A1-1) to (A1-7)) is particularly desirable.

[Chemical Formula 41.]

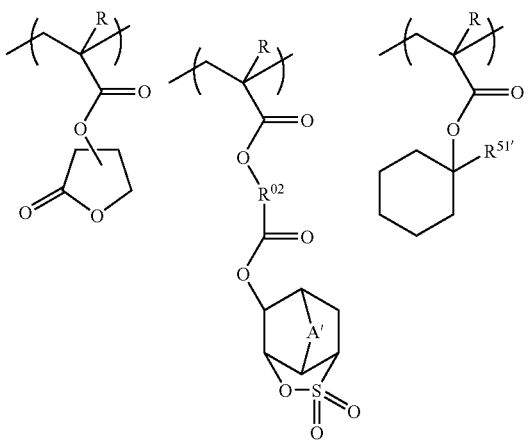

Polymeric compound (A1-1)

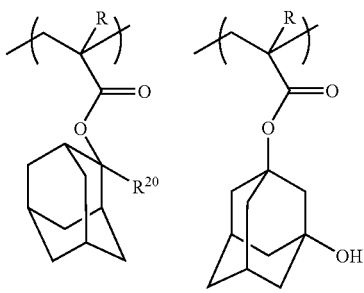

In the formula, R, $R^{02}$ and A' are the same as defined above, wherein the plurality of R may be the same or different from each other; and each of $R^{20}$ and $R^{51'}$ independently represents an alkyl group.

[Chemical Formula 42.]

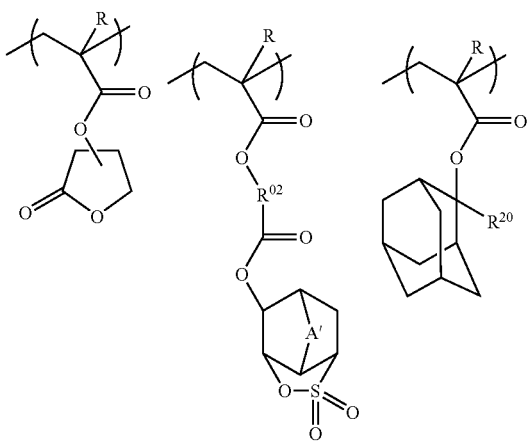

Polymeric compound (A1-2)

-continued

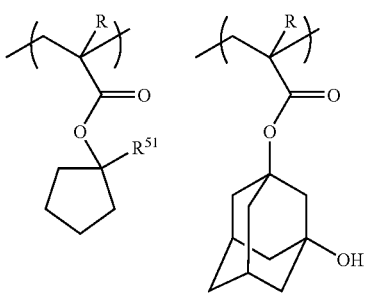

In the formulas, R, $R^{02}$, A' and $R^{51}$ are the same as defined above; wherein the plurality of R may be the same or different from each other; and $R^{20}$ represents an alkyl group.

[Chemical Formula 43.]

Polymeric compound (A1-3)

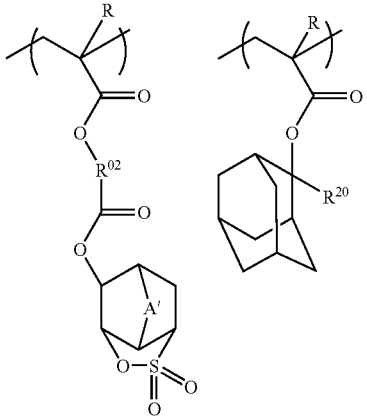

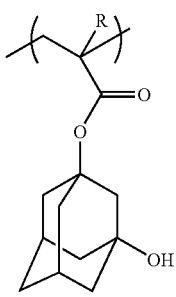

In the formula, R, $R^{02}$ and A' are the same as defined above, wherein the plurality of R may be the same or different from each other; and $R^{20}$ represents an alkyl group.

[Chemical Formula 44.]

Polymeric compound (A1-4)

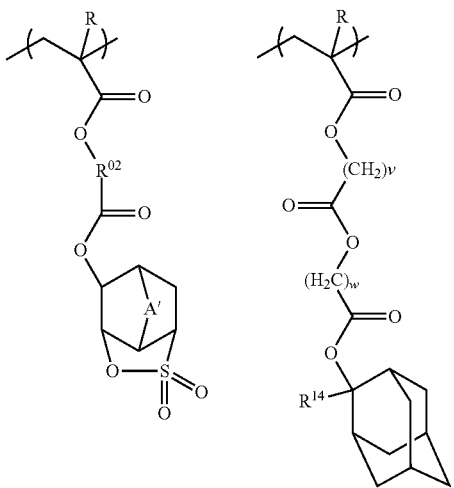

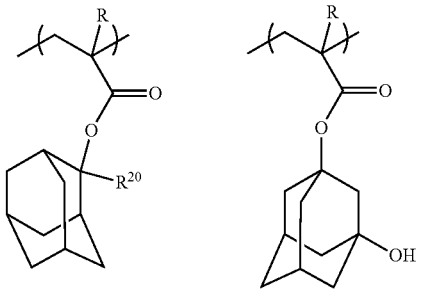

In the formula, R, $R^{02}$, A', $R^{14}$, v and w are the same as defined above, wherein the plurality of R may be the same or different from each other; and $R^{20}$ represents an alkyl group.

[Chemical Formula 45.]

Polymeric compound (A1-5)

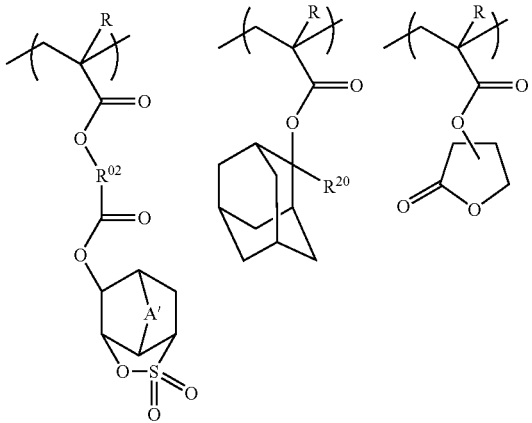

In the formula, R, $R^{02}$ and A' are the same as defined above, wherein the plurality of R may be the same or different from each other; and $R^{20}$ represents an alkyl group.

[Chemical Formula 46.]

Polymeric compound (A1-6)

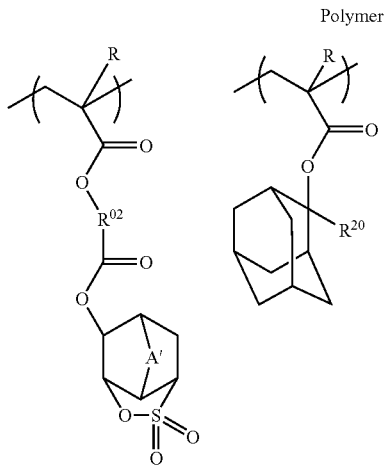

In the formula, R, $R^{02}$, A', $R^{51}$ and h are the same as defined above, wherein the plurality of R may be the same or different from each other; and $R^{20}$ represents an alkyl group.

[Chemical Formula 47.]

Polymeric compound (A1-7)

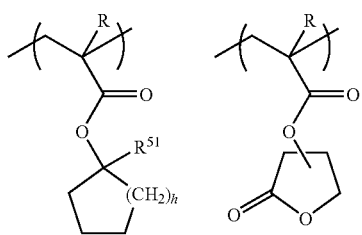

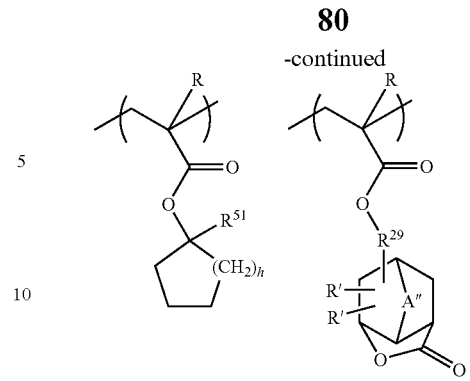

In the formula, R, $R^{02}$, A', $R^{51}$, h, $R^{29}$, A" and R' are the same as defined above, wherein the plurality of R and R' may be the same or different from each other; and $R^{20}$ represents an alkyl group.

In the aforementioned chemical formulas representing the polymeric compounds (A1-1) to (A1-7), as the alkyl group for $R^{20}$, the same alkyl groups as those described above for $R^{14}$ can be mentioned, and is preferably a linear or branched alkyl group. As the linear alkyl group, a methyl group or an ethyl group is preferable. As the branched alkyl group, an isopropyl group is preferable.

In the chemical formulas, the alkyl group for $R^{51}$ is the same as defined for the alkyl group represented by R, preferably a methyl group or an ethyl group, and most preferably a methyl group.

In the chemical formulas, the alkyl group for $R^{51'}$ is the same as defined for the alkyl group represented by R, preferably a methyl group or an ethyl group, and most preferably an ethyl group.

In the chemical formulas, A' is the same as defined for A' in general formula (a0-1-11), and is preferably an oxygen atom, a methylene group or an ethylene group.

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory. Further, the dispersity (Mw/Mn) is preferably 1.0 to 5.0, more preferably 1.0 to 3.0, and most preferably 1.2 to 2.5. Here, Mn is the number average molecular weight.

In the component (A), as the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, a resist pattern exhibiting a high rectangularity can be formed, and various lithography properties are improved. Further, the solubility of the base component (A) in an organic solvent can be improved.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—CH$_2$—CH$_2$—CH$_2$—C(CF$_3$)$_2$—OH, a —C(CF$_3$)$_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

For example, as a monomer for deriving the structural unit (a0), a compound represented by general formula (a0-1-0) shown below (hereafter, referred to as "compound (a0-1-0)") can be used.

[Chemical Formula 48.]

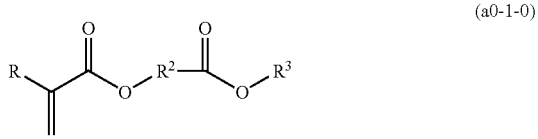

(a0-1-0)

In general formula (a0-1-0), R, R$^2$ and R$^3$ are the same as defined above.

The method for producing the compound (a0-1-0) is not particularly limited, and the compound (a0-1-0) can be produced by a conventional method.

For example, in the presence of a base, a compound (X-2) represented by general formula (X-2) shown below is added to a solution obtained by dissolving a compound (X-1) represented by general formula (X-1) shown below in a reaction solvent, and a reaction is effected to thereby obtain a compound (a0-1-0).

Examples of the base include inorganic bases such as sodium hydride, K$_2$CO$_3$ and Cs$_2$CO$_3$; and organic bases such as triethylamine, 4-dimethylaminopyridine (DMAP) and pyridine. Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids can be used individually, or in a combination of two or more.

[Chemical Formula 49.]

(X-1)

(X-2)

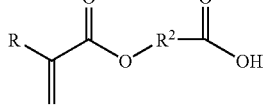

In the positive resist composition of the present invention, the component (A) may contain "a base component which exhibits increased solubility in an alkali developing solution under action of acid" other than the component (A1) (hereafter, referred to as "component (A2)").

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally the aforementioned structural units (a2) to (a4) can be used.

As the component (A2), one type of resin may be used, or two or more types of resins may be used in combination.

As the component (A), one type may be used, or two or more types of compounds may be used in combination.

In the resist composition of the present invention, the amount of the component (A) can be appropriately adjusted depending on the thickness of the resist film to be formed, and the like.

<Component (B)>

The component (B) includes an acid generator (B1) including a compound represented by general formula (b1-1) shown below (hereafter, this acid generator (B1) is referred to as "component (B1)").

[Chemical Formula 50.]

(b1-1)

In formula (b1-1), R$^0$ represents a hydrocarbon group of 1 to 12 carbon atoms which may have a substituent, with the provision that the carbon atom adjacent to the sulfur atom within the —SO$_3$$^-$ group has no fluorine atom bonded thereto; and Z$^+$ represents an organic cation.

In general formula (b1-1), the hydrocarbon group for R$^0$ may or may not have a substituent.

However, the carbon atom adjacent to the sulfur atom within the —SO$_3$$^-$ group has no fluorine atom bonded thereto. Therefore, upon exposure, the component (B1) generates a sulfonic acid exhibiting a weaker acid strength than the acid generated from an acid generator in which a fluorine atom is bonded to the carbon atom adjacent to the sulfur atom within —SO$_3$$^-$. As a result, in the present invention, the shape of a resist pattern formed can be improved. Further, the lithography properties are also improved.

The substituent preferably contains no fluorine atom, and examples thereof include a lower alkyl group of 1 to 5 carbon atoms and an oxygen atom (=O).

The hydrocarbon group of 1 to 12 carbon atoms represented by R$^0$ may be either an aliphatic hydrocarbon group or an aromatic hydrocarbon group. By virtue of using a hydrocarbon group of 1 to 12 carbon atoms, the rectangularity of the resist pattern is improved.

When the hydrocarbon group for R$^0$ is an aliphatic hydrocarbon group, the aliphatic hydrocarbon group may be either saturated or unsaturated, but in general, the aliphatic hydrocarbon group is preferably saturated.

Further, the aliphatic hydrocarbon group may be either a chain-like (linear or branched) hydrocarbon group, or a cyclic hydrocarbon group.

As the chain-like hydrocarbon group, a linear or branched alkyl group is preferable. The alkyl group preferably has 1 to 10 carbon atoms, more preferably 1 to 8, and still more preferably 3 to 8.

Specific examples of linear or branched alkyl groups include a methyl group, an ethyl group, an n-propyl group, an isopropyl group, an n-butyl group, an isobutyl group, a tert-butyl group, a pentyl group, an isopentyl group, a neopentyl group, an n-hexyl group, an n-heptyl group and an n-octyl group. Among these, a methyl group, an n-propyl group and an n-octyl group are preferable, and an n-octyl group is particularly desirable.

Specific examples of the component (B1) having a sulfonate ion as the anion moiety in which $R^0$ represents a linear or branched alkyl group include onium salts having a cation represented by general formula (I-1), (I-2), (I-5) or (I-6) above as the cation moiety, and a sulfonate ion represented by general formula (b1-1-1) shown below as the anion moiety.

[Chemical Formula 51.]

$$C_aH_{2a+1}SO_3^- \quad (b1\text{-}1\text{-}1)$$

In the formula, a represents an integer of 1 to 10.

In general formula (b1-1-1), a represents an integer of 1 to 10, and preferably 1 to 8.

Specific examples of sulfonate ions represented by general formula (b1-1-1) include a methanesulfonate ion, an ethanesulfonate ion, an n-propanesulfonate ion, an n-butanesulfonate ion and an n-octanesulfonate ion.

Examples of cyclic hydrocarbon groups as the hydrocarbon group for $R^0$ include an aliphatic cyclic group and a group in which at least one hydrogen atom within a chain-like hydrocarbon group have been substituted with an aliphatic cyclic group (aliphatic cyclic group-containing group).

As the "aliphatic cyclic group", the same aliphatic cyclic groups as those described above in connection with the acid dissociable, dissolution inhibiting group for the component (A) can be used. The aliphatic cyclic group preferably has 3 to 12 carbon atoms, and more preferably 4 to 10.

The aliphatic cyclic group may be either a polycyclic group or a monocyclic group.

As the monocyclic group, a group in which one hydrogen atom has been removed from a monocycloalkane of 3 to 6 carbon atoms is preferable, and specific examples thereof include a cyclopentyl group and a cyclohexyl group.

The polycyclic group preferably has 7 to 12 carbon atoms, and specific examples thereof include an adamantyl group, a norbornyl group, an isobornyl group, a tricyclodecanyl group and a tetracyclododecanyl group.

Among the aforementioned examples, a polycyclic group is preferable, and an adamantyl group, a norbornyl group or a tetracyclododecanyl group is preferable from an industrial viewpoint. As described above, these aliphatic cyclic groups may or may not have a substituent.

As the aliphatic cyclic group within the "aliphatic cyclic group-containing group", the same groups as those described above can be used. As the chain-like hydrocarbon group to which the aliphatic cyclic group is bonded to form the "aliphatic cyclic group-containing group", a linear or branched alkyl group is preferable, and a lower alkyl group of 1 to 5 carbon atoms is more preferable. Specific examples thereof include a methyl group, an ethyl group, an n-propyl group, an isopropyl group, an n-butyl group, an isobutyl group, a tert-butyl group, a pentyl group, an isopentyl group and a neopentyl group. Among these, a linear alkyl group is preferable, and from industrial viewpoint, a methyl group or an ethyl group is more preferable.

Specific examples of sulfonate ions in which $R^0$ is a cyclic hydrocarbon group include sulfonate ions represented by formulas (b1-1-21) to (b1-1-26) shown below.

[Chemical Formula 52.]

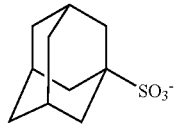
(b1-1-21)

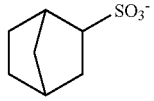
(b1-1-22)

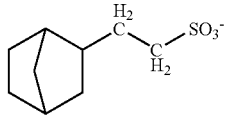
(b1-1-23)

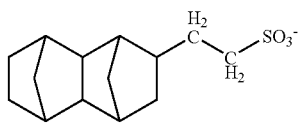
(b1-1-24)

(b1-1-25)

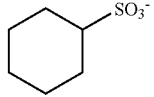
(b1-1-26)

Further, as a sulfonate ion in which $R^0$ represents a cyclic hydrocarbon group, an ion represented by general formula (b1-1-20) shown below is also preferable.

[Chemical Formula 53.]

(b1-1-20)

In general formula (b1-1-20), $R^{OX}$ represents a cyclic alkyl group of 4 to 12 carbon atoms that has an oxygen atom (=O) as a substituent; and r represents 0 or 1.

In general formula (b1-1-20), $R^{OX}$ represents a cyclic alkyl group of 4 to 12 carbon atoms that has an oxygen atom (=O) as a substituent The expression "has an oxygen atom as a substituent" means that two hydrogen atoms bonded to a carbon atom constituting the cyclic alkyl group of 4 to 12 carbon atoms are substituted with an oxygen atom (=O).

The cyclic alkyl group represented by $R^{OX}$ is not particularly limited as long as it has 4 to 12 carbon atoms, and may be either polycyclic or monocyclic. Examples thereof include a group in which one hydrogen atom has been removed from a monocycloalkane or a polycycloalkane such as a bicycloalkane, tricycloalkane or tetracycloalkane. As the monocyclic group, a group in which one hydrogen atom has been removed from a monocycloalkane of 3 to 8 carbon atoms is preferable, and specific examples thereof include a cyclopentyl group, a cyclohexyl group, a cycloheptyl group and a cyclooctyl group. The polycyclic group preferably has 7 to 12 carbon atoms, and specific examples thereof include an adamantyl group, a norbornyl group, an isobornyl group, a tricyclodecanyl group and a tetracyclododecanyl group.

As $R^{OX}$, a polycyclic alkyl group of 4 to 12 carbon atoms that has an oxygen atom (=O) as a substituent is preferable. From an industrial viewpoint, a group in which two hydrogen atoms bonded to a carbon atom constituting an adamantyl group, a norbornyl group or a tetracyclododecyl group are substituted with an oxygen atom (=O) is preferable, and a norbornyl group having an oxygen atom (=O) as a substituent is particularly desirable.

$R^{OX}$ may have a substituent other than an oxygen atom. As an example of such a substituent, a lower alkyl group of 1 to 5 carbon atoms can be given.

In general formula (b1-1-20), r represents 0 or 1, and preferably 1.

In the present invention, specific examples of a preferable anion moiety for the compound (b1-1-20) include an anion represented by formula (b1-1-201) shown below and an anion represented by formula (b1-1-202) shown below.

Of these, in terms of the effects of the present invention, a camphorsulfonate ion represented by formula (b1-1-201) shown below is preferable.

[Chemical Formula 54.]

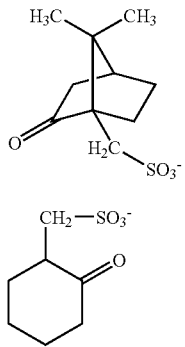

(b1-1-201)

(b1-1-202)

Examples of the aromatic hydrocarbon group as the hydrocarbon group for $R^0$ include a phenyl group, a tolyl group, a xylyl group, a mesityl group, a phenethyl group and a naphthyl group. As described above, the aromatic hydrocarbon group may or may not have a substituent.

Specific examples of aromatic hydrocarbon groups for $R^0$ include groups represented by general formula (b1-1-31) or (b1-1-32) shown below.

[Chemical Formula 55.]

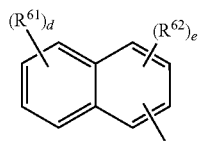

(b1-1-31)

-continued

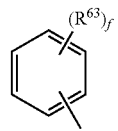

(b1-1-32)

In formula (b1-1-31), each of $R^{61}$ and $R^{62}$ independently represents an alkyl group of 1 to 5 carbon atoms or an alkoxy group of 1 to 5 carbon atoms.

Examples of the alkyl group for $R^{61}$ and $R^{62}$ include a methyl group, an ethyl group, an n-propyl group, an isopropyl group, an n-butyl group, an isobutyl group, a tert-butyl group, a pentyl group, an isopentyl group and a neopentyl group. Among these, a methyl group is particularly desirable.

Examples of the alkoxy group for $R^{61}$ and $R^{62}$ include a methoxy group, an ethoxy group, an n-propoxy group, an isopropoxy group, an n-butoxy group and a tert-butoxy group. Among these, a methoxy group or an ethoxy group is particularly desirable.

Each of d and e independently represents an integer of 0 to 4, preferably 0 to 2, and most preferably 0.

If there are two or more of the $R^{61}$ group and/or $R^{62}$ group, as indicated by the value d and/or e, then the two or more of the $R^{61}$ group and/or the $R^{62}$ group may be the same or different from each other.

In formula (b1-1-32), $R^{63}$ represents an alkyl group of 1 to 5 carbon atoms or an alkoxy group of 1 to 5 carbon atoms.

Examples of the alkyl group for $R^{63}$ include a methyl group, an ethyl group, an n-propyl group, an isopropyl group, an n-butyl group, an isobutyl group, a tert-butyl group, a pentyl group, an isopentyl group and a neopentyl group. Among these, a methyl group is particularly desirable.

Examples of the alkoxy group for $R^{63}$ include a methoxy group, an ethoxy group, an n-propoxy group, an isopropoxy group, an n-butoxy group and a tert-butoxy group. Among these, a methoxy group or an ethoxy group is particularly desirable.

f represents an integer of 0 to 3, preferably 1 or 2, and most preferably 1.

If there are two or more of the $R^{63}$ group, as indicated by the value f, the two or more of the $R^{63}$ group may be the same or different from each other.

In general formula (b1-1), as the organic cation for $Z^+$, there is no particular limitation, and any of those conventionally known as cation moiety for an onium salt-based acid generator can be appropriately selected for use. As the cation moiety, a sulfonium ion or an iodonium ion is preferable, and a sulfonium ion is particularly desirable.

Specific examples of the organic cation for $Z^+$ include cations represented by general formula (I-1) or (I-2) shown below.

[Chemical Formula 56.]

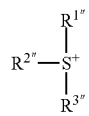

(I-1)

(I-2)

In formula (I-1), each of $R^{1\prime\prime}$ to $R^{3\prime\prime}$ independently represents an aryl group which may have a substituent or an alkyl group which may have a substituent, with the provision that at least one of R" to $R^{3\prime\prime}$ represents an aryl group, and two of R" to $R^{3\prime\prime}$ in formula (I-1) may be bonded to each other to form a ring with the sulfur atom. In formula (I-2), $R^{5\prime\prime}$ and $R^{6\prime\prime}$ each independently represent an aryl group which may have a substituent or an alkyl group which may have a substituent, with the provision that and at least one of $R^{5\prime\prime}$ and $R^{6\prime\prime}$ represents an aryl group.

In formula (I-1), each of R" to $R^{3\prime\prime}$ independently represents an aryl group or an alkyl group. In formula (I-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. Examples thereof include an unsubstituted aryl group having 6 to 20 carbon atoms, a substituted aryl group in which part or all of the hydrogen atoms of the aforementioned unsubstituted aryl group has been substituted with alkyl groups, alkoxy groups, alkoxyalkyloxy groups, alkoxycarbonylalkyloxy groups, halogen atoms or hydroxyl groups, and a group represented by the formula —$(R^{4\prime})$—C(=O)—$R^{5\prime}$. $R^{4\prime}$ represents an alkylene group of 1 to 5 carbon atoms. $R^{5\prime}$ represents an aryl group. As the aryl group for $R^{5\prime}$, the same aryl groups as those described above for $R^{1\prime\prime}$ to $R^{3\prime\prime}$ can be used.

The unsubstituted aryl group is preferably an aryl group having 6 to 10 carbon atoms because it can be synthesized at a low cost. Specific examples thereof include a phenyl group and a naphthyl group.

The alkyl group as the substituent for the substituted aryl group is preferably an alkyl group having 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

Examples of the alkoxyalkyloxy group as the substituent for the substituted aryl group include a group represented by a general formula —O—C($R^{47}$)($R^{48}$)—O—$R^{49}$ (in the formula, each of $R^{47}$ and $R^{48}$ independently represent a hydrogen atom or a linear or branched alkyl group; and $R^{49}$ represents an alkyl group).

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

An example of the alkoxycarbonylalkyloxy group as the substituent for the substituted aryl group includes a group represented by a general formula —O—$R^{50}$—C(=O)—O—$R^{56}$ (in the formula, $R^{50}$ represents a linear or branched alkylene group; and $R^{56}$ represents a tertiary alkyl group.)

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

Examples of the tertiary alkyl group for $R^{56}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

The aryl group for each of $R^{1\prime\prime}$ to $R^{3\prime\prime}$ is preferably a phenyl group or a naphthyl group.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

When two of $R^{1\prime\prime}$ to $R^{3\prime\prime}$ are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom.

When two of $R^{1\prime\prime}$ to $R^{3\prime\prime}$ are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be given.

Specific examples of cation moiety represented by general formula (I-1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl) diphenylsulfonium, (4-(tert-butoxycarbonylmethyloxy) phenyl)diphenylsulfonium, (4-(tert-butoxycarbonylmethyloxy)-3,5- dimethylphenyl) diphenylsulfonium, (4-(2-methyl-2- adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

In formula (I-2), each of $R^{5'''}$ and $R^{6'''}$ independently represents an aryl group or alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same as the aryl groups for $R^{1'''}$ to $R^{3'''}$ can be used.

As the alkyl group for $R^{5'''}$ and $R^{6'''}$, the same as the alkyl groups for $R^{1'''}$ to $R^{3'''}$ can be used.

It is particularly desirable that both of $R^{5'''}$ and $R^{6'''}$ represents a phenyl group.

Specific examples of cation moiety represented by general formula (I-2) include diphenyliodonium and bis(4-tert-butylphenyl)iodonium.

Further, as a preferable example of the organic cation for $Z^+$, a cation represented by general formula (I-5) or (I-6) shown below can also be given.

[Chemical Formula 57.]

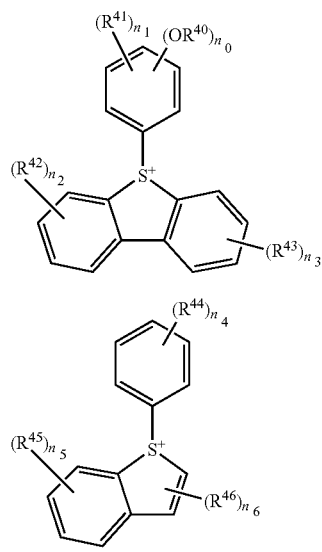

(I-5)

(I-6)

In the formulas, $R^{40}$ represents a hydrogen atom or an alkyl group; $R^{41}$ represents an alkyl group, an acetyl group, a carboxy group or a hydroxyalkyl group; each of $R^{42}$ to $R^{46}$ independently represents an alkyl group, an acetyl group, an alkoxy group, a carboxy group, or a hydroxyalkyl group; each of $n_0$ to $n_5$ independently represents an integer of 0 to 3, with the provision that $n_0+n_1$ is 5 or less; and $n_6$ represents an integer of 0 to 2.

In general formulas (I-5) and (I-6), with respect to $R^{40}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of the $OR^{40}$ group, as indicated by the value of $n_0$, then the two or more of the $OR^{40}$ group may be the same or different from each other.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_0$ is preferably 0 or 1.

$n_1$ is preferably 0 to 2.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1.

As $Z^+$, a cation moiety represented by general formula (I-1) or (I-5) is preferable, and a cation moiety represented by any one of formulas (I-1-1) to (I-1-12) and (I-5-1) to (I-5-4) shown below is particularly desirable. Among these, a cation moiety having a triphenyl skeleton, such as a cation moiety represented by any one of formulas (I-1-1) to (I-1-10) shown below is particularly desirable.

In general formulas (I-1-11) and (I-1-12), each of $R^9$ and $R^{19}$ independently represents a phenyl group or a naphthyl group.

u is an integer of 1 to 3, and most preferably 1 or 2.

[Chemical Formula 58.]

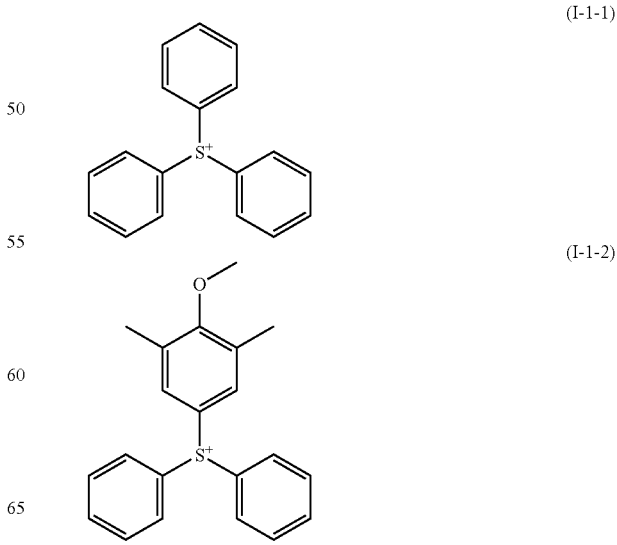

(I-1-1)

(I-1-2)

-continued
(I-1-3)
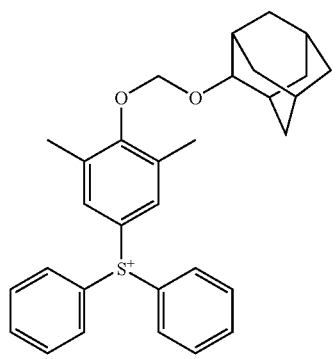
(I-1-4)
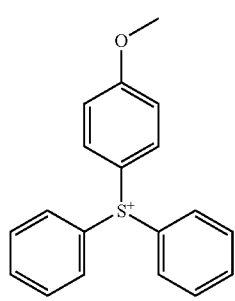
(I-1-5)
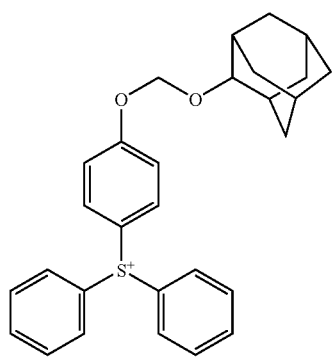
(I-1-6)
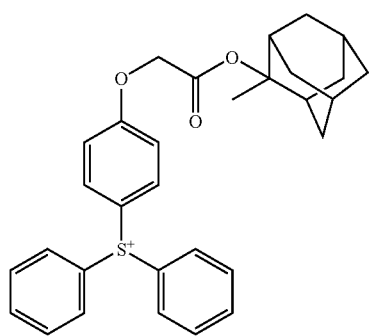
[Chemical Formula 59.]
(I-1-7)
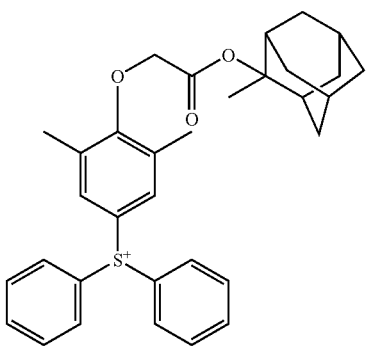
(I-1-8)
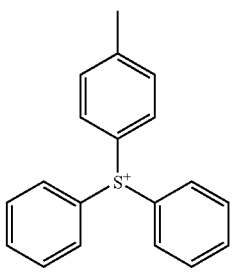
(I-1-9)
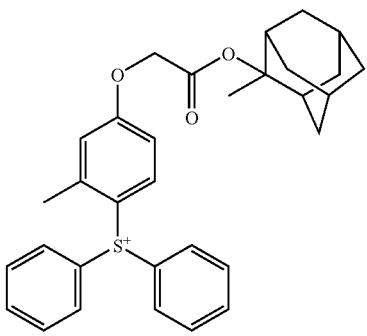
(I-1-10)
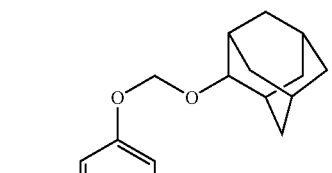
[Chemical Formula 60.]
(I-1-11)
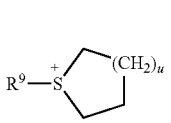

(I-1-12)
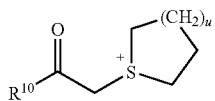
[Chemical Formula 61.]
(I-5-1)
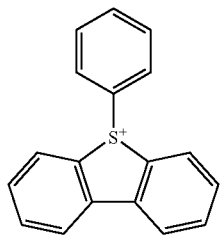
(I-5-2)
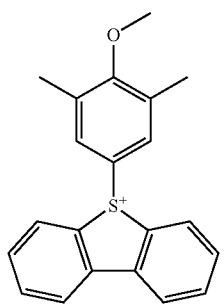
(I-5-3)
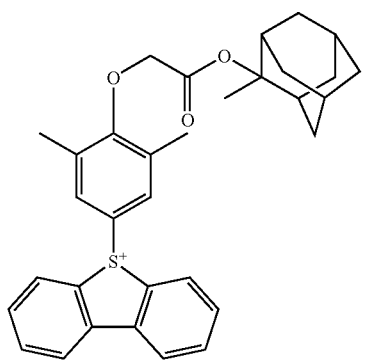
(I-5-4)
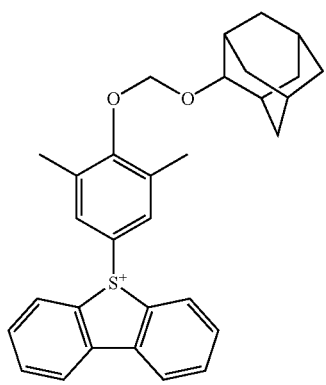
Among the aforementioned examples, as the component (B1), a compound represented by general formula (b1-11) shown below is preferable.
[Chemical Formula 62.]
(b1-11)
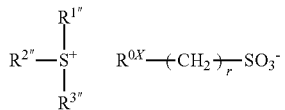
In the formula, $R^{1''}$ to $R^{3''}$, $R^{OX}$ and r are the same as defined above.
Specific examples of preferable compounds as the component (B1) are shown below.
[Chemical Formula 63.]
(b1-11-1)
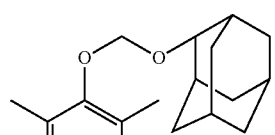 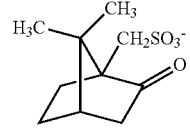
(b1-11-2)
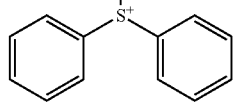 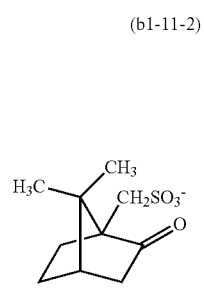
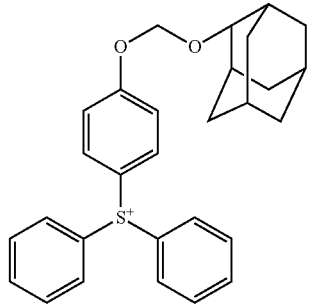
(b1-11-3)
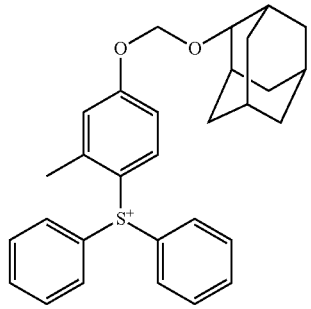 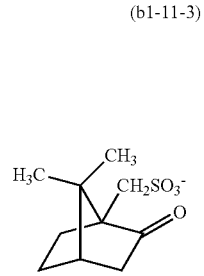

-continued
(b1-11-4)
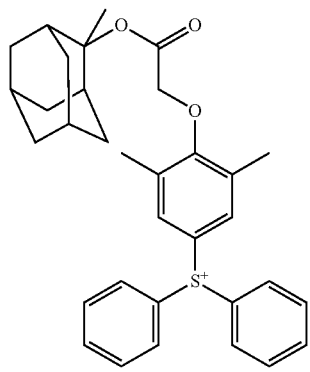 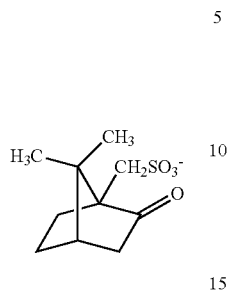
(b1-11-5)
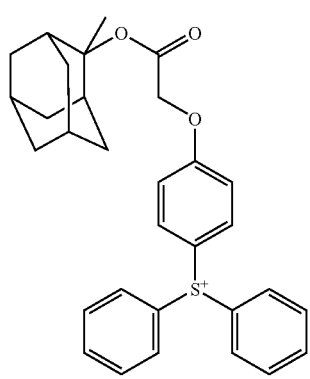 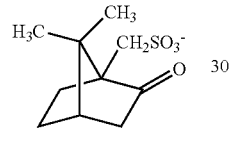
(b1-11-6)
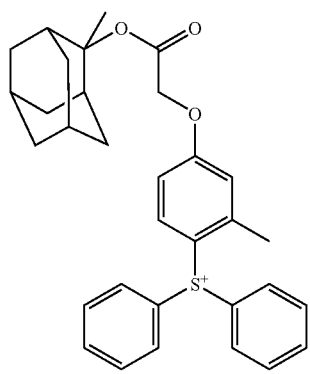 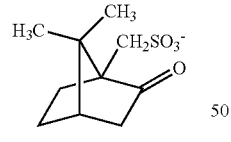
(b1-11-7)
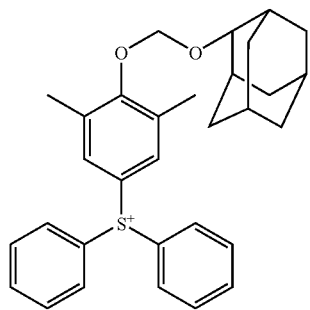 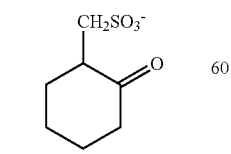
-continued
(b1-11-8)
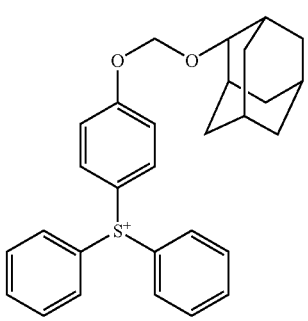 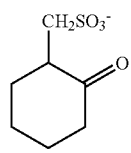
(b1-11-9)
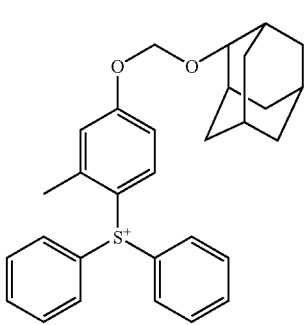 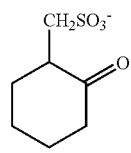
(b1-11-10)
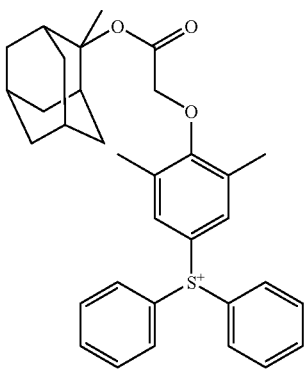 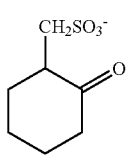
(b1-11-11)
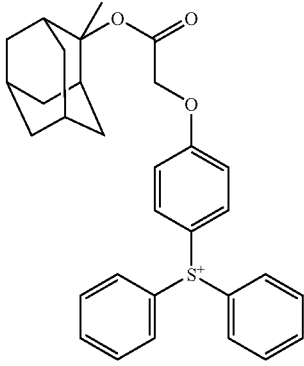 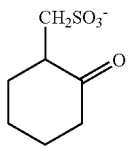

-continued (b1-11-12)

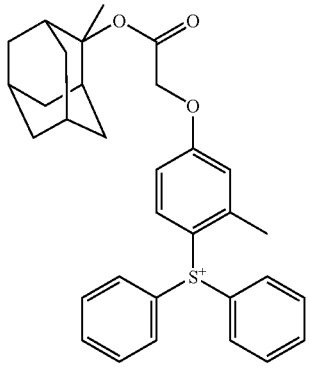 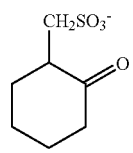

As the component (B1), one type of acid generator may be used alone, or two or more types may be used in combination.

In the positive resist composition of the present invention, the amount of the component (B1) relative to 100 parts by weight of the component (A) is preferably 0.1 to 40 parts by weight, more preferably 0.5 to 20 parts by weight, and still more preferably 1 to 15 parts by weight. When the amount of the component (B1) is at least as large as the lower limit of the above-mentioned range, the effects of the present invention can be improved. On the other hand, when the amount of the component (B1) is no more than the upper limit of the above-mentioned range, the lithography properties are improved.

In the component (B), the amount of the component (B1) based on the total weight of the component (B) is preferably 3% by weight or more, more preferably 5 to 50% by weight, and still more preferably 7 to 35% by weight. When the amount of the component (B1) is at least as large as the lower limit of the above-mentioned range, the effects of the present invention can be improved.

[Component (B2)]

In the positive resist composition of the present invention, if desired, the component (B) may further contain an acid generator other than the component (B1) (hereafter, referred to as "component (B2)").

The component (B2) is not particularly limited as long as it is an acid generator that does not fall under the category of the component (B1). Examples of such an acid generator are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt-based acid generator which does not fall under the category of the component (B1), a compound represented by general formula (b-1) or (b-2) shown below can be used.

[Chemical Formula 64.]

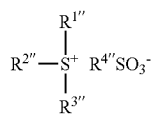

(b-1)

-continued

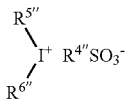

(b-2)

In formula (b-1), each of $R^{1\prime\prime\prime}$ to $R^{3\prime\prime\prime}$ independently represents an aryl group which may have a substituent or an alkyl group which may have a substituent, with the provision that at least one of $R^{1\prime\prime\prime}$ to $R^{3\prime\prime\prime}$ represents an aryl group, and two of $R^{1\prime\prime\prime}$ to $R^{3\prime\prime\prime}$ in formula (b-1) may be bonded to each other to form a ring with the sulfur atom. In formula (b-2), $R^{5\prime\prime\prime}$ and $R^{6\prime\prime\prime}$ each independently represent an aryl group which may have a substituent or an alkyl group which may have a substituent, with the provision that and at least one of $R^{5\prime\prime\prime}$ and $R^{6\prime\prime\prime}$ represents an aryl group. $R^{4\prime\prime\prime}$ represents a halogenated alkyl group, an aryl group or an alkenyl group which may have a substituent.

In general formula (b-1), $R^{1\prime\prime\prime}$ to $R^{3\prime\prime\prime}$ are respectively the same as defined for $R^{1\prime\prime}$ to $R^{3\prime\prime}$ in general formula (I-1).

In general formula (b-2), $R^{5\prime\prime\prime}$ and $R^{6\prime\prime\prime}$ are respectively the same as defined for $R^{5\prime\prime}$ and $R^{6\prime\prime}$ in general formula (I-2).

$R^{4\prime\prime\prime}$ represents a halogenated alkyl group, an aryl group or an alkenyl group which may have a substituent.

As an example of the halogenated alkyl group for $R^{4\prime\prime\prime}$, a group in which part of or all of the hydrogen atoms of a linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

When the alkyl group within the halogenated alkyl group is a linear or branched alkyl group, it preferably has 1 to 10 carbon atoms, more preferably 1 to 8 carbon atoms, and most preferably 1 to 4 carbon atoms. On the other hand, when the alkyl group within the halogenated alkyl group is a cyclic alkyl group, it preferably has 4 to 15 carbon atoms, more preferably 4 to 10 carbon atoms, and most preferably 6 to 10 carbon atoms.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratios are preferable, as they result in increased acid strength.

The aryl group for $R^{4\prime\prime\prime}$ is preferably an aryl group of 6 to 20 carbon atoms.

The alkenyl group for $R^{4\prime\prime\prime}$ is preferably an alkenyl group of 2 to 10 carbon atoms.

With respect to $R^{4\prime\prime\prime}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4\prime\prime\prime}$ may have one substituent, or two or more substituents.

Examples of the substituent include a halogen atom, a hetero atom, an alkyl group, and a group represented by the formula $X-Q^2-$ (in the formula, $Q^2$ represents a divalent linking group containing an oxygen atom; and X represents a hydrocarbon group of 3 to 30 carbon atoms which may have a substituent).

Examples of halogen atoms and alkyl groups as substituents for $R^{4\prime\prime\prime}$ include the same halogen atoms and alkyl groups as those described above with respect to the halogenated alkyl group for $R^{4\prime\prime\prime}$.

Examples of hetero atoms include an oxygen atom, a nitrogen atom, and a sulfur atom.

In the group represented by formula X-$Q^2$-, $Q^2$ represents a divalent linking group containing an oxygen atom.

$Q^2$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate group (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

As $Q^2$, a divalent linking group containing an ester bond or an ether bond is preferable, and —$R^{91}$—O—, —$R^{92}$—O—C(=O)— or —C(=O)—O—$R^{93}$—O—C(=O)— is more preferable.

In the group represented by the formula X-$Q^2$-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for X, there is no particular limitation as long as it is an atom other than a carbon atom and a hydrogen atom. Examples of hetero atoms include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 65.]

(L1)

(L2)

(L3)

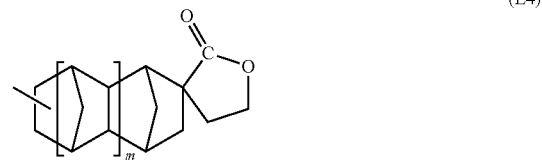
(L4)

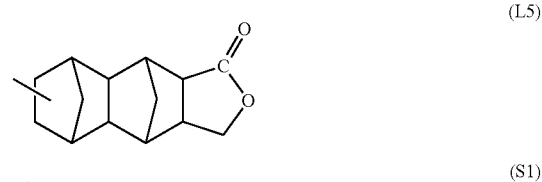
(L5)

(S1)

(S2)

(S3)

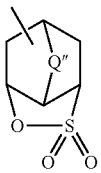
(S4)

In the formula, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents 0 or 1.

As the alkylene group for Q", R$^{94}$ and R$^{95}$, the same alkylene groups as those described above for R$^{91}$ to R$^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

Among the examples described above, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

Further, in the present invention, X preferably has a structure similar to that of the R$^{3}$ group within the structural unit (a0) for the component (A1), and a group having a polar portion is particularly desirable, because it results in improved lithographic properties and resist pattern shape.

Specific examples of X having a polar moiety include those in which a part of the carbon atoms constituting the aliphatic hydrocarbon group for X is substituted with a substituent group containing a hetero atom such as —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—.

In the present invention, R$^{4\prime\prime\prime}$ preferably has X-Q$^2$- as a substituent. In this case, R$^{4\prime\prime\prime}$ is preferably a group represented by formula X-Q$^2$-Y$^3$— [wherein Q$^2$ and X are the same as defined above; and Y$^3$ represents an alkylene group of 1 to 4 carbon atoms which may have a substituent, or a fluorinated alkylene group of 1 to 4 carbon atoms which may have a substituent].

In the group represented by the formula X-Q$^2$-Y$^3$—, as the alkylene group for Y$^3$, the same alkylene group as those described above for Q$^2$ in which the number of carbon atoms is 1 to 4 can be used.

As the fluorinated alkylene group for Y$^3$, the aforementioned alkylene group in which part or all of the hydrogen atoms has been substituted with fluorine atoms can be used.

Specific examples of Y$^3$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^3$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), R$^{5\prime\prime\prime}$ and R$^{6\prime\prime\prime}$ each independently represent an aryl group or alkyl group. At least one of R$^{5\prime\prime\prime}$ and R$^{6\prime\prime\prime}$ represents an aryl group. It is preferable that both of R$^{5\prime\prime\prime}$ and R$^{6\prime\prime\prime}$ represent an aryl group.

As the aryl group for R$^{5\prime\prime\prime}$ and R$^{6\prime\prime\prime}$, the same as the aryl groups for R$^{1\prime\prime\prime}$ to R$^{3\prime\prime\prime}$ can be used.

As the alkyl group for R$^{5\prime\prime\prime}$ and R$^{6\prime\prime\prime}$, the same as the alkyl groups for R$^{1\prime\prime\prime}$ to R$^{3\prime\prime\prime}$ can be used.

It is particularly desirable that both of R$^{5\prime\prime\prime}$ and R$^{6\prime\prime\prime}$ represents a phenyl group.

As R$^{4\prime\prime\prime}$ in formula (b-2), the same groups as those mentioned above for R$^{4\prime\prime\prime}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

Furthermore, onium salts in which the anion moiety of these onium salts is replaced by an anion moiety represented by any one of formulas (b1) to (b8) shown below can also be used.

[Chemical Formula 66.]

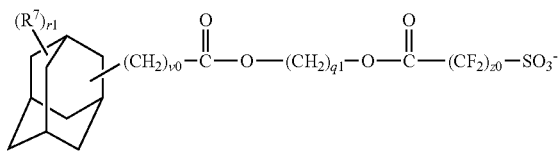
(b1)

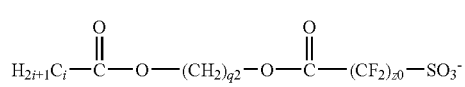
(b2)

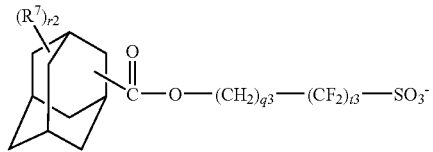
(b3)

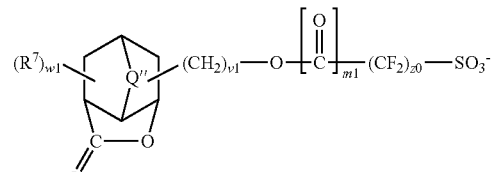
(b4)

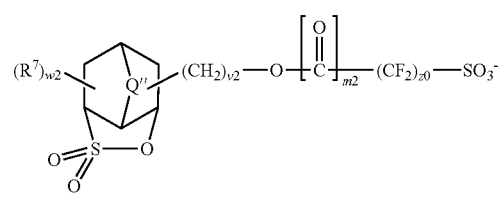
(b5)

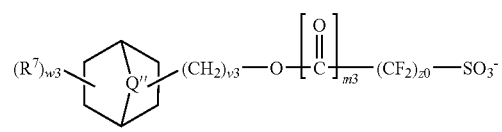
(b6)

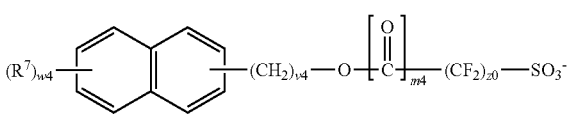
(b7)

(b8)

In the formulas, z0 represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; i represents an integer of 1 to 20; $R^7$ represents a substituent; each of m1 to m5 independently represents 0 or 1; each of v0 to v5 independently represents an integer of 0 to 3; each of w1 to w5 independently represents an integer of 0 to 3; and Q" is the same as defined above.

As the substituent for $R^7$, the same groups as those which the aforementioned aliphatic hydrocarbon group or aromatic hydrocarbon group for X may have as a substituent can be used.

If there are two or more of the $R^7$ group, as indicated by the values r1, r2, and w1 to w5, then the two or more of the $R^7$ groups may be the same or different from each other.

Among the aforementioned examples, in terms of significantly improving the effects of the present invention, the onium salt-based acid generator represented by formula (b-1) or (b-2) preferably has an anion moiety in which a fluorine atom is bonded to a carbon atom adjacent to the sulfur atom of the —$SO_3^-$ group, more preferably an anion moiety in which $R^{4"}$ represents a halogenated alkyl group which may have a substituent, and most preferably an anion moiety represented by any one of formulas (b1) to (b8).

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may also be used.

[Chemical Formula 67.]

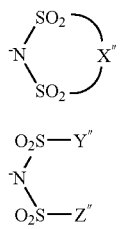

(b-3)

(b-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, onium salts having a cation moiety represented by general formula (I-5) or (I-6) above, and having a fluorinated alkylsulfonate ion (e.g., the anion moiety ($R^{4''}SO_3^-$) in general formula (b-1) or (b-2) above) or an anion moiety represented by general formula (b-3) or (b-4) above as the anion moiety, can be used.

In the present description, an oximesulfonate acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 68.]

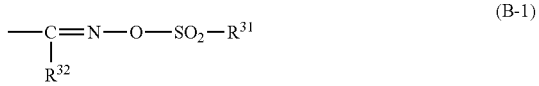

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 69.]

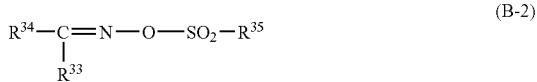

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 70.]

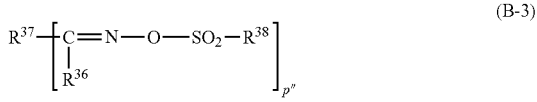

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 71.]

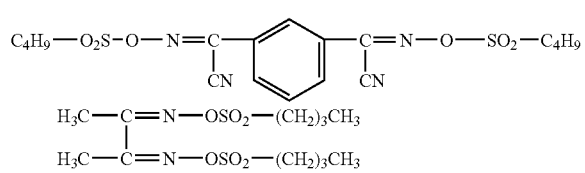

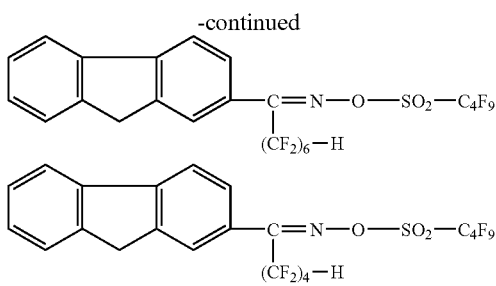

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl) decane, 1,2-bis(cyclohexylsulfonyldiazo methylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B2), one type of acid generator may be used, or two or more types may be used in combination.

In the positive resist composition of the present invention, the total amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Component (D)>

In the positive resist composition of the present invention, a nitrogen-containing organic compound (D) (hereafter referred to as the component (D)) may be added as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia (NH$_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

As the component (D), one type of compound may be used alone, or two or more types may be used in combination.

In the present invention, as the component (D), it is preferable to use a trialkylamine of 5 to 10 carbon atoms.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

<Optional Components>

[Component (E)]

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, methyl-n-pentyl ketone, methyl isopentyl ketone, 2-heptanone, a ketone having a 5-membered ring (e.g., cyclopentanone, 2-methyl-2-cyclopenten-1-one, 2-methylcyclopentanone, 3-methylcyclopentanone, 2-ethylcyclopentanone, 3-ethylcyclopentanone, 2,2-dimethylcyclopentanone or 2,4,4-trimethylcyclopentanone), a ketone having a 6-membered ring (e.g., cyclohexanone, 2-cyclohexen-1-one, 2-methylcyclohexanone, 3-methylcyclohexanone, 4-methylcyclohexanone, 4-ethylcyclohexanone, 2,6-dimethylcyclohexanone or 2,2-dimethylcyclohexanone) and a ketone having a 7-membered ring (e.g., cycloheptanone, 2-cycloheptan-1-one and a polycyclic ketone having a norbornane skeleton or a norbornene skeleton, such as (1S,4R)-bicyclo[2.2.1]heptan-2-one); polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among the aforementioned examples, PGMEA, PGME, EL and cyclohexanone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

In addition, when a cyclic ketone such as cyclohexanone is used, the amount of the cyclic ketone within the component (S) is not particularly limited, and can be appropriately selected depending on the type of the cyclic ketone. However, in terms of achieving excellent lithography properties, the amount of the cyclic ketone is preferably 1 to 80% by weight, more preferably 5 to 60% by weight, and still more preferably 10 to 50% by weight.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 0.5 to 20% by weight, and preferably from 1 to 15% by weight.

Dissolving of the resist materials in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh, or a membrane filter or the like.

The positive resist composition of the present invention is advantageous in that a resist pattern having an excellent shape can be formed. The reasons why these effects can be achieved has not been elucidated yet, but are presumed as follows.

The positive resist composition of the present invention includes a polymeric compound (A1) having an acid dissociable, dissolution inhibiting group in the structure thereof and including a structural unit (a0) represented by general formula (a0-1), and an acid generator (B1) containing a compound represented by general formula (b1-1).

The structural unit (a0) has a bulky structure in which a "cyclic group containing —$SO_2$—" is bonded to the terminal of the side chain. Therefore, a resist film formed using the positive resist composition of the present invention exhibits a high glass transition temperature (Tg) as compared to the case of using no component (A1). When the Tg becomes high, the acid generated from the acid-generator component (B) upon exposure can be appropriately suppressed from diffusing within the resist film, and the acid can be suppressed from diffusing into unexposed portions.

Further, since the component (B1) has no fluorine atom bonded to a carbon atom adjacent to the sulfur atom of the —$SO_3^-$ group, the component (B1) generates a sulfonic acid exhibiting a weaker acid strength than, for example, a sulfonic acid generated from the component (B2).

In the exposure during the formation of a resist pattern, it is presumed that the amount of acid generated from the component (B) becomes larger as the light intensity becomes larger.

It is presumed that the light intensity becomes the largest along the central line of a space between lines in the case of a line and space pattern (hereafter, referred to as "LS pattern"), and at the central portion of a hole in the case of a hole resist pattern. When the generated acid is not suppressed from diffusing at the central portion, the acid is likely to be diffused to unexposed portions, so that unexposed portions near the central portion becomes susceptible to being dissolved by alkali developing. As a result, a resist pattern in which the central portion of the resist pattern (unexposed portion) has an hourglass shape is likely to be formed.

In the present invention, since an acid having a weak acid strength is generated from the component (B1) upon exposure, the acid dissociable, dissolution inhibiting group within the component (A) is less susceptible to being dissociated, as compared to the case where an acid having a strong acid strength is generated. Further, when the component (B1) is used in combination with the component (B2), a salt exchange occurs between the acid generated from the component (B1) and the acid generated from the component (B2). As a result, diffusion of the acid generated from the component (B2) is effectively suppressed by the component (B1) (i.e., a quenching effect can be expected by the salt exchange). By virtue of the features described above, it is presumed that, even when the light intensity and the amount of acid generated are the largest near the aforementioned central portion, the amount of strong acid present in the entire space portions or holes is made uniform, and hence, the acid dissociation reaction of the component (A) proceeds uniformly.

For the reasons as described above, by a positive resist composition in which the component (A1) and the component (B1) are used in combination, diffusion of the acid generated at exposed portions to the unexposed portions can be reliably suppressed, and the acid dissociation reaction is made uniform at the entire exposed portions. As a result, it is presumed that a resist pattern having a high rectangularity can be formed.

Moreover, by using the resist composition of the present invention, a hole pattern having high circularity can be formed. Also, a hole pattern having no white band of unevenness around the periphery of the holes can be formed. In addition, the uniformity (CDU) of the hole diameter (CD) is improved, and as a result, a resist pattern having an excellent shape and high circularity can be formed even with a narrow pitch.

<<Method of Forming a Resist Pattern>>

The method of forming a resist pattern according to a second aspect of the present invention includes: applying a positive resist composition of the present invention to a substrate to form a resist film on the substrate; conducting exposure of the resist film; and alkali-developing the resist film to form a resist pattern.

More specifically, the method for forming a resist pattern according to the present invention can be performed, for example, as follows.

More specifically, the method for forming a resist pattern according to the present invention can be performed, for example, as follows. Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed with an ArF exposure apparatus, an electron beam exposure apparatus, an EUV exposure apparatus or the like through a mask pattern or directly irradiated with electron beam without a mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

The method of forming a resist pattern according to the present invention is also applicable to a double exposure method or a double patterning method.

EXAMPLES

As follows is a description of examples of the present invention, although the scope of the present invention is by no way limited by these examples.

In the following examples, a unit represented by a chemical formula (1) is designated as "compound (1)", and the same applies for compounds represented by other formulas.

<Base Component (A)>

The polymeric compounds used as the base component (A) in the present examples were synthesized in accordance with the following polymer synthesis examples using the compounds (1) to (9) represented by the chemical formulas shown below.

The compound (1) used in the polymer synthesis examples was synthesized in accordance with the monomer synthesis example described below.

[Chemical Formula 72.]

Compound (1)

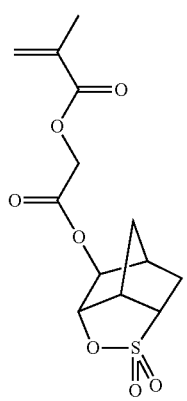

Compound (2)

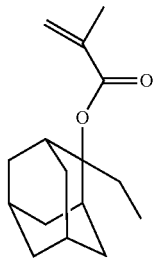

Compound (3)

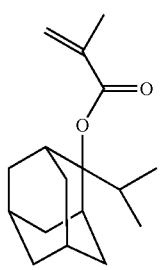

Compound (4)

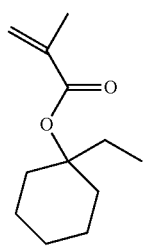

Compound (5)

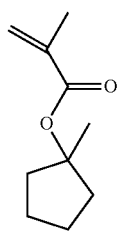

Compound (6)

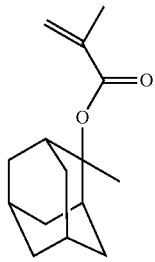

Compound (7)

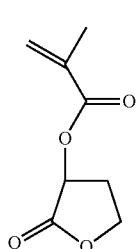

Compound (8)

Compound (9)

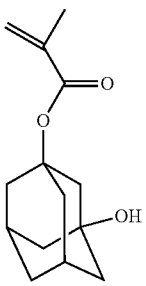

Monomer Synthesis Example 1

Synthesis of Compound (1)

300 ml of a THF solution containing 20 g (105.14 mmol) of an alcohol (1), 30.23 g (157.71 mmol) of ethyldiisopropylaminocarbodiimide (EDCI) hydrochloride and 0.6 g (5 mmol) of dimethylaminopyridine (DMAP) was added to a 500 ml three-necked flask in a nitrogen atmosphere, and 16.67 g (115.66 mmol) of a precursor (1) was added thereto while cooling with ice (0° C.), followed by stirring at room temperature for 12 hours.

After conducting thin-layer chromatography (TLC) to confirm that the raw materials had been consumed, 50 ml of water was added to stop the reaction. Then, the reaction solvent was concentrated under reduced pressure, and extraction was conducted with ethyl acetate three times. The obtained organic phase was washed with water, saturated sodium hydrogencarbonate and 1N—HClaq in this order. Thereafter, the solvent was distilled off under reduced pressure, and the resulting product was dried, thereby obtaining the compound (1).

[Chemical Formula 73.]

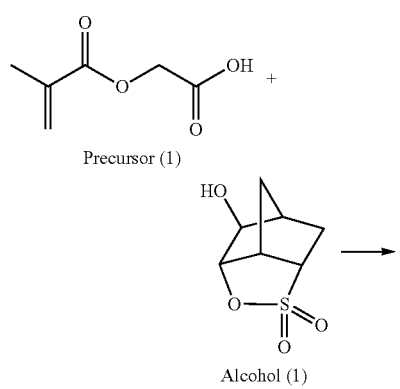

Compound (1)

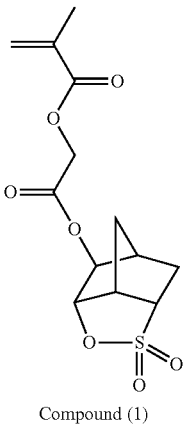

The results of instrumental analysis of the obtained compound (1) were as follows.

$^1$H-NMR (CDCl$_3$, 400 MHz): δ(ppm)=6.22 (s, 1H, H$^a$), 5.70 (s, 1H, H$^b$), 4.71-4.85 (m, 2H, H$^k$), 4.67 (s, 2H, H$^k$), 3.40-3.60 (m, 2H, H$^{e,f}$), 2.58-2.70 (m, 1H, H$^g$), 2.11-2.21 (m, 2H, H$^h$), 2.00 (s, 3H, H$^i$), 1.76-2.09 (m, 2H, H$^j$)

From the results shown above, it was confirmed that the compound (1) had a structure shown below.

[Chemical Formula 74.]

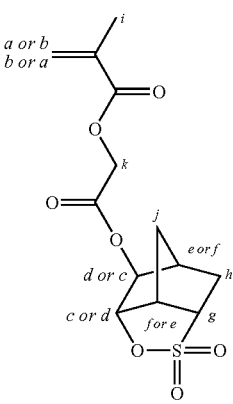

Polymer Synthesis Example 1

Synthesis of Polymeric Compound (1)

In a three-necked flask equipped with a thermometer and a reflux tube, 11.77 g (69.23 mmol) of a compound (7), 15.00 g (47.47 mmol) of a compound (1), 16.58 g (63.29 mmol) of a compound (3), 4.65 g (27.69 mmol) of a compound (5) and 3.27 g (13.85 mmol) of a compound (9) were dissolved in 76.91 g of methyl ethyl ketone (MEK) to obtain a solution. Then, 22.1 mmol of dimethyl 2,2'-azobis(isobutyrate) (product name: V-601, manufactured by Wako Pure Chemical Industries, Ltd.) was added and dissolved in the obtained solution. The resultant was dropwise added to 42.72 g of MEK heated to 78° C. in a nitrogen atmosphere over 3 hours. Thereafter, the reaction solution was heated for 4 hour while stirring, and then cooled to room temperature. The obtained reaction polymer solution was dropwise added to an excess amount of n-heptane, and an operation to deposit a polymer was conducted. Thereafter, the precipitated white powder was separated by filtration, followed by washing with a n-heptane/isopropylalcohol mixed solvent and drying, thereby obtaining 41 g of a polymeric compound (1) as an objective compound.

With respect to the polymeric compound (1), the weight average molecular weight (Mw) and the dispersity (Mw/Mn) were determined by the polystyrene equivalent value as measured by gel permeation chromatography (GPC). As a result, it was found that the weight average molecular weight was 7,900, and the dispersity was 1.78. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was a21/a0/a12/a14/a3=35/27/18/13/7.

[Chemical Formula 75.]

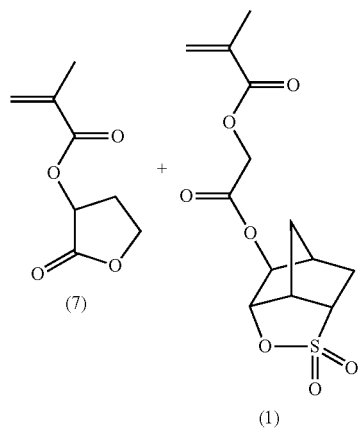

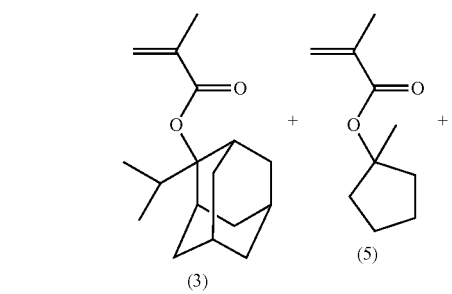

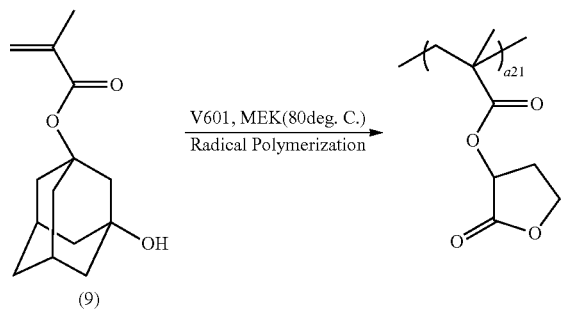

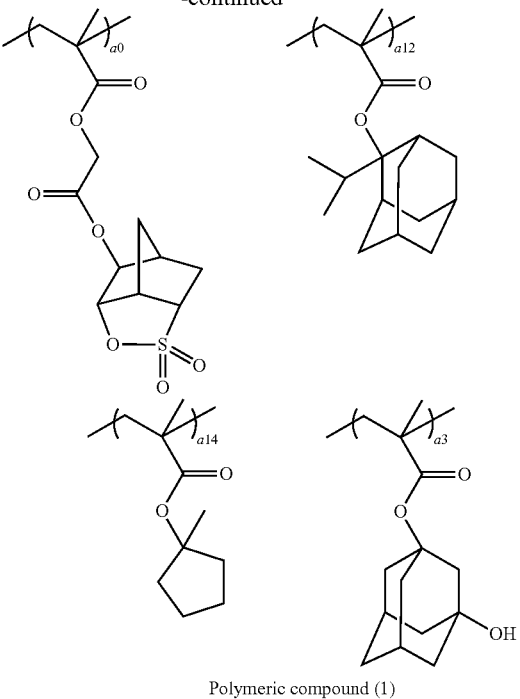

Polymeric compound (1)

Polymer Synthesis Examples 2 to 8

Synthesis of Polymeric Compounds (2) to (8)

Other polymeric compounds (2) to (8) were synthesized in substantially the same manner as in Polymer Synthesis Example 1, except that monomers for deriving the structural units of the respective polymeric compounds were used in a predetermined molar ratio.

The structural formulas of the obtained polymeric compounds (2) to (8), the weight average molecular weight (Mw) and the molecular weight dispersity (Mw/Mn) as determined by the polystyrene equivalent value as measured by gel permeation chromatography (GPC) and the compositional ratios of the copolymers as measured by carbon 13 nuclear magnetic resonance spectroscopy (600 MHz, $^{13}$C-NMR) are shown below.

[Chemical Formula 76.]

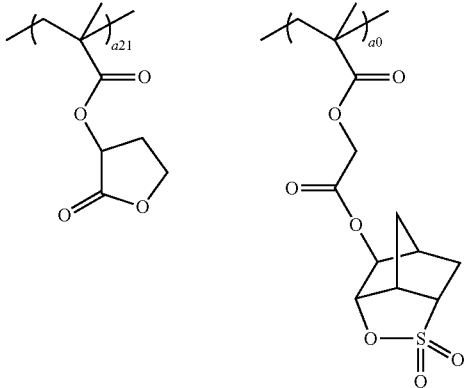

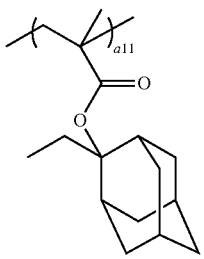
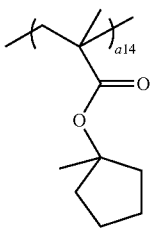
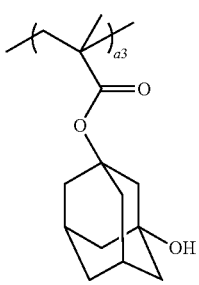
Polymeric compound (2)
[Mw 7000, Mw/Mn 1.8; a21/a0/a11/a14/a3=35/25/19/12.5/7.5]
[Chemical Formula 77.]
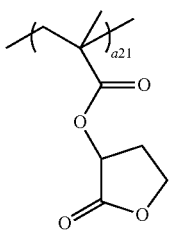
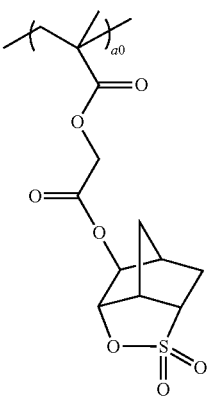
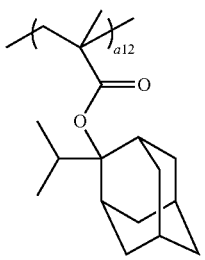
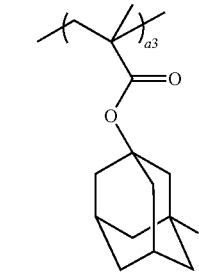
Polymeric compounds (3) and (4)
Polymeric Compound (3)
[Mw 7000, Mw/Mn 1.8; a21/a0/a12/a14/a3=36/21/18/13/12]
Polymeric Compound (4)
[Mw 7900, Mw/Mn 1.78; a21/a0/a12/a14/a3=35/21/24/13/7]
[Chemical Formula 78.]
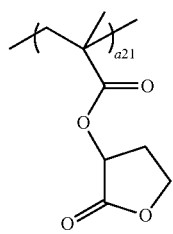
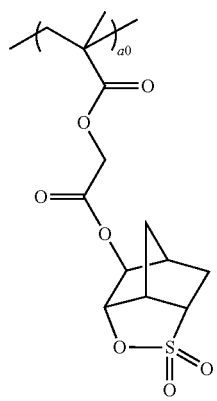
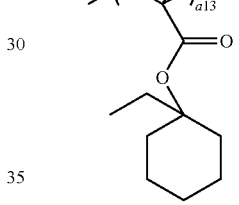
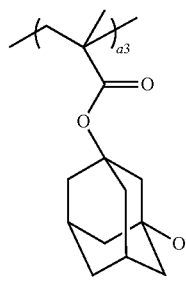
Polymeric compound (5)
[Mw 8000, Mw/Mn 1.8; a21/a0/a13/a11/a3=30/25/25/10/10]
[Chemical Formula 79.]
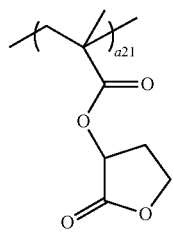
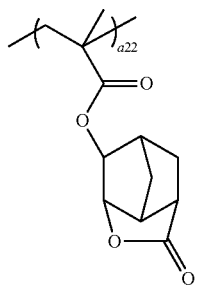

-continued

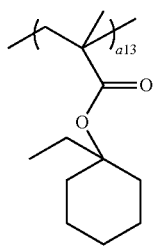
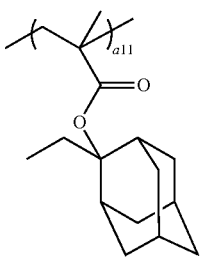

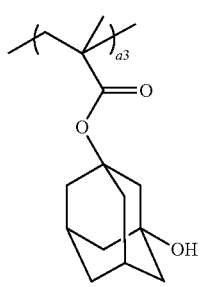

Polymeric compound (6)

[Mw 8000, Mw/Mn 1.8; a21/a22/a13/a11/a3=30/25/25/10/10]

[Chemical Formula 80.]

Polymeric compound (7)

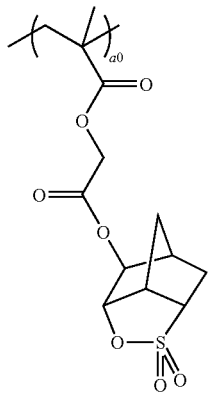
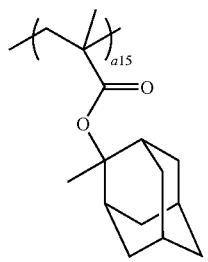

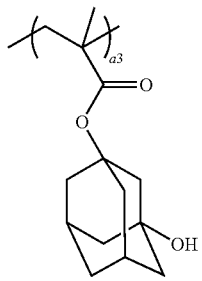

[Mw 8000, Mw/Mn 1.8; a0/a15/a3=50/30/20]

[Chemical Formula 81.]

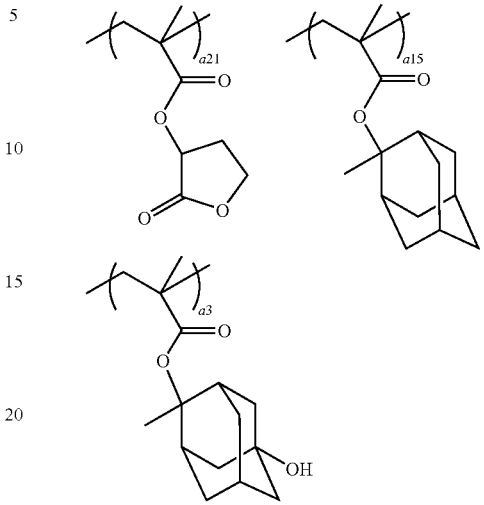

Polymeric compound (8)

[Mw 8000, Mw/Mn 1.8; a21/a15/a3=50/30/20]

<Synthesis of Acid-Generator Component (B)>

The acid generators used as the acid-generator component (B) in the present examples were synthesized in accordance with the following acid-generator synthesis examples.

[Acid-Generator Synthesis Example 1: Synthesis of Acid Generator (1)]

(i) Synthesis of Compound (IV)

150 g of methyl fluorosulfonyl(difluoro)acetate and 375 g of pure water were maintained at 10° C. or lower in an ice bath, and 343.6 g of a 30% by weight aqueous solution of sodium hydroxide was dropwise added thereto. Then, the resultant was refluxed at 100° C. for 3 hours, followed by cooling and neutralizing with a concentrated hydrochloric acid. The resulting solution was dropwise added to 8,888 g of acetone, and the precipitate was collected by filtration and dried, thereby obtaining 184.5 g of a compound (I) in the form of a white solid (purity: 88.9%, yield: 95.5%).

[Chemical Formula 82.]

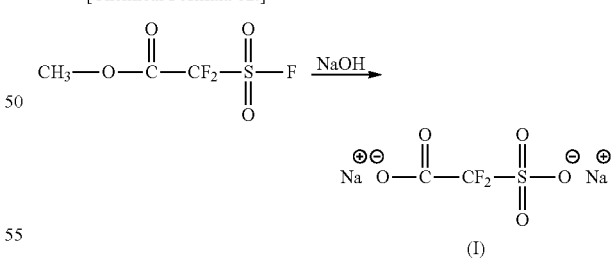

Subsequently, 56.2 g of the compound (I) and 562.2 g of acetonitrile were prepared, and 77.4 g of p-toluenesulfonic acid monohydrate was added thereto. The resultant was refluxed at 110° C. for 3 hours. Then, the reaction mixture was filtered, and the filtrate was concentrated and dried to obtain a solid. 900 g of t-butyl methyl ether was added to the obtained solid and stirred. Thereafter, the resultant was filtered, and the residue was dried, thereby obtaining 22.2 g of a compound (II) in the form of a white solid (purity: 91.0%, yield: 44.9%).

[Chemical Formula 83.]

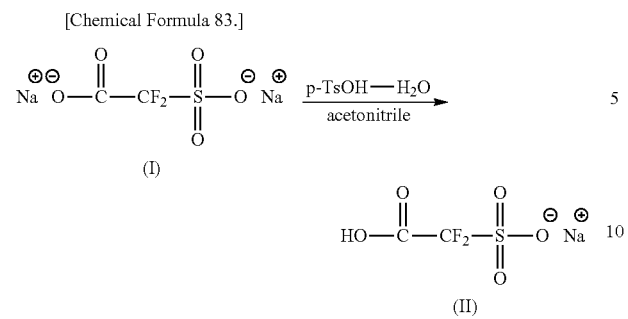

Subsequently, 4.34 g of the compound (II) (purity: 94.1%), 3.14 g of 2-benzyloxyethanol and 43.4 g of toluene were prepared, and 0.47 g of p-toluenesulfonic acid monohydrate was added thereto. The resultant was refluxed at 105° C. for 20 hours. Then, the reaction mixture was filtered, and 20 g of hexane was added to the residue and stirred. Thereafter, the resultant was filtered, and the residue was dried, thereby obtaining 1.41 g of a compound (III) (yield: 43.1%).

[Chemical Formula 84.]

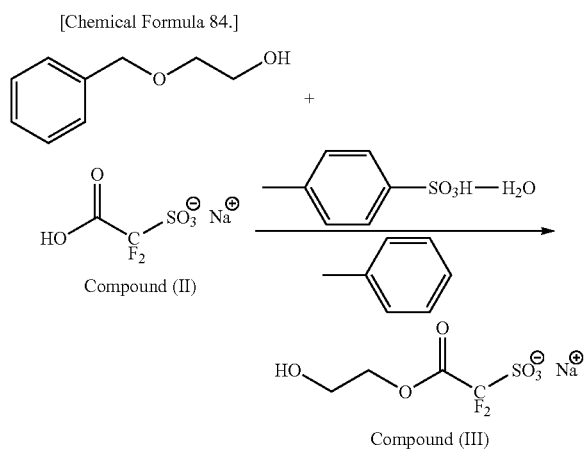

The obtained compound (III) was analyzed by NMR.
$^1$H-NMR (DMSO-d6, 400 MHz): δ(ppm)=4.74-4.83 (t, 1H, OH), 4.18-4.22 (t, 2H, H$^a$), 3.59-3.64 (q, 2H, H$^b$)
$^{19}$F-NMR (DMSO-d6, 376 MHz): δ(ppm)=−106.6
From the results shown above, it was confirmed that the compound (III) had a structure shown below.

[Chemical Formula 85.]

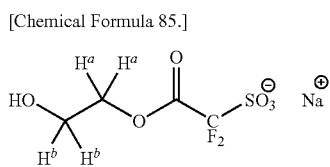

Next, 1.00 g of the compound (III) and 3.00 g of acetonitrile were prepared, and 0.82 g of 1-adamantanecarbonyl chloride and 0.397 g of triethylamine were dropwise added thereto while cooling with ice. Then, the resultant was stirred at room temperature for 20 hours, followed by filtration. The filtrate was concentrated and dried, and dissolved in 30 g of dichloromethane, followed by washing with water three times. Thereafter, the organic phase was concentrated and dried, thereby obtaining 0.82 g of a compound (IV) (yield: 41%).

[Chemical Formula 86.]

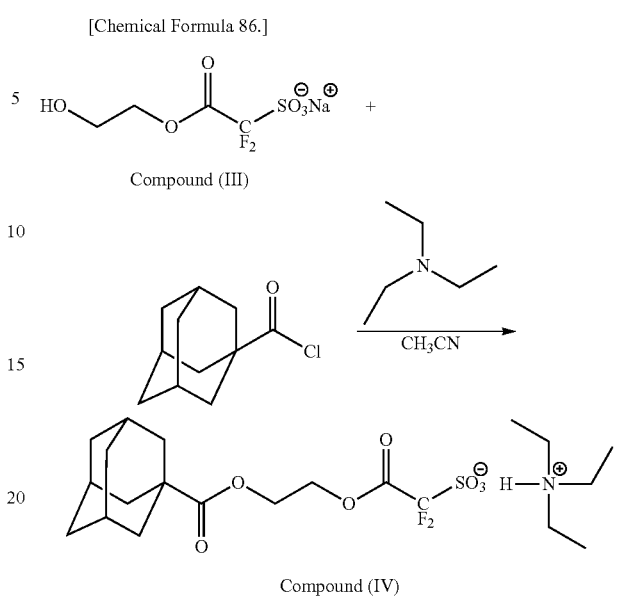

The obtained compound (IV) was analyzed by NMR.
$^1$H-NMR (DMSO-d6, 400 MHz): δ(ppm)=8.81 (s, 1H, H$^c$), 4.37-4.44 (t, 2H, H$^d$), 4.17-4.26 (t, 2H, H$^e$), 3.03-3.15 (q, 6H, H$^b$), 1.61-1.98 (m, 15H, Adamantane), 1.10-1.24 (t, 9H, H$^a$)
$^{19}$F-NMR (DMSO-d6, 376 MHz): δ(ppm)=−106.61
From the results above, it was confirmed that the compound (IV) had a structure shown below.

[Chemical Formula 87.]

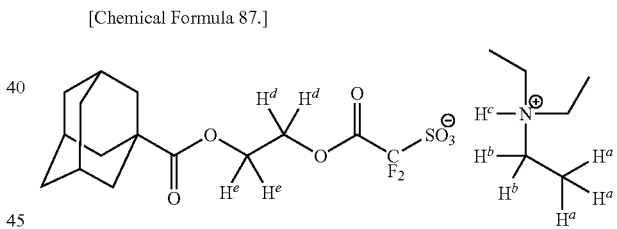

(ii) Synthesis of Acid Generator (1)

2 g of the compound (V) was added to 20 g of dichloromethane and 20 g of water, followed by stirring. Then, 2.54 g of the compound (IV) was added thereto, followed by stirring for 1 hour. The reaction mixture was subjected to liquid separation, and the resultant was washed four times with 20 g of water. After the washing, the organic solvent phase was concentrated and solidified, thereby obtaining 2.3 g of an acid generator (1).

The obtained acid generator (1) was analyzed by NMR.
$^1$H-NMR (DMSO-d6, 400 MHz): δ(ppm)=7.72-7.83 (m, 10H, Ar), 7.72 (s, 2H, Ar), 6.49-6.55 (m, 1H, Vinyl), 4.37-4.44 (t, 2H, CH$_2$), 4.20-4.23 (d, 1H, Vinyl), 4.00-4.26 (m, 7H, CH$_2$+Vinyl), 2.27 (s, 6H, CH$_3$), 1.61-1.98 (m, 15H, Adamantane)
$^{19}$F-NMR (DMSO-d6, 376 MHz): δ(ppm)=−106.61
From the results shown above, it was confirmed that the acid generator (1) had a structure shown below.

[Chemical Formula 88.]

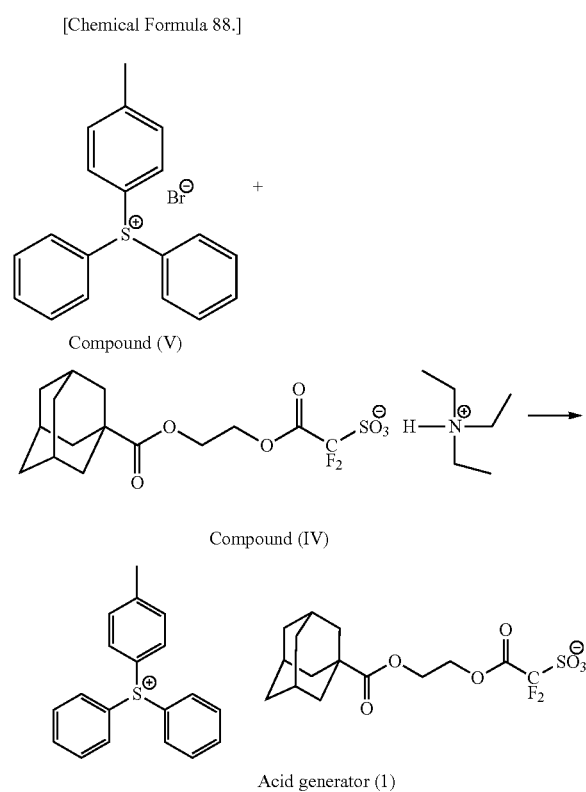

Compound (V)

Compound (IV)

Acid generator (1)

[Acid-Generator Synthesis Example 2: Synthesis of Acid Generator (4)]

(i) Synthesis of Compound (d)

5.00 g of the compound (II), 5.68 g of sultone-OH (c) and 100 g of toluene were prepared, and 0.43 g of p-toluenesulfonic acid monohydrate was added thereto. The resultant was heated until toluene was refluxed, and a reaction was effected in this state for 65 hours. Thereafter, the reaction mixture was filtered, and 100 g of toluene was added to the residue, followed by stirring at room temperature for 10 minutes. This filtration step was performed twice to obtain a black powder. The obtained powder was dried under reduced pressure for one night, and extraction was conducted twice using 100 g of acetone. Then, acetone was distilled off from the filtrate, and the resultant was dissolved in 30 g of acetone to obtain a solution. The obtained solution was gradually added to a mixture of 300 g of TBME and 300 g of methylene chloride in a dropwise manner, and the precipitated solid was collected by filtration and dried, thereby obtaining 6.88 g of a compound (d) in the form of a white powder (yield: 78.4%).

[Chemical Formula 89.]

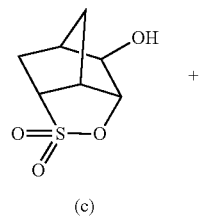

(c)

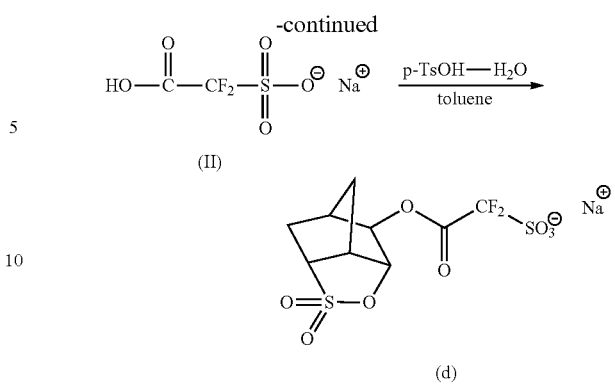

(II)

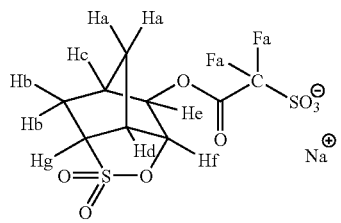

(d)

The obtained compound (d) was analyzed by $^1$H-NMR and $^{19}$F-NMR.

$^1$H-NMR (DMSO-d6, 400 MHz): δ(ppm) 1.73-2.49 (m, 4H, Ha, Hb), 2.49 (m, 1H, Hc), 3.48 (m, 1H, Hd), 3.88 (t, 1H, He), 4.66 (t, 1H, Hf), 4.78 (m, 1H, Hg)

$^{19}$F-NMR (DMSO-d6, 400 MHz): δ(ppm) −107.7 (m, 2F, Fa) (the peak of hexafluorobenzene was regarded as −160 ppm)

From the results above, it was confirmed that the compound (d) had a structure shown below.

[Chemical Formula 90.]

(ii) Synthesis of Intermediate Compound (f-01)

To 60.75 g of methanesulfonic acid controlled to 20° C. or lower was added 8.53 g of phosphorus oxide, 8.81 g of 2,6-dimethylphenol and 12.2 g of diphenylsulfoxide in small amounts. The resultant was matured for 30 minutes while maintaining the temperature at 15 to 20° C., followed by elevating the temperature to 40° C. and maturing for 2 hours. Then, the reaction mixture was dropwise added to 109.35 g of pure water cooled to 15° C. or lower. Thereafter, 54.68 g of dichloromethane was added and stirred, and the dichloromethane phase was collected. 386.86 g of hexane at a temperature of 20 to 25° C. was added to a separate vessel, and the dichloromethane phase was dropwise added thereto. Then, the resultant was matured at 20 to 25° C. for 30 minutes, followed by filtration, thereby obtaining an intermediate compound (f-01) as an objective compound (yield: 70.9%).

The obtained intermediate compound (f-01) was analyzed by $^1$H-NMR.

$^1$H-NMR (DMSO-d6, 600 MHz): δ(ppm)=7.61-7.72 (m, 10H, phenyl), 7.14 (S, 2H, H$^c$), 3.12 (S, 3H, H$^b$), 2.22 (s, 6H, H$^a$)

From the results shown above, it was confirmed that the obtained intermediate compound (f-01) had a structure shown below.

[Chemical Formula 91.]

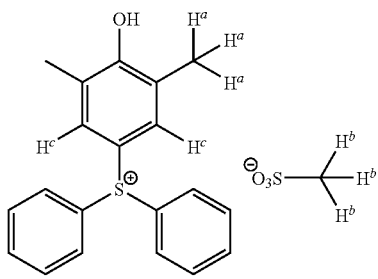

(iii) Synthesis of Compounds (f-1) to (f-3)

4 g of the intermediate compound (f-01) was dissolved in 79.8 g of dichloromethane. After confirming that the compound (i) had dissolved in dichloromethane, 6.87 g of potassium carbonate was added thereto, and 3.42 g of 2-methyl-2-adamantyl bromoacetate was further added. A reaction was effected under reflux for 24 hours, followed by filtration, washing with water, and crystallization with hexane. The resulting powder was dried under reduced pressure, thereby obtaining 3.98 g of an objective compound (yield: 66%).

The obtained objective compound was analyzed by $^1$H-NMR. The results are shown below.

$^1$H-NMR (CDCl$_3$, 600 MHz): δ(ppm)=7.83-7.86 (m, 4H, phenyl), 7.69-7.78 (m, 6H, phenyl), 7.51 (s, 2H, Hd), 4.46 (s, 2H, Hc), 2.39 (s, 6H, Ha), 2.33 (s, 2H, Adamantane), 2.17 (s, 2H, Adamantane), 1.71-1.976 (m, 11H, Adamantane), 1.68 (s, 3H, Hb), 1.57-1.61 (m, 2H, Adamantane)

From the results of the analysis shown above, it was confirmed that the objective compound contained a compound (f-1) having a structure shown below.

[Chemical Formula 92.]

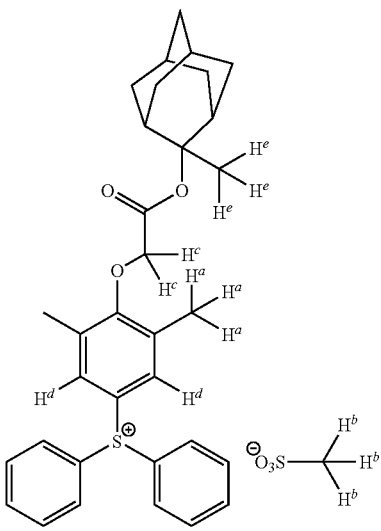

Further, as a result of an ion chromatography analysis, it was confirmed that the obtained objective compound also contained a compound (f-2) and a compound (f-3), both of which had the same NMR data for the cation moiety as that of the compound (f-1). The amounts of the compound (f-1), the compound (f-2) and the compound (f-3) were 21.4 mol %, 11.4 mol % and 67.2 mol %, respectively.

[Chemical Formula 93.]

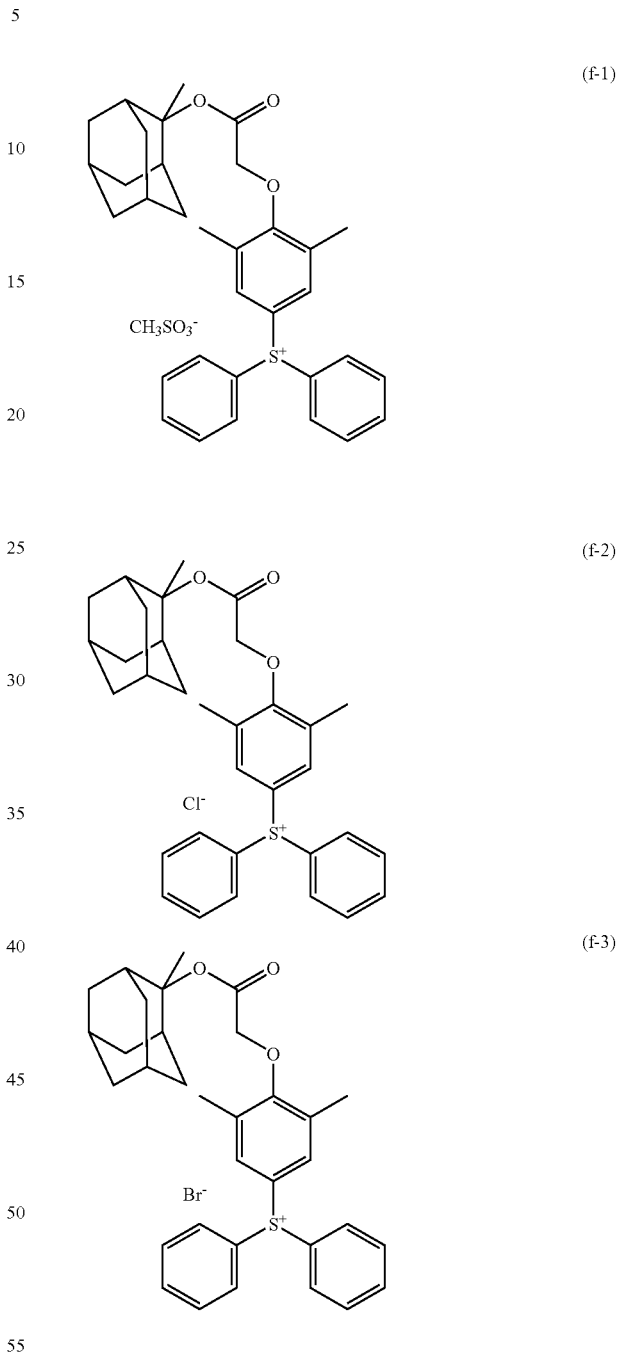

(iv) Synthesis of Acid Generator (4)

5.00 g of the compound (d) was dissolved in 50.0 g of pure water, and 6.19 g of the compound (f-3) and 50.0 g of methylene chloride were added thereto in this order, followed by stirring at room temperature for 10 hours. Then, the organic phase was collected from the resultant by liquid separation. Thereafter, the organic phase was washed three times with a 1% aqueous HCl solution, once with a 1% aqueous ammonia solution and four times with pure water, and the organic phase was concentrated, thereby obtaining 8.58 g of an acid generator (4) in the form of a white solid (90.4%).

[Chemical Formula 94.]

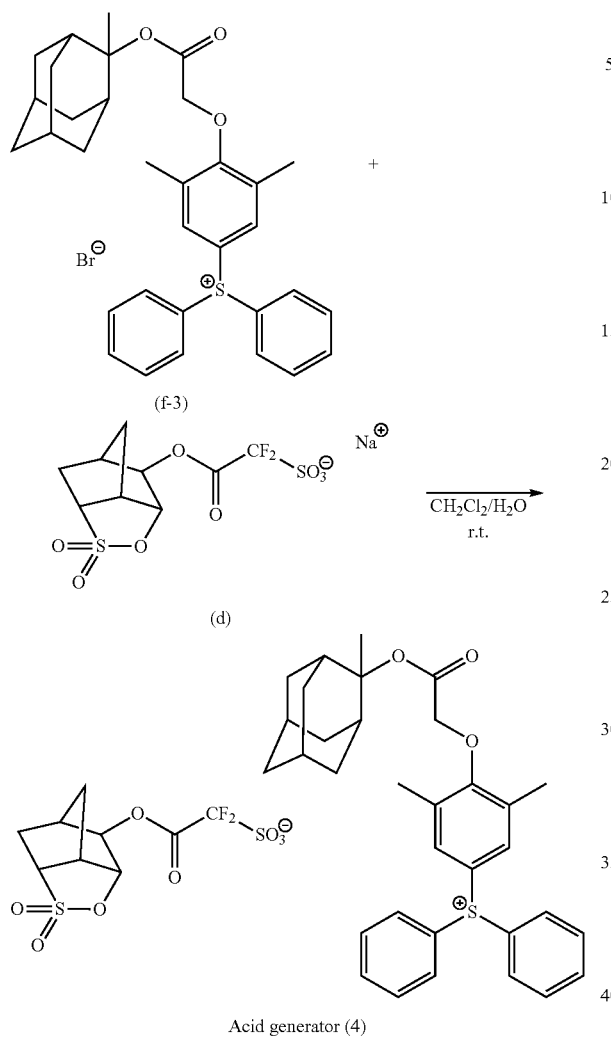

Acid generator (4)

The obtained acid generator (4) was analyzed by ¹H-NMR and ¹⁹F-NMR.

¹H-NMR (DMSO-d6, 400 MHz): δ(ppm)=1.47-1.95 (m, 15H, Ad, 3H, anion), 2.13-2.16 (m, 2H, Ad, 1H, anion), 2.30 (s, 6H, PhCH₃), 2.49 (m, 1H, anion), 3.48 (m, 1H, anion), 3.88 (t, 1H, anion), 4.58 (s, 2H, CH₂) 4.66 (t, 1H, anion), 4.78 (m, 1H, anion), 7.57 (m, 2H, Ph), 7.72-7.84 (m, 10H, Ph)

¹⁹F-NMR (DMSO-d6, 400 MHz): δ(ppm) −107.8 (m, 2F, CF₂) (the peak of hexafluorobenzene was regarded as −160 ppm)

From the results shown above, it was confirmed that the acid generator (4) had a structure shown above.

[Acid-Generator Synthesis Example 3: Synthesis of Acid Generator (5)]

3.21 g of the compound (d) was added to 32.1 g of pure water, and 3.72 g of 4-methylphenyldiphenylsulfonium bromide and 32.1 g of methylene chloride were added thereto in this order, followed by stirring at room temperature for 1 hour. Then, the organic phase was collected from the resultant by liquid separation. Thereafter, the organic phase was washed three times with a 1% aqueous HCl solution, and four times with pure water, and the organic phase was concentrated, thereby obtaining 4.94 g of an acid generator (5) in the form of a white solid (86.8%).

[Chemical Formula 95.]

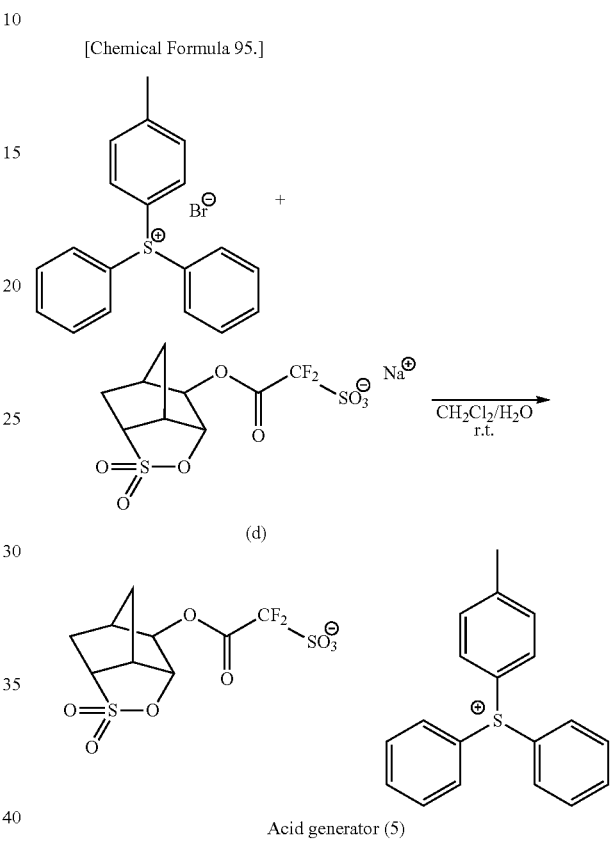

Acid generator (5)

The obtained acid generator (5) was analyzed by ¹H-NMR and ¹⁹F-NMR.

¹H-NMR (DMSO-d6, 400 MHz): δ(ppm) 1.74-2.21 (m, 4H, anion), 2.41 (t, 3H, PhCH₃), 2.58 (m, 1H, anion), 3.48 (m, 1H, anion), 3.87 (t, 1H, anion), 4.66 (t, 1H, anion), 4.78 (m, 1H, anion), 7.58 (m, 2H, ph), 7.64-7.84 (m, 12H, ph)

¹⁹F-NMR (DMSO-d6, 400 MHz): δ(ppm) −107.6 (m, 2F, Fa) (the peak of hexafluorobenzene was regarded as −160 ppm)

From the results shown above, it was confirmed that the acid generator (5) had a structure shown above.

<Production of Positive Resist Composition>

The components shown in Tables 1 to 3 were mixed together and dissolved to obtain positive resist compositions. In the tables, "-" indicates that the component was not added.

TABLE 1

| | Component (A) | Component (B) | | Component (D) | Component (E) | Component (S) |
|---|---|---|---|---|---|---|
| Comp. Ex. 1 | (A)-6 [100] | (B)-1 [6.7] | (B)-2 [2.6] | (D)-1 [0.15] | (E)-1 [0.24] | (S)-1 [2900] |

TABLE 1-continued

|  | Component (A) | Component (B) |  | Component (D) | Component (E) | Component (S) |
|---|---|---|---|---|---|---|
| Comp. Ex. 2 | (A)-5 | (B)-1 | — | (D)-1 | (E)-1 | (S)-1 |
|  | [100] | [6.7] |  | [0.15] | [0.24] | [2900] |
| Ex. 1 | (A)-5 | (B)-1 | (B)-2 | (D)-1 | (E)-1 | (S)-1 |
|  | [100] | [6.7] | [2.6] | [0.15] | [0.24] | [2900] |
| Ex. 2 | (A)-2 | (B)-1 | (B)-2 | (D)-1 | (E)-1 | (S)-1 |
|  | [100] | [6.7] | [2.6] | [0.15] | [0.24] | [2900] |
| Ex. 3 | (A)-3 | (B)-1 | (B)-2 | (D)-1 | (E)-1 | (S)-1 |
|  | [100] | [6.7] | [2.6] | [0.15] | [0.24] | [2900] |

TABLE 2

|  | Component (A) | Component (B) |  | Component (D) | Component (E) | Component (S) |
|---|---|---|---|---|---|---|
| Comp. Ex. 3 | (A)-4 | (B)-3 | — | (D)-1 | — | (S)-2 |
|  | [100] | [9.8] |  | [0.4] |  | [3200] |
| Ex. 4 | (A)-4 | (B)-3 | (B)-2 | (D)-1 | (E)-1 | (S)-2 |
|  | [100] | [9.8] | [1.3] | [0.2] | [0.4] | [3200] |
| Comp. Ex. 4 | (A)-4 | (B)-4 | — | (D)-1 | (E)-1 | (S)-2 |
|  | [100] | [10.1] |  | [0.3] | [0.4] | [3200] |
| Ex. 5 | (A)-4 | (B)-4 | (B)-2 | (D)-1 | (E)-1 | (S)-2 |
|  | [100] | [10.1] | [1.3] | [0.15] | [0.4] | [3200] |
| Ex. 6 | (A)-4 | (B)-5 | (B)-2 | (D)-1 | (E)-1 | (S)-2 |
|  | [100] | [7.3] | [1.3] | [0.15] | [0.4] | [3200] |
| Ex. 7 | (A)-4 | (B)-5 | (B)-2 | (D)-1 | (E)-1 | (S)-2 |
|  | [100] | [6.35] | [1.3] | [0.15] | [0.4] | [3200] |
| Ex. 8 | (A)-1 | (B)-5 | (B)-2 | (D)-1 | (E)-1 | (S)-2 |
|  | [100] | [6.35] | [1.3] | [0.15] | [0.24] | [3200] |

TABLE 3

|  | Component (A) | Component (B) |  |  | Component (S) |
|---|---|---|---|---|---|
| Comp. Ex. 5 | (A)-8 | (B)-7 | (B)-8 | (B)-6 | (S)-1 |
|  | [100] | [3.5] | [1.0] | [1.0] | [2400] |
| Comp. Ex. 6 | (A)-7 | (B)-7 | (B)-8 | — | (S)-1 |
|  | [100] | [3.5] | [1.0] |  | [2400] |
| Ex. 9 | (A)-7 | (B)-7 | (B)-8 | (B)-2 | (S)-1 |
|  | [100] | [3.5] | [1.0] | [1.0] | [2400] |
| Ex. 10 | (A)-7 | (B)-7 | (B)-8 | (B)-6 | (S)-1 |
|  | [100] | [3.5] | [1.0] | [1.0] | [2400] |

In Tables 1 to 3, the reference characters indicate the following. Further, the values in brackets [ ] indicate the amount (in terms of parts by weight) of the component added.

(A)-1: the aforementioned polymeric compound (1)

(A)-2: the aforementioned polymeric compound (2)

(A)-3: the aforementioned polymeric compound (3)

(A)-4: the aforementioned polymeric compound (4)

(A)-5: the aforementioned polymeric compound (5)

(A)-6: the aforementioned polymeric compound (6)

(A)-7: the aforementioned polymeric compound (7)

(A)-8: the aforementioned polymeric compound (8)

(B)-1: the aforementioned acid generator (1)

(B)-2: an acid generator (2) represented by chemical formula (B1-1) shown below (B)-3: an acid generator (3) represented by chemical formula (B2-1) shown below (B)-4: the aforementioned acid generator (4)

(B)-5: the aforementioned acid generator (5)

(B)-6: an acid generator (6) represented by chemical formula (B1-2) shown below

[Chemical Formula 96.]

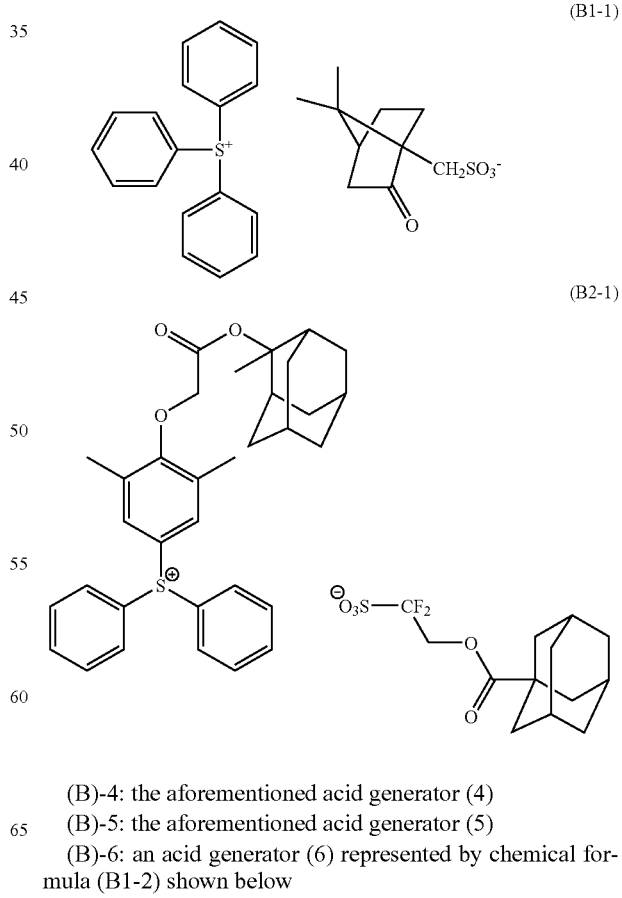

[Chemical Formula 97.]

(B1-2)

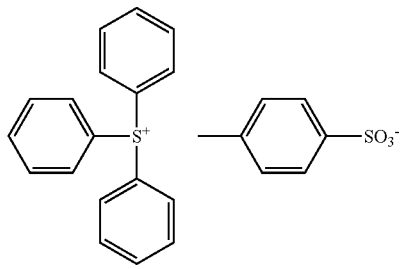

(B)-7: (4-methylphenyl)diphenylsulfonium nonafluoro-n-butanesulfonate (B)-8: (4-methylphenyl)diphenylsulfonium trifluoromethanesulfonate (D)-1: tri-n-pentylamine (E)-1: salicylic acid (S)-1: a mixed solvent of PGMEA/PGME/cyclohexanone=45/30/25 (weight ratio)

(S)-2: a mixed solvent of PGMEA/PGME=6/4 (weight ratio)

<Evaluation of Resist Pattern>

Using the obtained positive resist compositions, resist patterns were formed in the following manner, and the shape of the resist patterns was evaluated.

Examples 1 to 3

Comparative Examples 1 and 2

[Formation of Resist Pattern by Immersion Exposure](1)

An organic anti-reflection film composition (product name: ARC95, manufactured by Brewer Science Ltd.) was applied to an 12-inch silicon wafer using a spinner, and the composition was then baked at 205° C. for 60 seconds, thereby forming an organic anti-reflection film having a film thickness of 90 nm.

Then, each of the positive resist compositions obtained in Examples 1 to 3 and Comparative Examples 1 and 2 was applied to the organic anti-reflection film using a spinner, and was then prebaked (PAB) on a hotplate at 110° C. for 60 seconds and dried, thereby forming a resist film having a film thickness of 90 nm.

Subsequently, a coating solution for forming a protection film (product name: TILC-057; manufactured by Tokyo Ohka Kogyo Co., Ltd.) was applied to the resist film using a spinner, and then heated at 90° C. for 60 seconds, thereby forming a top coat with a film thickness of 35 nm.

Thereafter, using an ArF exposure apparatus for immersion lithography (product name: NSR-S609B, manufactured by Nikon Corporation, NA (numerical aperture)=1.07, σ0.97), the resist film having a top coat formed thereon was selectively irradiated with an ArF excimer laser (193 nm) through a mask pattern for forming a hole pattern.

Next, a post exposure bake (PEB) treatment was conducted at 95° C. for 60 seconds, followed by alkali development for 30 seconds at 23° C. in a 2.38% by weight aqueous TMAH solution (product name: NMD-3; manufactured by Tokyo Ohka Kogyo Co., Ltd.). Then, the resist was washed for 25 seconds with pure water, followed by drying by shaking.

As a result, in each of the examples, a line and space pattern (hereafter, referred to as "LS pattern") having a line width of 50 nm and a pitch of 100 nm was formed.

[Sensitivity]

The optimum exposure dose Eop (mJ/cm$^2$; sensitivity) with which the LS pattern having a line width of 50 nm and a pitch of 100 nm was formed in the "Formation of resist pattern (1)" was determined. The results are shown in Table 4.

[Evaluation of Resist Pattern Shape]

Each of the LS patterns having a line width of 50 nm and a pitch of 100 nm and formed with the above Eop was observed using a scanning electron microscope (SEM), and the cross-sectional shape of the LS pattern was evaluated. The results are shown in Table 4.

TABLE 4

| LS | Eop (mJ/cm$^2$) | Shape of resist pattern |
| --- | --- | --- |
| Comp. Ex. 1 | 30.1 | Slight footing |
| Comp. Ex. 2 | 20.1 | Hourglass |
| Ex. 1 | 32.0 | Rectangular |
| Ex. 2 | 27.4 | Rectangular |
| Ex. 3 | 25.4 | Rectangular |

From the results shown in Table 4, it was confirmed that the positive resist compositions of Examples 1 to 3 were capable of forming a resist pattern having an excellent rectangularity and an excellent shape, as compared to the resist patterns formed using the positive resist compositions of Comparative Examples 1 and 2.

Examples 4 to 8

Comparative Examples 3 and 4

[Formation of Resist Pattern by Immersion Exposure](2)

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm.

Then, each of the positive resist compositions obtained in Examples 4 to 8 and Comparative Examples 3 and 4 was applied to the anti-reflection film using a spinner, and was then prebaked (PAB) on a hotplate at a temperature indicated in Table 5 for 60 seconds and dried, thereby forming a resist film having a film thickness of 100 nm.

Subsequently, a coating solution for forming a protection film (product name: TILC-057; manufactured by Tokyo Ohka Kogyo Co., Ltd.) was applied to the resist film using a spinner, and then heated at 90° C. for 60 seconds, thereby forming a top coat with a film thickness of 35 nm.

Thereafter, using an ArF exposure apparatus for immersion lithography (product name: NSR-S609B, manufactured by Nikon Corporation, NA (numerical aperture)=1.07, σ0.97), the resist film having a top coat formed thereon was selectively irradiated with an ArF excimer laser (193 nm) through a mask pattern.

Next, a post exposure bake (PEB) treatment was conducted at a temperature indicated in Table 5 for 60 seconds, followed by development for 30 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist film was rinsed for 30 seconds with pure water, followed by drying by shaking.

As a result, in each of the examples, a contact hole pattern in which holes having a diameter of 90 nm were equally spaced (pitch: 540 nm) was formed (hereafter, this contact hole pattern is referred to as "Iso CH pattern").

Subsequently, hole patterns were formed in the same manner as in the "Formation of resist pattern by immersion exposure (2)", except that the PAB treatment and the PEB treatment were conducted at the temperatures indicated in Table 6.

As a result, in each of the examples, a contact hole pattern in which holes having a diameter of 90 nm were equally spaced (pitch: 140 nm) was formed (hereafter, this contact hole pattern is referred to as "Nested CH pattern").

Evaluation of Iso CH Pattern

[Sensitivity]

The optimum exposure dose Eop (mJ/cm$^2$; sensitivity) with which the Iso CH patterns having a hole diameter of 90 nm and a pitch of 540 nm was formed in the "Formation of resist pattern (2)" was determined. The results are shown in Table 5.

[Evaluation of CD Uniformity (CDU)]

With respect to each of the Iso CH patterns formed with the above Eop, the hole diameter (CD) of 25 holes were measured. From the results, the value of 3 times the standard deviation σ (i.e., 3σ) was calculated as a yardstick of CD uniformity (CDU). The results are shown in Table 5.

The smaller this 3σ value is, the higher the level of CDU of the holes formed in the resist film.

[Evaluation of Circularity]

Each of the Iso CH patterns formed above was observed from the upper side thereof using a scanning electron microscope (SEM) (product name: S-9220, manufactured by Hitachi, Ltd.), and the circularity was evaluated with the following criteria. The results are shown in Table 5.

A: Almost no unevenness was observed at the circumferential portions of the holes, and the circularity of the holes was exceptionally good B: Only small degree of unevenness was observed at the circumferential portions of the holes, and the circularity of the holes was excellent

TABLE 5

| Iso | PAB (° C.) | PEB (° C.) | Eop (mJ/cm$^2$) | CDU | Circularity |
| --- | --- | --- | --- | --- | --- |
| Comp. Ex. 3 | 90 | 85 | 29.7 | 5.64 | B |
| Ex. 4 | 90 | 85 | 33.7 | 5.27 | A |
| Comp. Ex. 4 | 90 | 85 | 33.0 | 4.86 | B |
| Ex. 5 | 90 | 85 | 38.8 | 4.72 | A |
| Ex. 6 | 90 | 85 | 28.9 | 4.29 | A |
| Ex. 7 | 90 | 85 | 39.8 | 4.61 | A |
| Ex. 8 | 110 | 85 | 49.4 | 4.38 | A |

Evaluation of Nested CH Pattern

With respect to the Nested CH patterns formed above, the sensitivity, the CD uniformity (CDU) and the circularity were evaluated in the same manner as in the evaluation of the Iso CH patterns. The results are shown in Table 6.

TABLE 6

| Nested | PAB (° C.) | PEB (° C.) | Eop (mJ/cm$^2$) | CDU | Circularity |
| --- | --- | --- | --- | --- | --- |
| Comp. Ex. 3 | 90 | 85 | 28.7 | 5.39 | B |
| Ex. 4 | 90 | 85 | 32.1 | 6.62 | A |
| Comp. Ex. 4 | 90 | 85 | 33.1 | 5.93 | B |
| Ex. 5 | 90 | 85 | 37.4 | 5.90 | A |
| Ex. 6 | 90 | 85 | 28.2 | 5.84 | A |

TABLE 6-continued

| Nested | PAB (° C.) | PEB (° C.) | Eop (mJ/cm$^2$) | CDU | Circularity |
| --- | --- | --- | --- | --- | --- |
| Ex. 7 | 90 | 85 | 38.4 | 4.41 | A |
| Ex. 8 | 110 | 85 | 47.0 | 5.89 | A |

As seen from the results shown in Tables 5 and 6, with respect to the positive resist compositions of Examples 4 to 8 according to the present invention, high circularity and an excellent shape could be achieved for both the Iso CH pattern and the Nested CH pattern (i.e., both isolated hole pattern and dense hole pattern), as compared to the Iso CH pattern and the Nested CH pattern formed using the positive resist compositions of Comparative Examples 3 and 4.

Further, it was confirmed that the positive resist compositions of Examples 4 to 8 exhibited about the same level of CDU as that of the positive resist compositions of Comparative Examples 3 and 4.

Therefore, it is presumed that for both of an isolated hole pattern and a dense hole pattern, the acid dissociation reaction of the component (A) proceeds uniformly by virtue of the positive resist composition of the present invention including a polymeric compound (A1) having an acid dissociable, dissolution inhibiting group in the structure thereof and including a structural unit (a0) represented by general formula (a0-1), and an acid generator (B1).

Examples 9 and 10

Comparative Examples 5 and 6

Formation of Resist Pattern (3)

An organic anti-reflection film composition (product name: ARC29A, manufactured by Brewer Science Ltd.) was applied to an 8-inch silicon wafer using a spinner, and the composition was then baked at 205° C. for 60 seconds, thereby forming an organic anti-reflection film having a film thickness of 77 nm.

Then, each of the positive resist composition obtained in Examples 9 and 10 and Comparative Examples 5 and 6 was applied to the anti-reflection film using a spinner, and was then prebaked (PAB) on a hotplate at 115° C. for 60 seconds and dried, thereby forming a resist film having a film thickness of 150 nm.

Subsequently, the resist film was selectively irradiated with an ArF excimer laser (193 nm) through a mask pattern, using an ArF exposure apparatus NSR-S306 (manufactured by Nikon Corporation; NA (numerical aperture)=0.78, ⅔ annular illumination).

Thereafter, a post exposure bake (PEB) treatment was conducted at 115° C. for 60 seconds, followed by development for 30 seconds at 23° C. in a 2.38% by weight aqueous tetramethylammonium hydroxide (TMAH) solution (product name: NMD-3; manufactured by Tokyo Ohka Kogyo Co., Ltd.). Then, the resist film was washed for 30 seconds with pure water, followed by drying by shaking.

As a result, in each of the examples, a line and space pattern (LS pattern) having a line width of 85 nm and a pitch of 170 nm was formed on the resist film.

[Sensitivity]

The optimum exposure dose Eop (mJ/cm$^2$; sensitivity) with which the LS pattern having a line width of 85 nm and a pitch of 170 nm was formed in the "Formation of resist pattern (3)" was determined. The results are shown in Table 7.

[Evaluation of Resist Pattern Shape]

Each of the LS patterns having a line width of 85 nm and a pitch of 170 nm and formed with the above Eop was observed using a scanning electron microscope (SEM), and the cross-sectional shape of the LS pattern was evaluated with the following criteria. The results are shown in Table 7.

TABLE 7

| LS | Eop (mJ/cm$^2$) | Shape of resist pattern |
|---|---|---|
| Comp. Ex. 5 | 33.0 | Footing |
| Comp. Ex. 6 | 26.0 | Footing |
| Ex. 9 | 38.0 | Rectangular |
| Ex. 10 | 37.0 | Rectangular |

From the results shown in Table 4, it was confirmed that the positive resist compositions of Examples 9 and 10 were capable of forming a resist pattern having an excellent rectangularity and an excellent shape, as compared to the resist patterns formed using the positive resist compositions of Comparative Examples 5 and 6.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising a base component (A) which exhibits increased solubility in an alkali developing solution under action of acid and an acid-generator component (B) which generates acid upon exposure, the base component (A) comprising a polymeric compound (A1) having an acid dissociable, dissolution inhibiting group in the structure thereof and comprising a structural unit (a0) represented by general formula (a0-1) shown below, and the acid-generator component (B) comprising an acid generator (B1) comprised of a compound represented by general formula (b1-1) shown below:

[Chemical Formula 1]

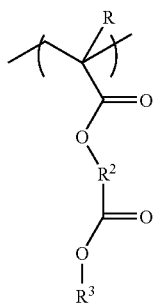

(a0-1)

wherein R represents a hydrogen atom, an alkyl group of 1 to 5 carbon atoms or a halogenated alkyl group of 1 to 5 carbon atoms; $R^2$ represents a divalent linking group; and $R^3$ represents a cyclic group containing an —$SO_2$— group within the ring skeleton thereof; and

[Chemical Formula 2]

$$R^0-SO_3^-Z^+ \quad (b1\text{-}1)$$

wherein $R^0$ represents a hydrocarbon group of 1 to 12 carbon atoms which may have a substituent, with the provision that the carbon atom adjacent to the sulfur atom within the —$SO_3^-$ group has no fluorine atom bonded thereto; and $Z^+$ represents an organic cation.

2. The positive resist composition according to claim 1, wherein $R^3$ in general formula (a0-1) represents a cyclic group containing an —O—$SO_2$— group within the ring skeleton thereof.

3. The positive resist composition according to claim 2, wherein $R^3$ in general formula (a0-1) is a cyclic group represented by general formula (3-1) shown below:

[Chemical Formula 3]

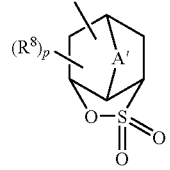

(3-1)

wherein A' represents an oxygen atom, a sulfur atom, or an alkylene group of 1 to 5 carbon atoms which may contain an oxygen atom or a sulfur atom; p represents an integer of 0 to 2; and $R^8$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

4. The positive resist composition according to claim 1, wherein the polymeric compound (A1) further comprises a structural unit (a1) derived from an acrylate ester containing an acid dissociable, dissolution inhibiting group, exclusive of the structural unit (a0).

5. The positive resist composition according to claim 1, wherein the polymeric compound (A1) further comprises a structural unit (a2) derived from an acrylate ester containing a lactone-containing cyclic group.

6. The positive resist composition according to claim 1, wherein the polymeric compound (A1) further comprises a structural unit (a3) derived from an acrylate ester containing a polar group-containing aliphatic hydrocarbon group.

7. The positive resist composition according to claim 1, which further comprises a nitrogen-containing organic compound (D).

8. A method of forming a resist pattern, comprising: forming a resist film using a positive resist composition of claim 1; conducting exposure of said resist film; and alkali-developing said resist film to form a resist pattern.

* * * * *

UNITED STATES PATENT AND TRADEMARK OFFICE
CERTIFICATE OF CORRECTION

PATENT NO. : 8,283,105 B2
APPLICATION NO. : 12/717870
DATED : October 9, 2012
INVENTOR(S) : Yasuhiko Kakinoya and Naoto Motoike It is certified that error appears in the above-identified patent and that said Letters Patent is hereby corrected as shown below:

In the Specifications:

In Column 6, Line 41, Change "and an" to --an--.

In Column 18, Line 9, Change " preferably" to --preferably--.

In Column 24, Line 66, Change "heteratom," to --heteroatom,--.

In Column 59, Lines 44-40, Delete "When the component (A1)................containing water." and insert the same on Col. 59, Line 45, below "(a1)." as the new paragraph.

In Column 59, Line 57, Change "propiolatone," to --propiolactone,--.

In Column 70, Lines 40-67, Change " 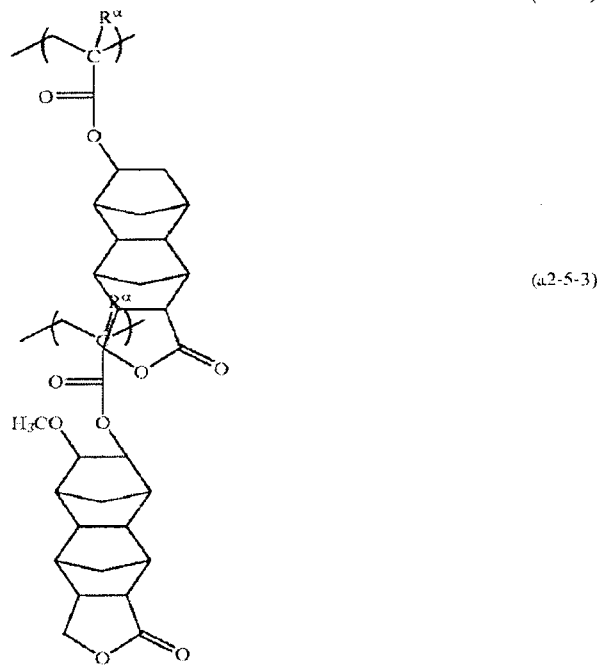 "

Signed and Sealed this
Seventh Day of May, 2013

Teresa Stanek Rea
*Acting Director of the United States Patent and Trademark Office* to -- 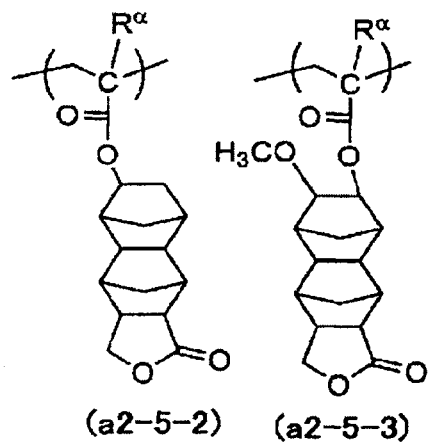 --.

In Column 81, Line 55, Change "dicyclohexylcarboxylmide" to --dicyclohexylcarboxyimide--.

In Column 84, Line 56, Change "substituent" to --substituent.--.

In Column 87, Line 4, Change "one of R''''" to --one of $R^{1'''}$--.

In Column 87, Line 4, Change "two of R''''" to --two of $R^{1'''}$--.

In Column 87, Line 11, Change "R''''" to --$R^{1'''}$--.

In Column 98, Line 20, Change "R''''" to --$R^{1'''}$--.

In Column 107, Line 62, Change "oximesulfonate" to --oxime sulfonate--.

In Column 107, Line 65, Change "oximesulfonate" to --oxime sulfonate--.

In Column 116, Line 66, Change "as long at" to --as long as--.

In Column 120, Line 23, Change "$H^k$)," to -- $H^{c,d}$),--.

In Column 139, Line 34, Change "30" to --3σ--.